(12) United States Patent
Kai et al.

(10) Patent No.: US 9,620,514 B2
(45) Date of Patent: Apr. 11, 2017

(54) 3D SEMICIRCULAR VERTICAL NAND STRING WITH SELF ALIGNED FLOATING GATE OR CHARGE TRAP CELL MEMORY CELLS AND METHODS OF FABRICATING AND OPERATING THE SAME

(71) Applicant: SANDISK TECHNOLOGIES INC., Plano, TX (US)

(72) Inventors: James K. Kai, Santa Clara, CA (US); Yanli Zhang, San Jose, CA (US); Henry Chien, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/748,575

(22) Filed: Jun. 24, 2015

(65) Prior Publication Data
US 2016/0071860 A1 Mar. 10, 2016

Related U.S. Application Data

(60) Provisional application No. 62/046,412, filed on Sep. 5, 2014.

(51) Int. Cl.
*H01L 27/115* (2006.01)
*H01L 27/11556* (2017.01)
(Continued)

(52) U.S. Cl.
CPC .... *H01L 27/11556* (2013.01); *G11C 16/0408* (2013.01); *H01L 27/1157* (2013.01);
(Continued)

(58) Field of Classification Search
CPC .................................................. H01L 27/11556
See application file for complete search history.

(56) References Cited

U.S. PATENT DOCUMENTS 5,915,167 A 6/1999 Leedy
7,575,973 B2 8/2009 Mokhlesi et al.
(Continued)

OTHER PUBLICATIONS

International Searching Report and Written Opinion of the International Searching Authority for PCT/US2015/042220, 24 pages, mailed Jan. 18, 2016.
(Continued)

*Primary Examiner* — Stephen W Smoot
(74) *Attorney, Agent, or Firm* — The Marbury Law Group PLLC

(57) ABSTRACT

A memory device includes a plurality of memory cells arranged in a string substantially perpendicular to the major surface of the substrate in a plurality of device levels, at least one first select gate electrode located between the major surface of the substrate and the plurality of memory cells, at least one second select gate electrode located above the plurality of memory cells, a semiconductor channel having a portion that extends vertically along a direction perpendicular to the major surface, a first memory film contacting a first side of the semiconductor channel, and a second memory film contacting a second side of the semiconductor channel. The second memory film is electrically isolated from the first memory film, and is located at a same level as the first memory film.

29 Claims, 26 Drawing Sheets

(51) Int. Cl.
  *H01L 27/11582* (2017.01)
  *H01L 27/11565* (2017.01)
  *H01L 27/11519* (2017.01)
  *G11C 16/04* (2006.01)
  *H01L 29/66* (2006.01)
  *H01L 27/11524* (2017.01)
  *H01L 27/1157* (2017.01)
  *G11C 16/14* (2006.01)

(52) U.S. Cl.
  CPC .. *H01L 27/11519* (2013.01); *H01L 27/11524* (2013.01); *H01L 27/11565* (2013.01); *H01L 27/11582* (2013.01); *H01L 29/66666* (2013.01); *H01L 29/66825* (2013.01); *G11C 16/0483* (2013.01); *G11C 16/14* (2013.01)

(56) References Cited

U.S. PATENT DOCUMENTS

| | | | |
|---|---|---|---|
| 7,906,392 B2 | 3/2011 | Dunton et al. | |
| 8,084,819 B2 * | 12/2011 | Kim | H01L 27/11582 257/347 |
| 8,187,936 B2 | 5/2012 | Alsmeier et al. | |
| 8,461,641 B2 | 6/2013 | Alsmeier et al. | |
| 8,610,194 B2 * | 12/2013 | Aritome | H01L 27/11551 257/314 |
| 8,735,962 B2 * | 5/2014 | Whang | H01L 29/7889 257/321 |
| 8,767,465 B2 * | 7/2014 | Chang | H01L 21/28282 257/321 |
| 8,823,076 B2 | 9/2014 | Lee et al. | |
| 8,853,765 B2 | 10/2014 | Lee et al. | |
| 8,981,457 B2 | 3/2015 | Lee et al. | |
| 8,987,119 B2 | 3/2015 | Dunton et al. | |
| 9,023,719 B2 | 5/2015 | Pachamuthu et al. | |
| 2007/0029607 A1 | 2/2007 | Kouznetzov | |
| 2009/0230454 A1 | 9/2009 | Pekny | |
| 2010/0207194 A1 | 8/2010 | Tanaka et al. | |
| 2010/0213527 A1 * | 8/2010 | Shim | H01L 27/11565 257/314 |
| 2011/0156044 A1 | 6/2011 | Lee et al. | |
| 2012/0012921 A1 | 1/2012 | Liu | |
| 2012/0326221 A1 * | 12/2012 | Sinha | H01L 21/31111 257/315 |
| 2014/0131784 A1 | 5/2014 | Davis et al. | |
| 2015/0044833 A1 | 2/2015 | Lee et al. | |
| 2015/0076584 A1 | 3/2015 | Pachamuthu et al. | |
| 2015/0179660 A1 | 6/2015 | Yada et al. | |
| 2015/0255481 A1 | 9/2015 | Baenninger et al. | |
| 2015/0371709 A1 * | 12/2015 | Kai | G11C 16/0425 365/185.17 |
| 2016/0133642 A1 * | 5/2016 | Jeon | H01L 27/11565 257/325 |

OTHER PUBLICATIONS

U.S. Appl. No. 14/748,670, filed Jun. 24, 2015, SanDisk Technologies Inc.
U.S. Appl. No. 14/721,198, filed May 26, 2015, SanDisk Technologies Inc.
U.S. Appl. No. 14/317,274, filed Jun. 27, 2014, SanDisk Technologies Inc.
Invitation to Pay Additional Fees and Annex to Form PCT/ISA/206 Communication Relating to Results of the Partial International Search for PCT/US2015/042220, mailed Oct. 13, 2015.
Office Communication for U.S. Appl. No. 14/748,670, 21 pages, mailed Jul. 15, 2016.
U.S. Appl. No. 14/748,670, Office Action, issued Dec. 28, 2016, 13 pgs.

* cited by examiner

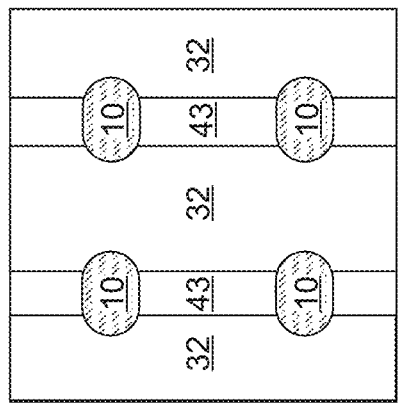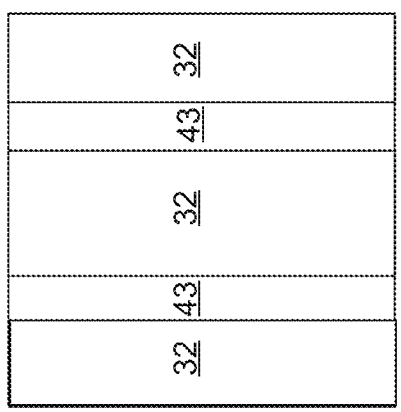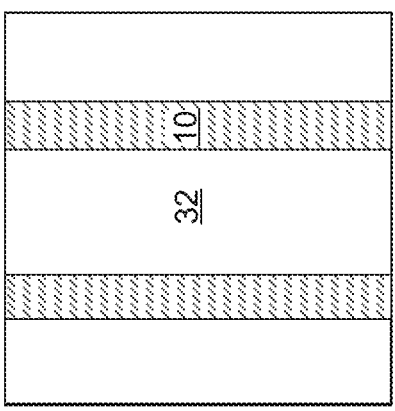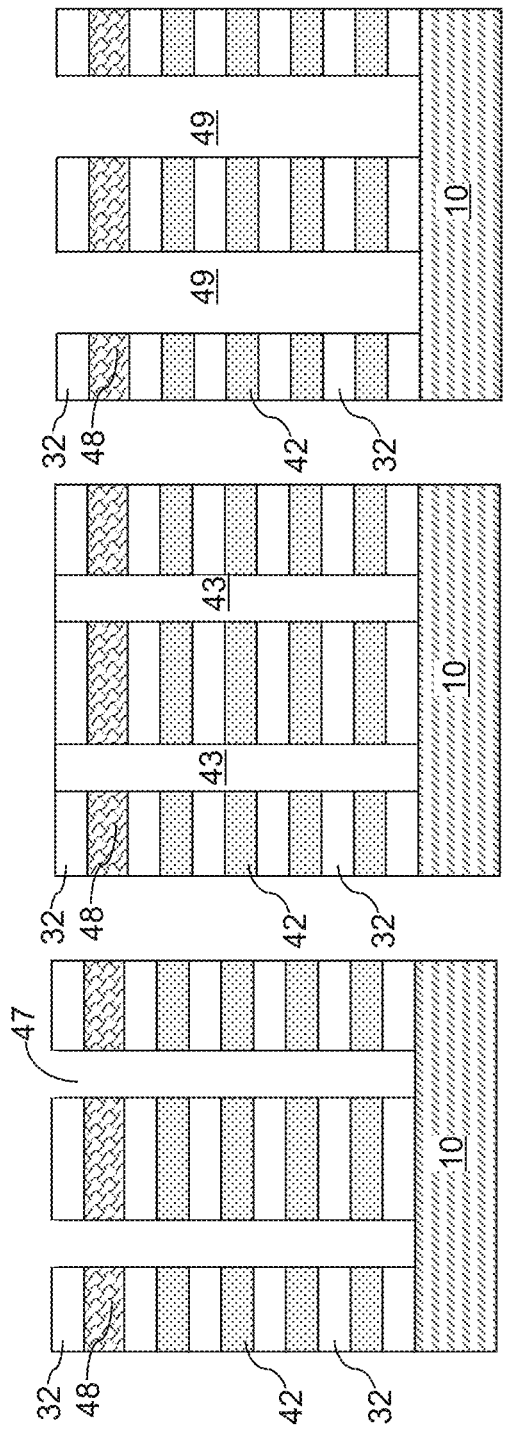

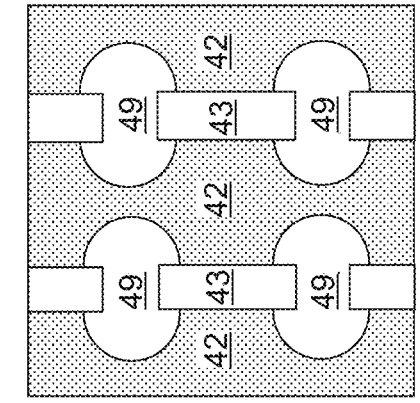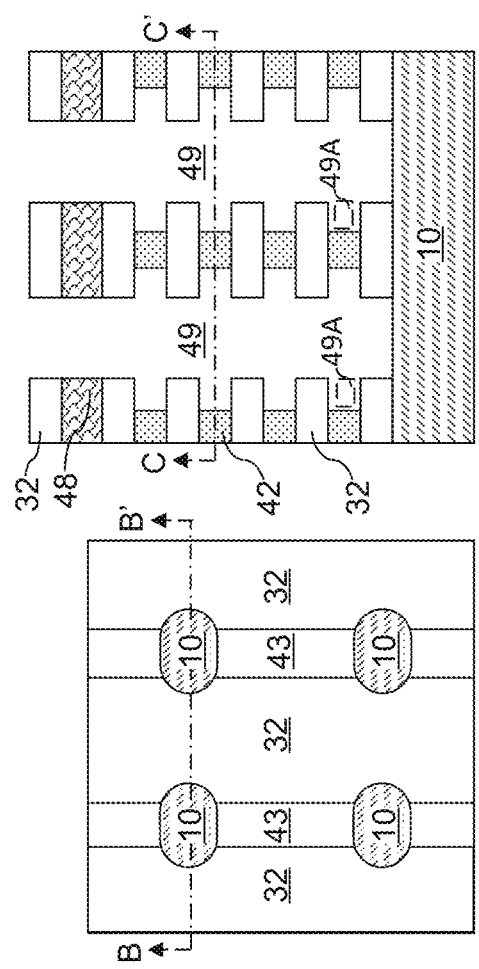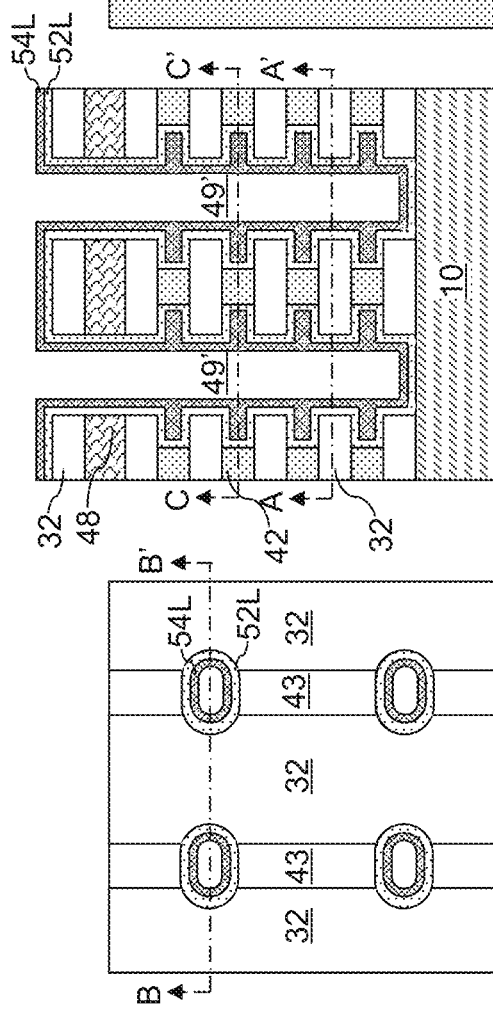

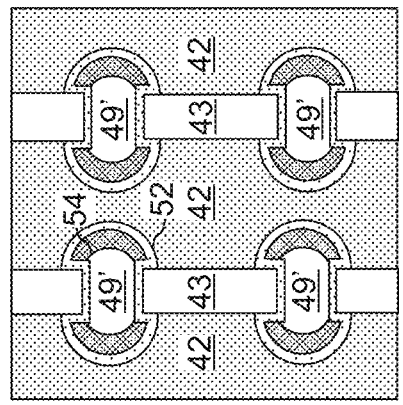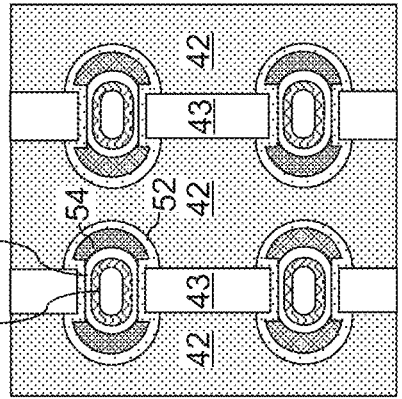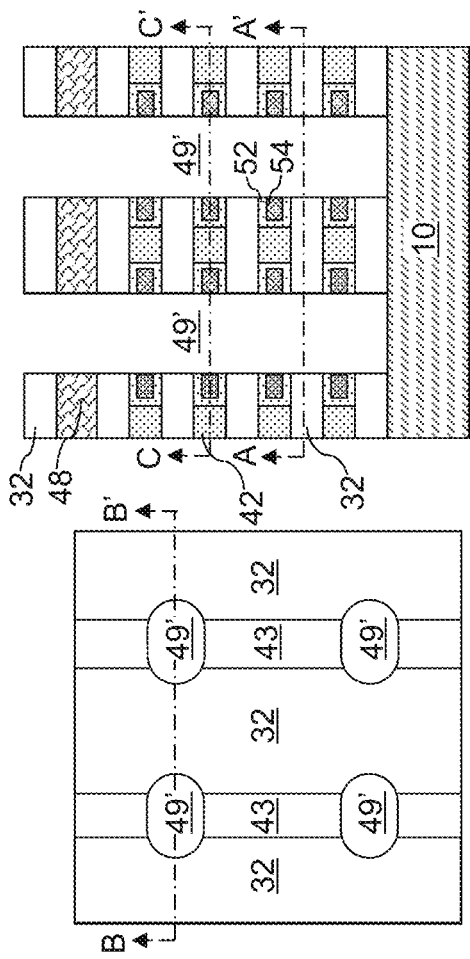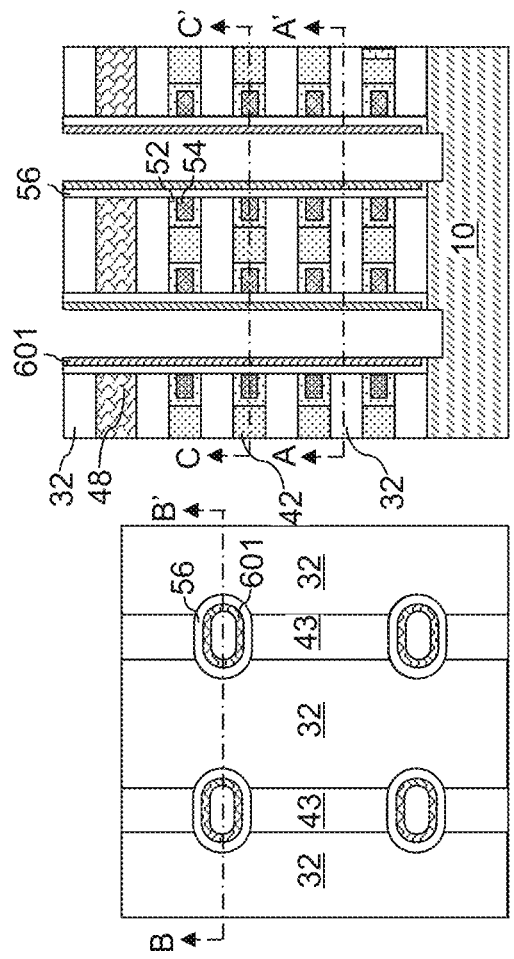

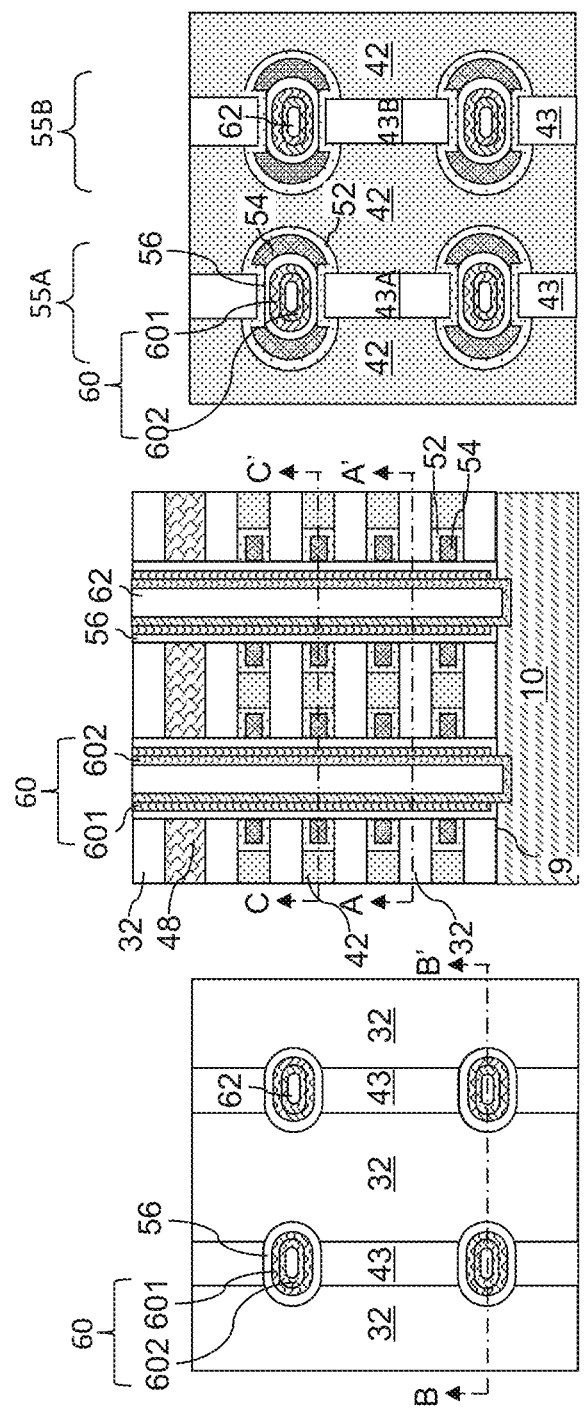

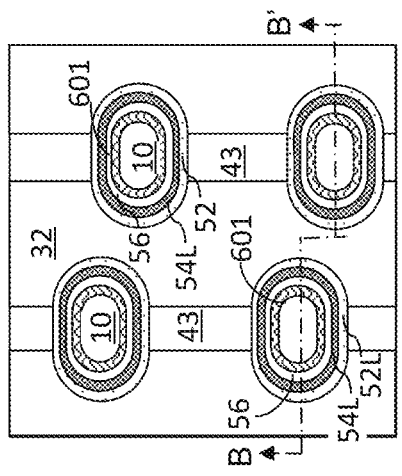
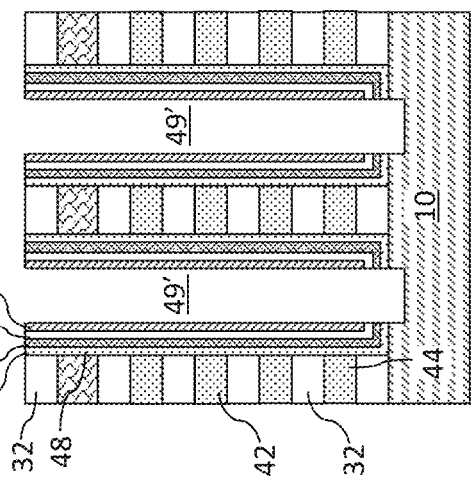
FIG. 14A
FIG. 14B
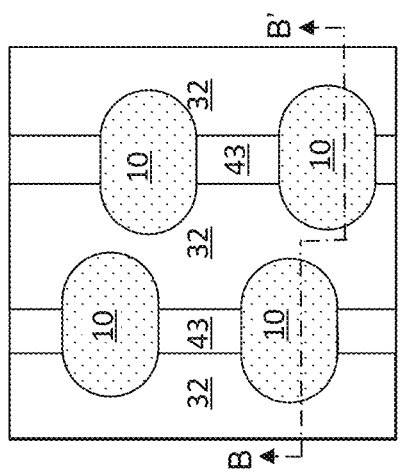
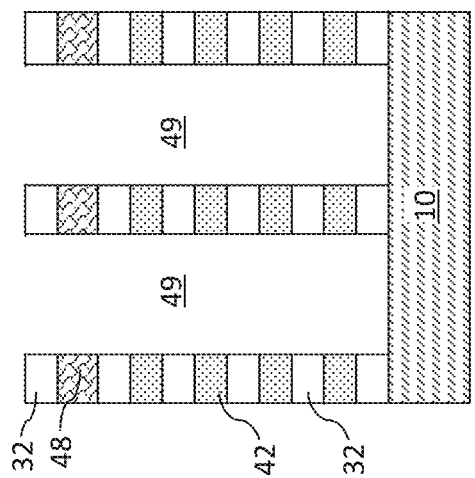
FIG. 15A
FIG. 15B

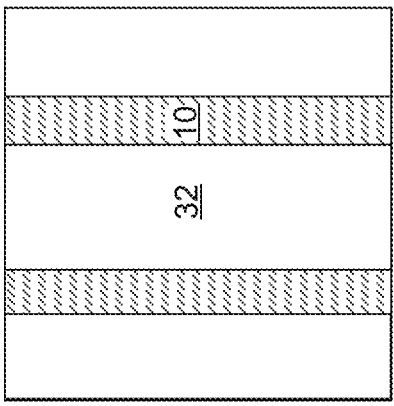
FIG. 21A
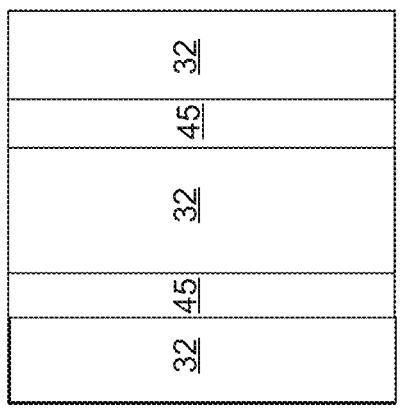
FIG. 22A
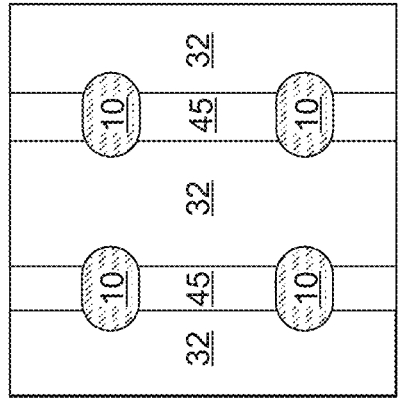
FIG. 23A
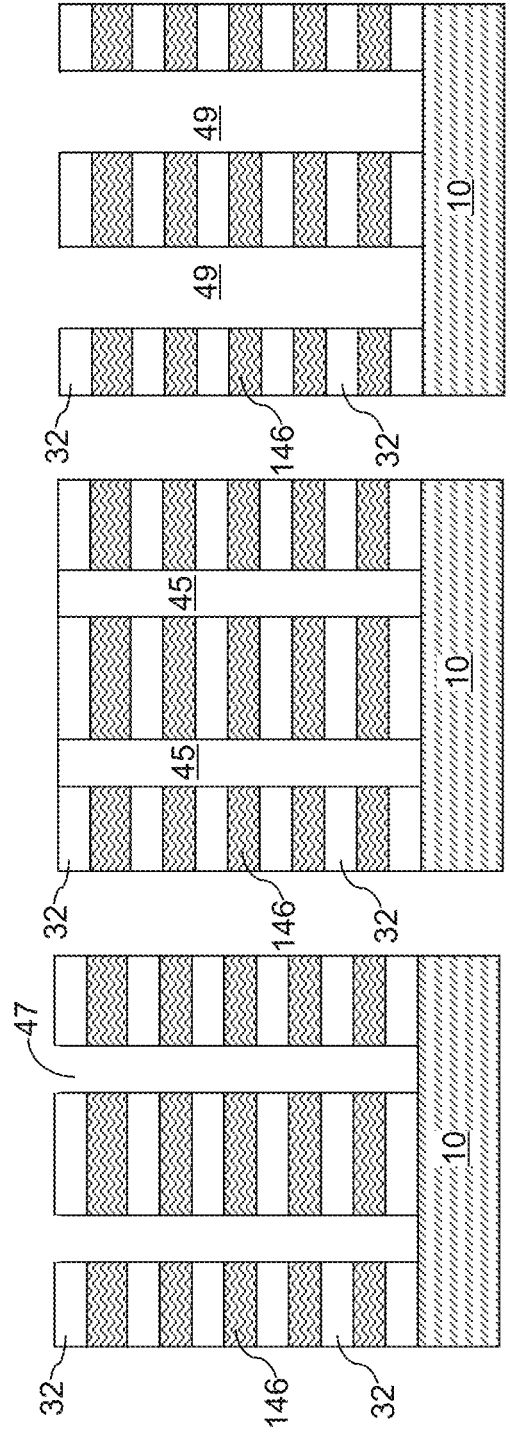
FIG. 21B
FIG. 22B
FIG. 23B

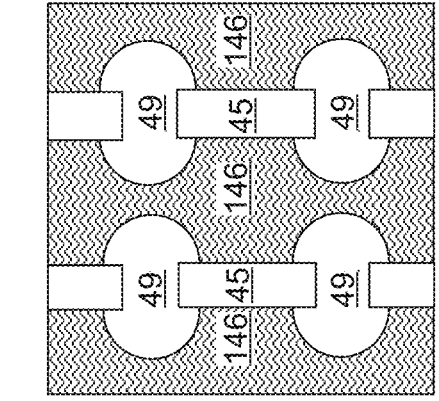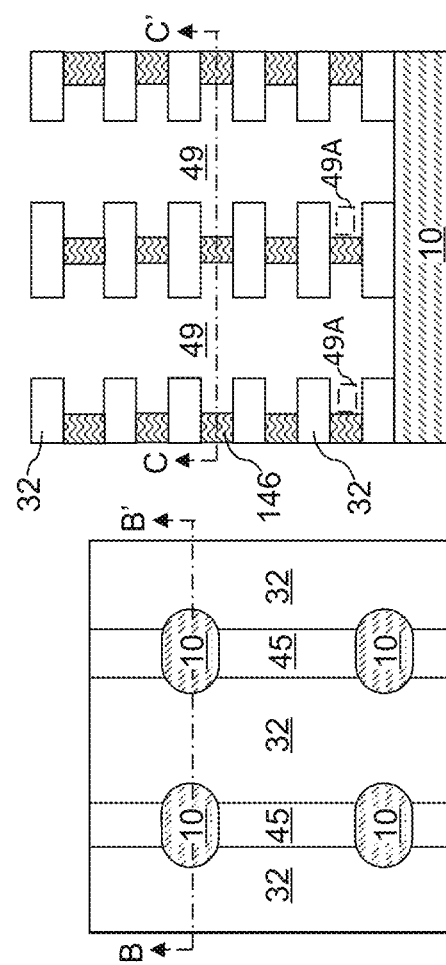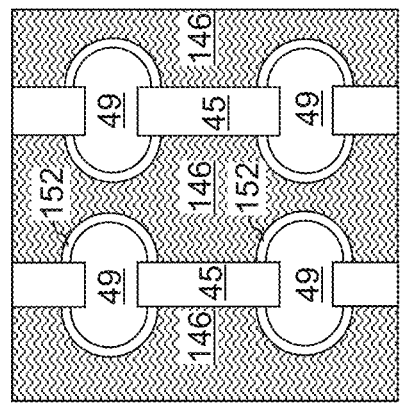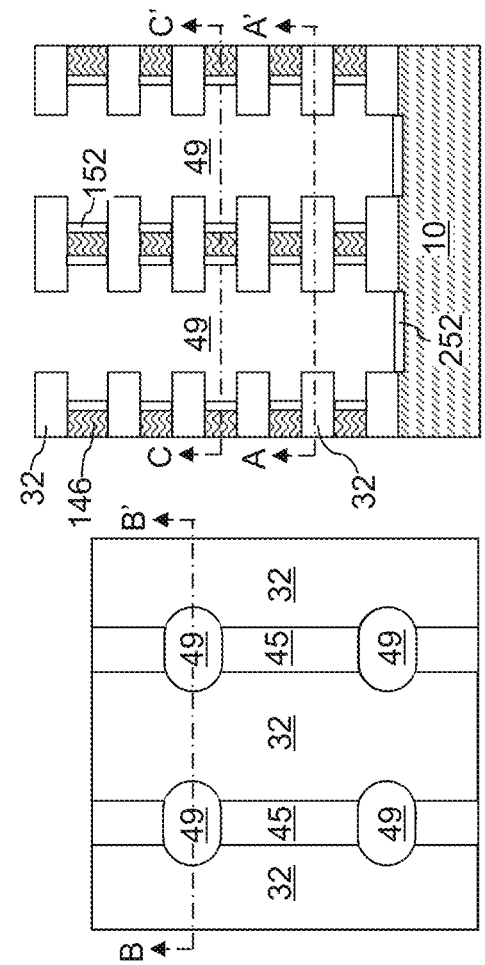

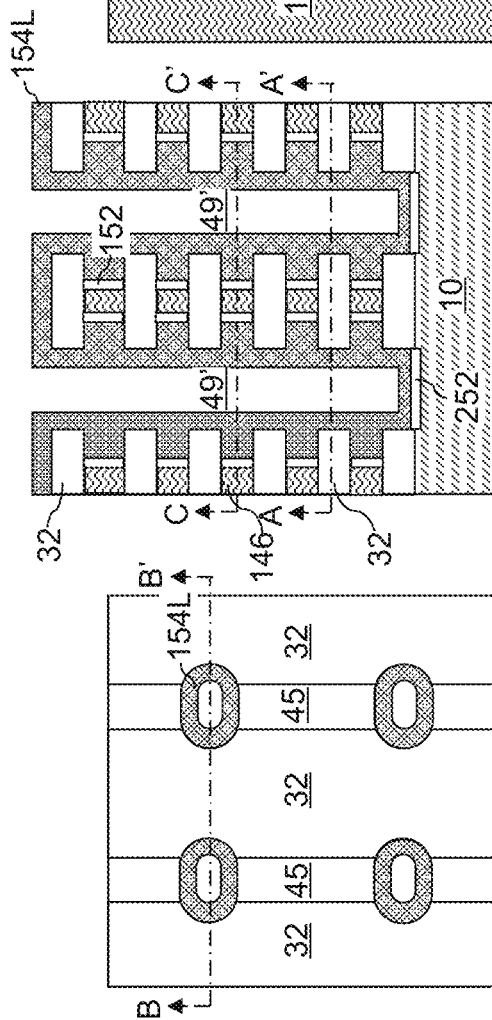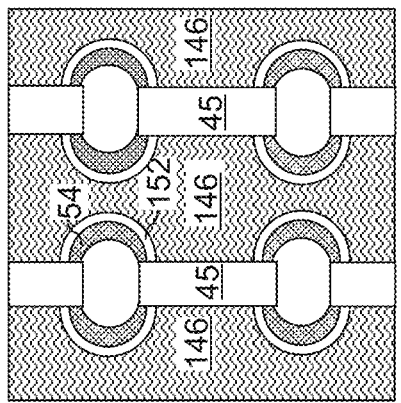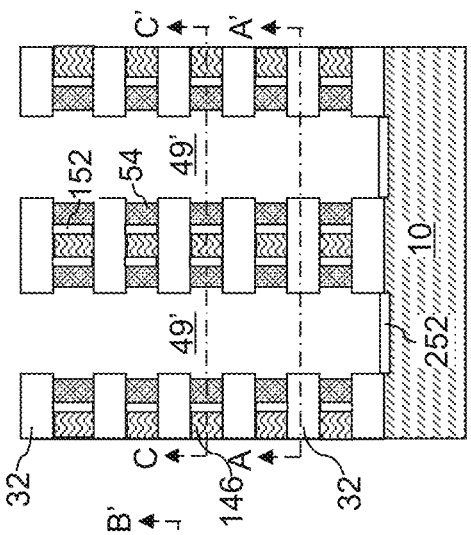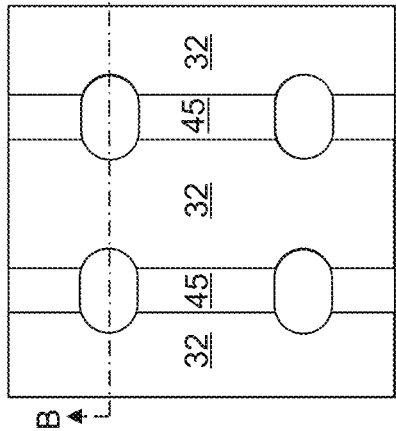

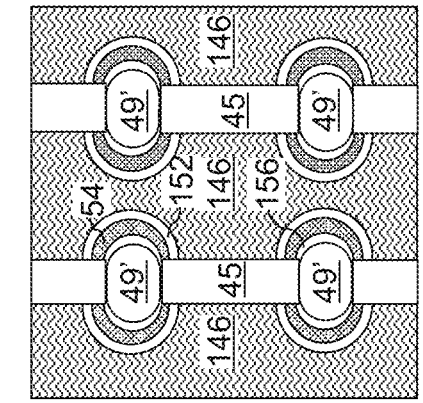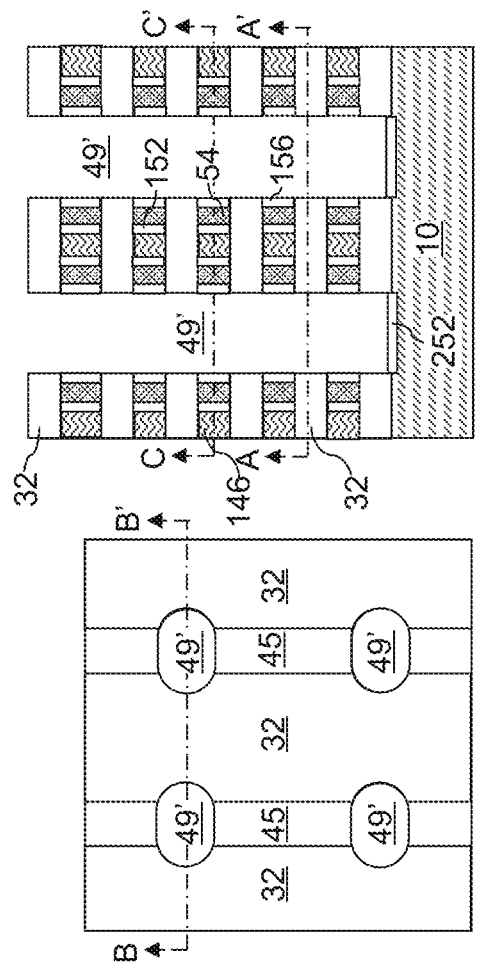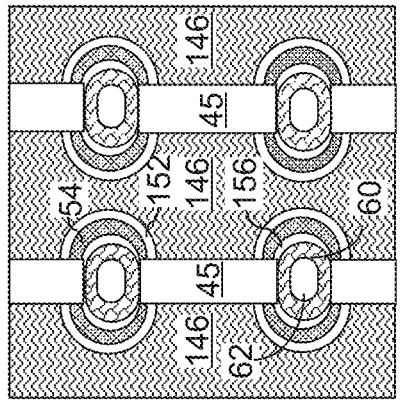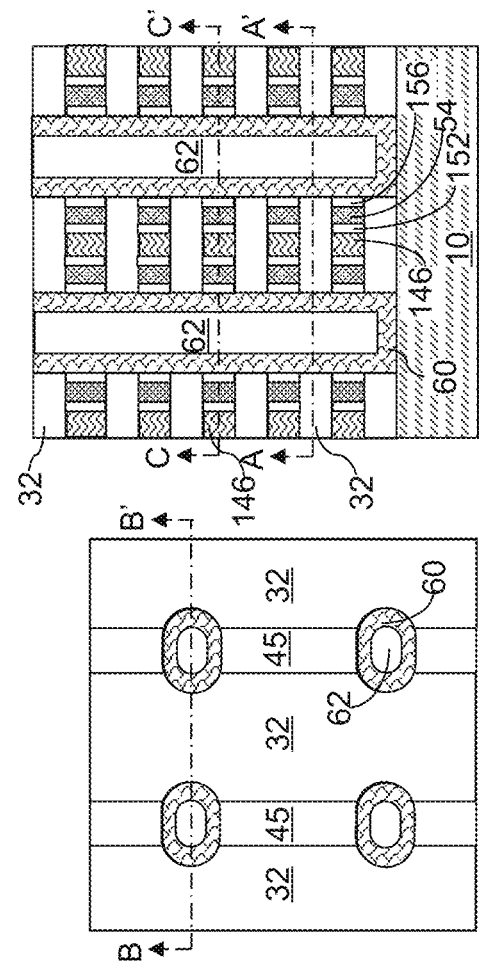

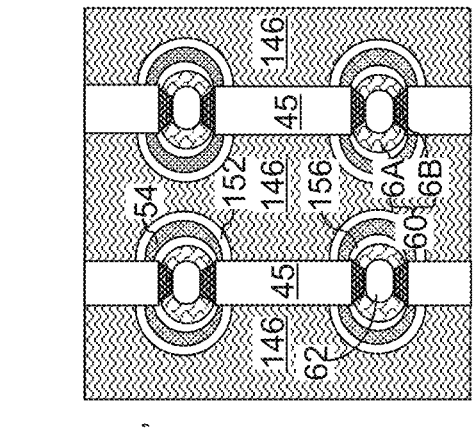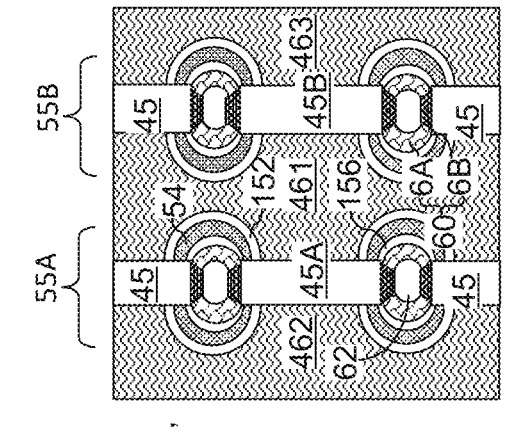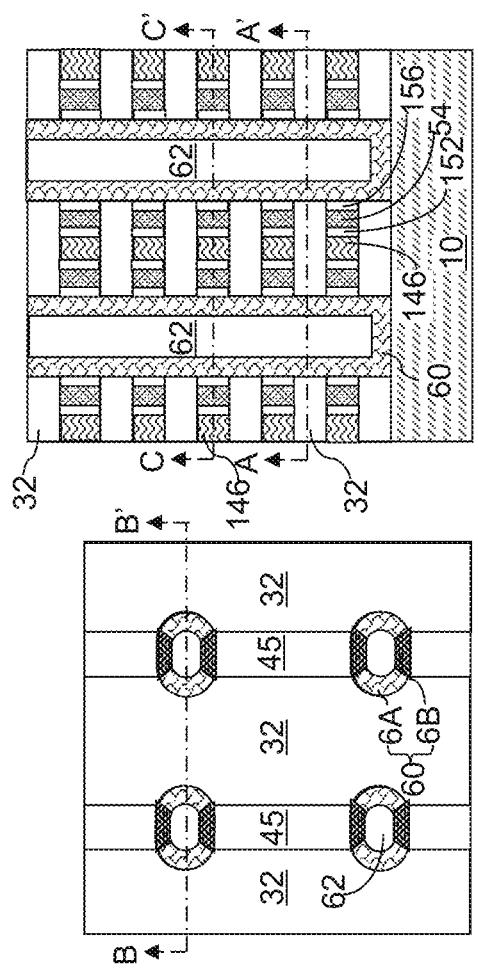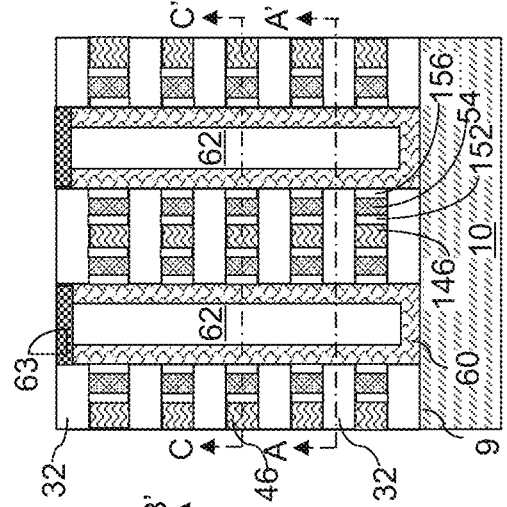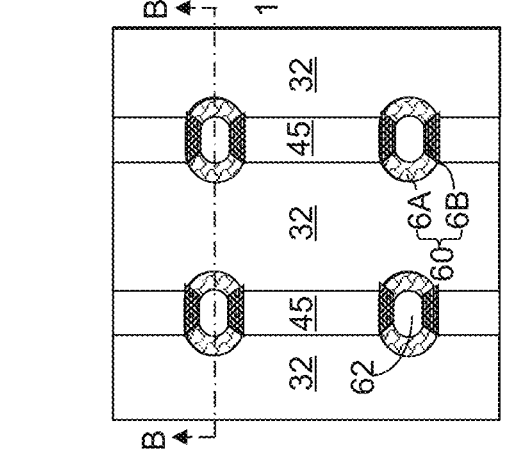

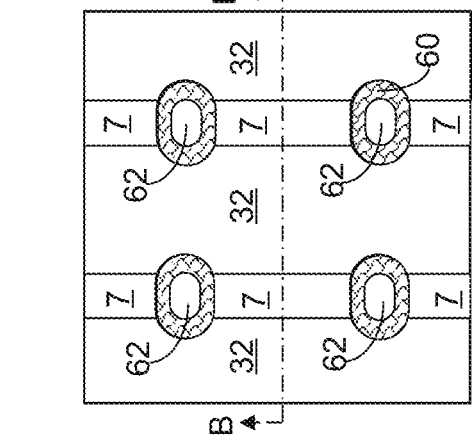
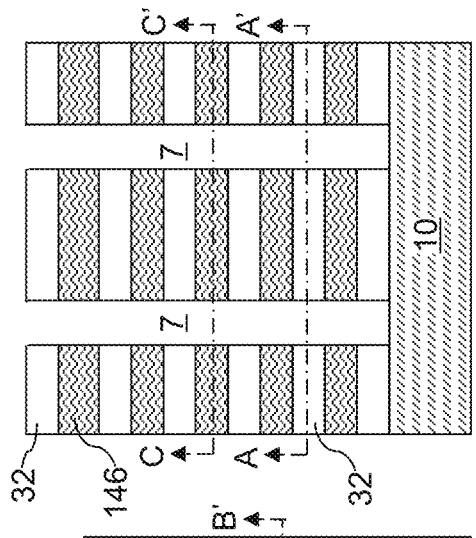
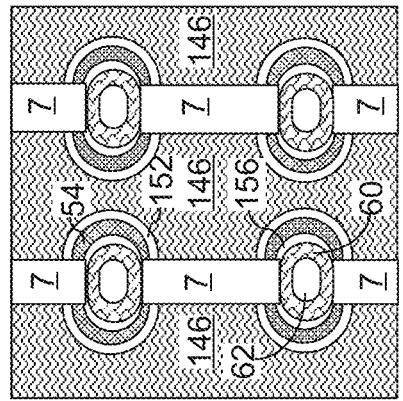
FIG. 32A  FIG. 32B  FIG. 32C
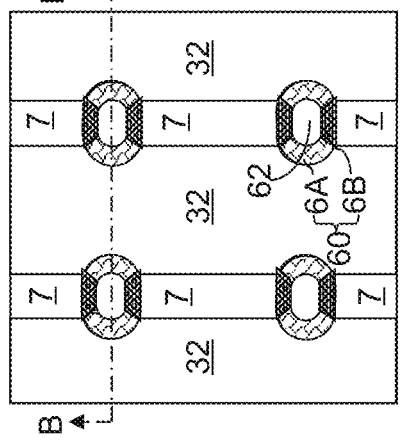
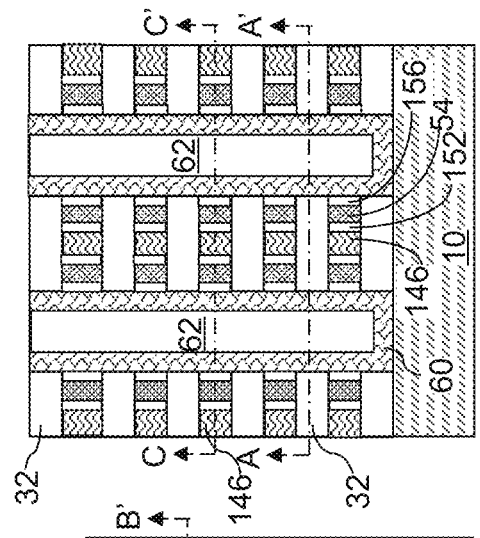
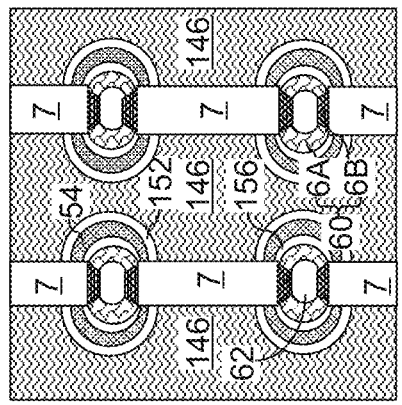
FIG. 33A  FIG. 33B  FIG. 33C

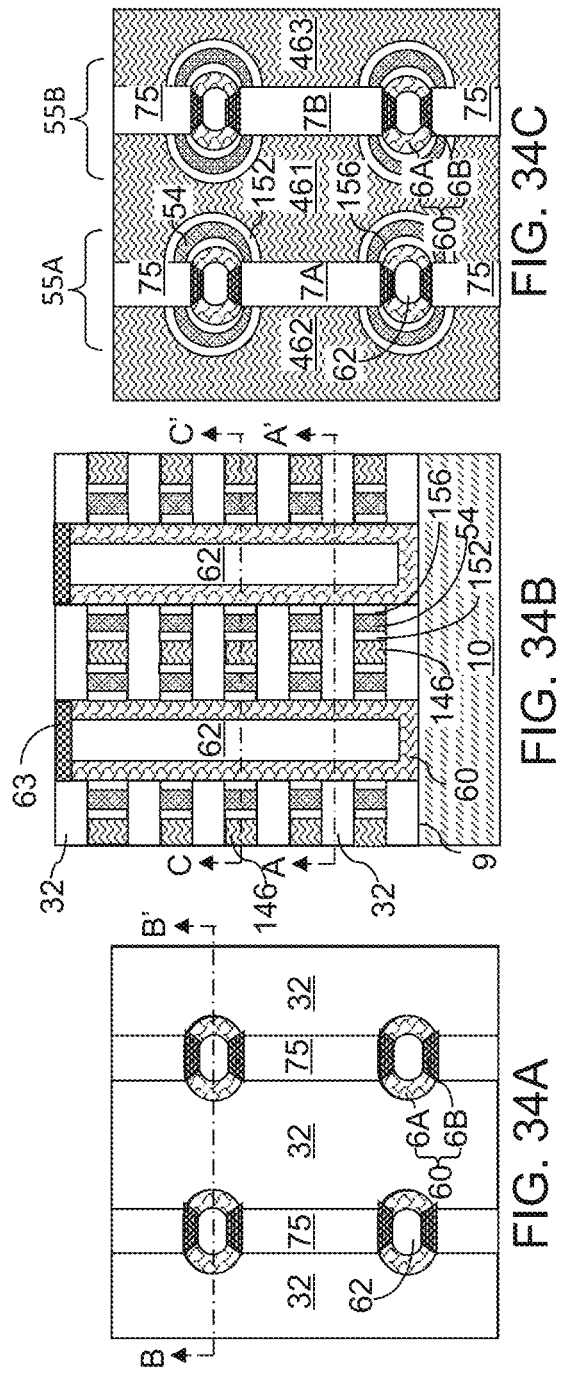

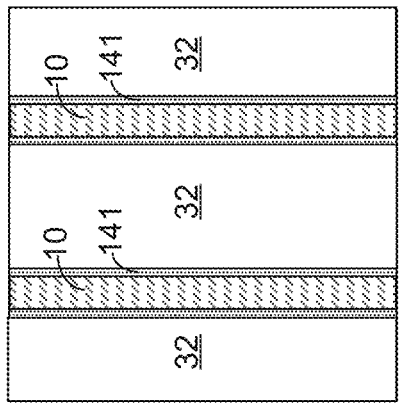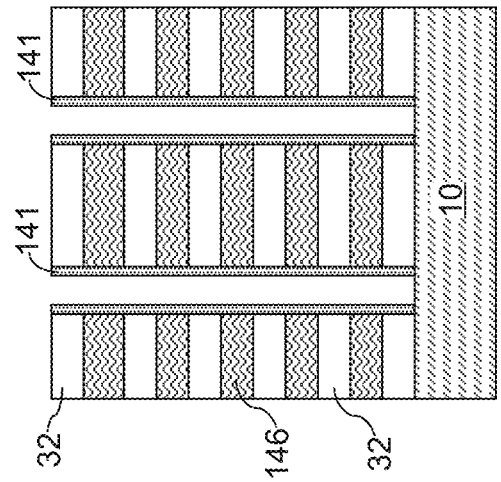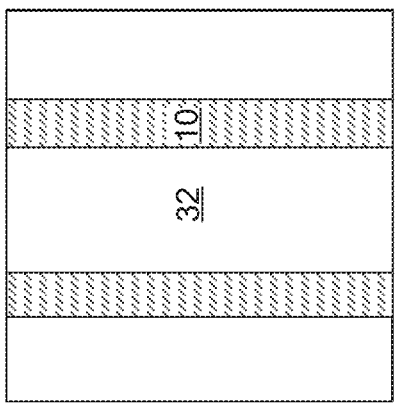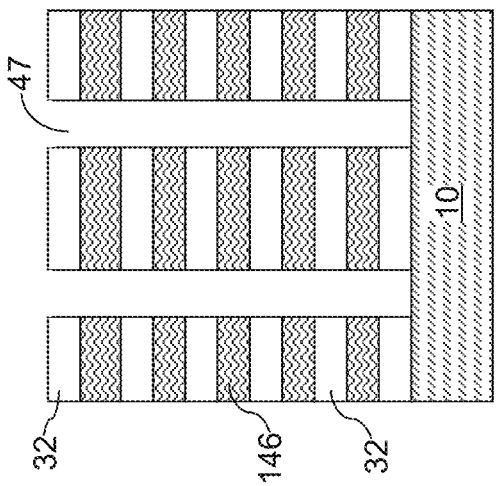

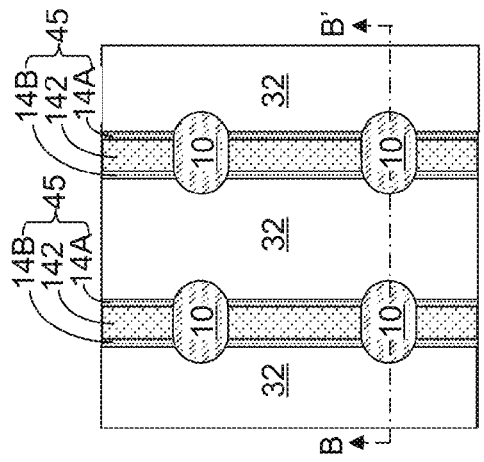
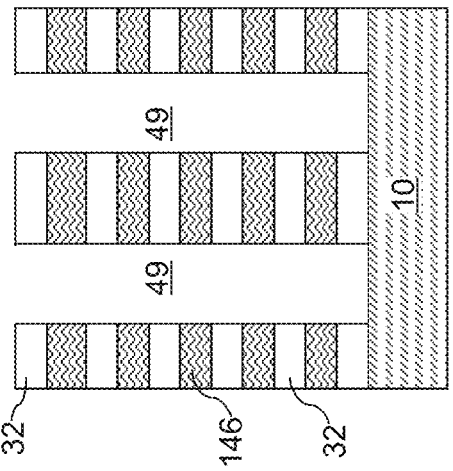
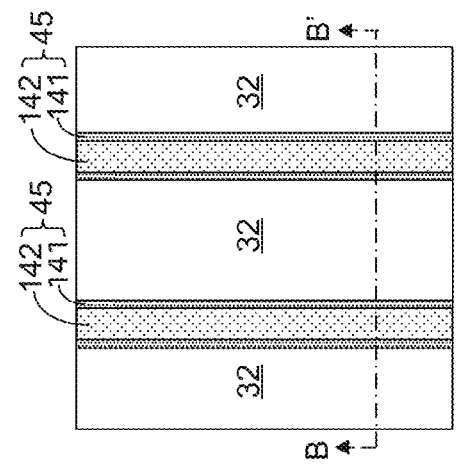
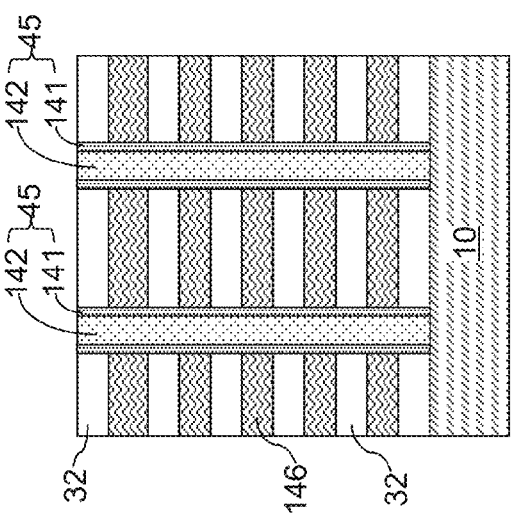

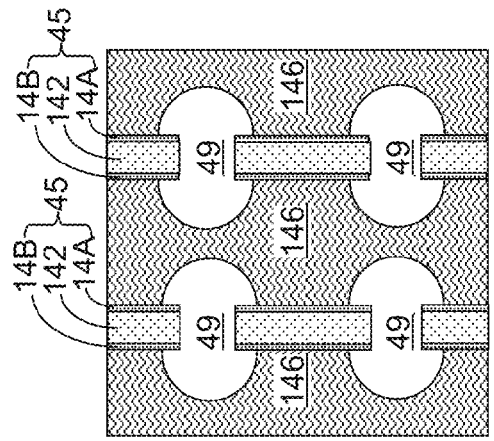
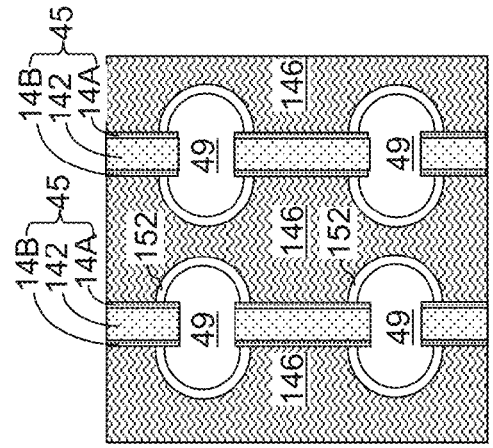
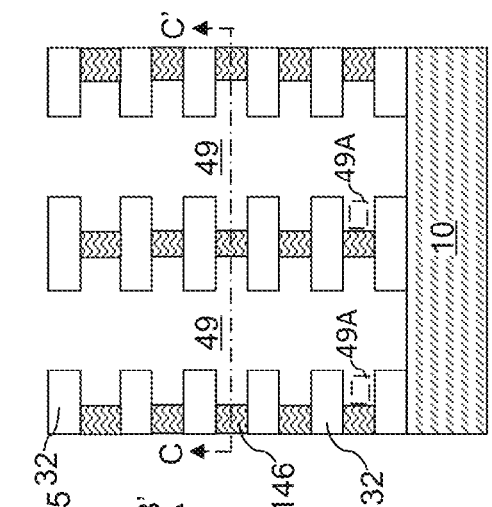
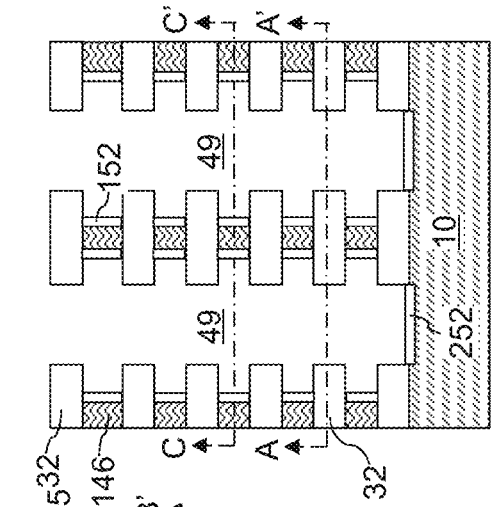
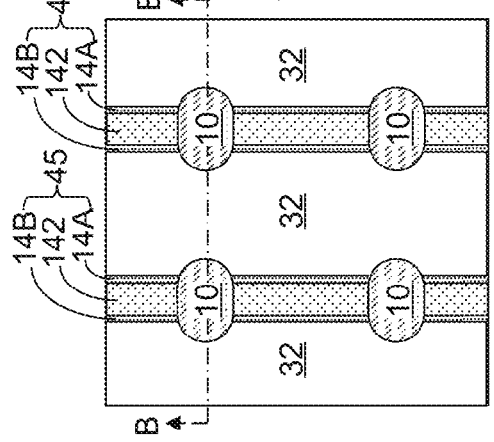
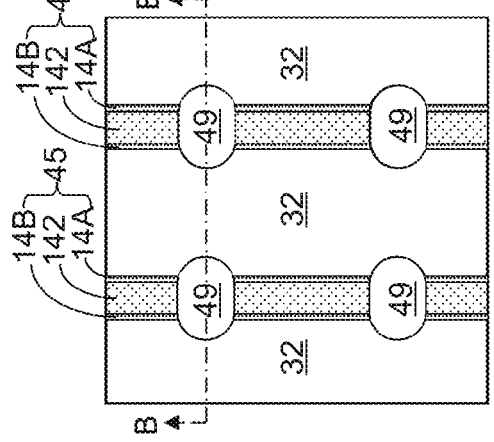

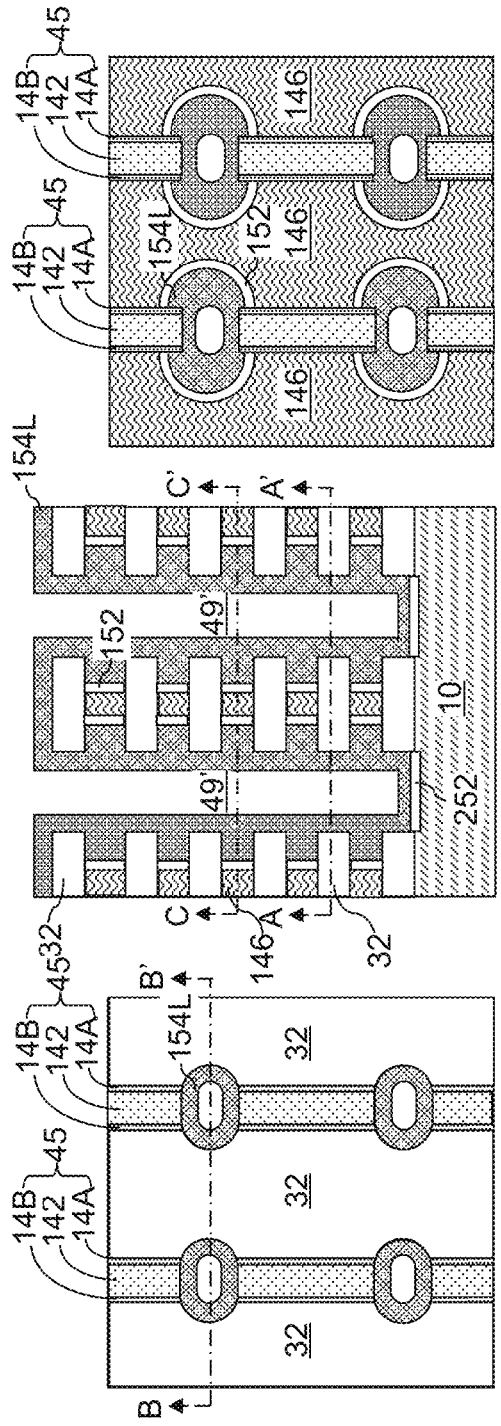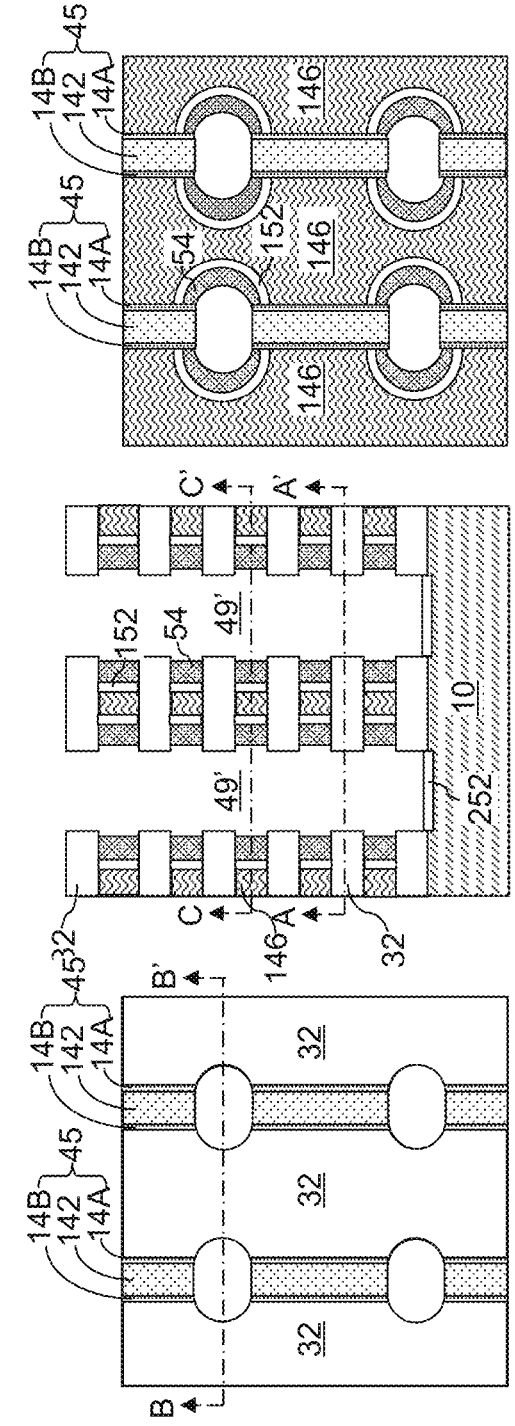

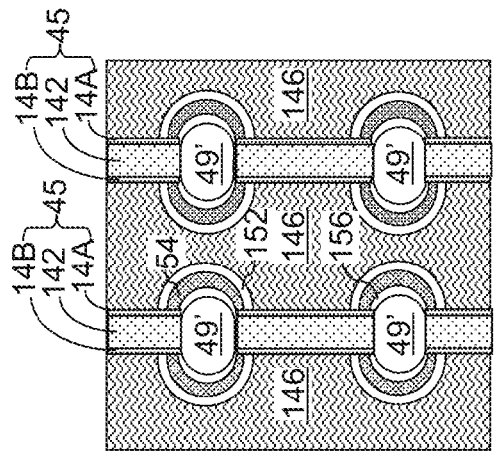
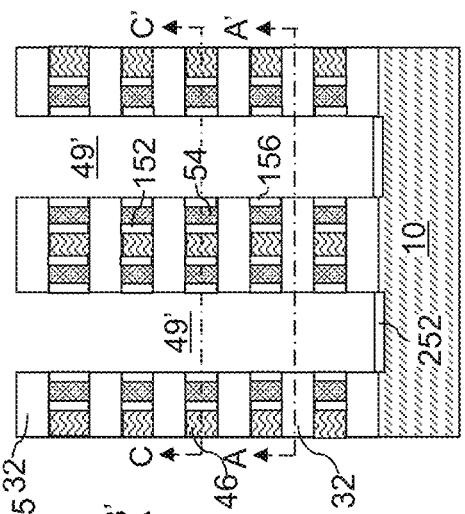
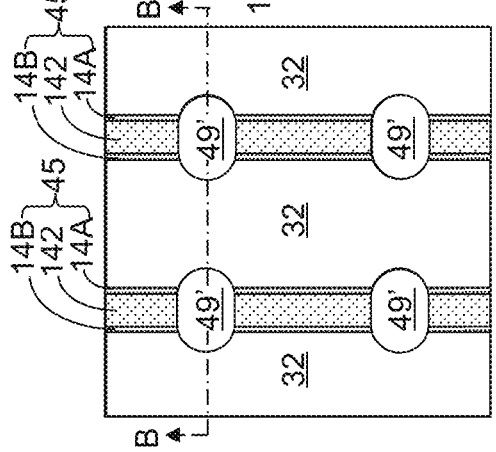
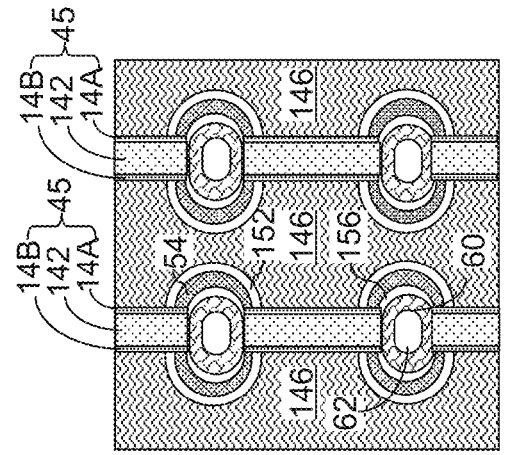
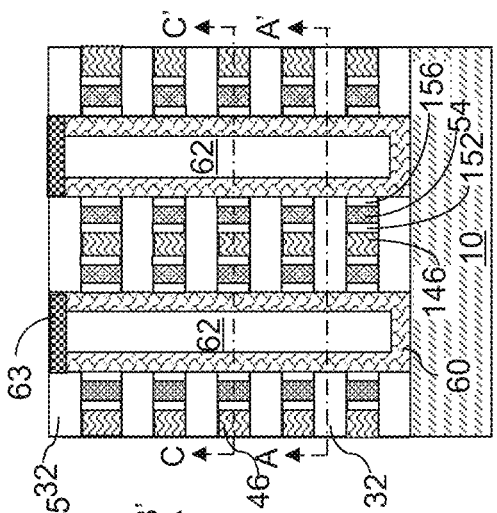
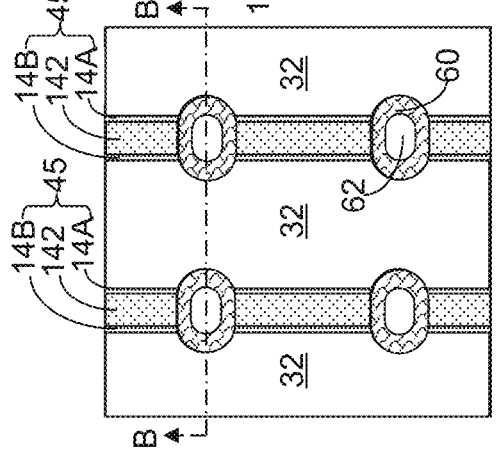

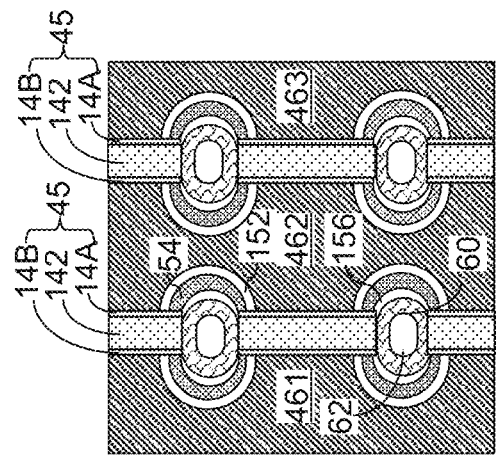
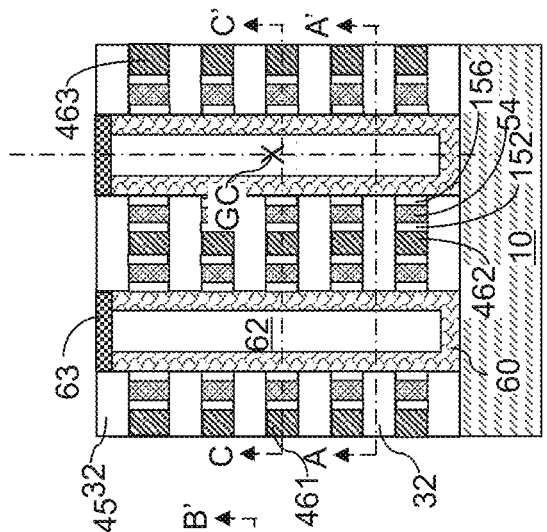
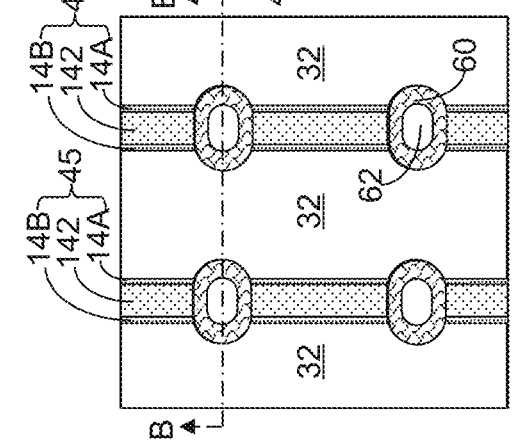

3D SEMICIRCULAR VERTICAL NAND STRING WITH SELF ALIGNED FLOATING GATE OR CHARGE TRAP CELL MEMORY CELLS AND METHODS OF FABRICATING AND OPERATING THE SAME

RELATED APPLICATIONS

This application claims the benefit of priority of U.S. Provisional Application No. 62/046,412 filed on Sep. 5, 2014, which is incorporated herein by reference in its entirety.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a memory device includes a plurality of memory cells arranged in a string substantially perpendicular to the major surface of the substrate in a plurality of device levels, at least one first select gate electrode located between the major surface of the substrate and the plurality of memory cells, at least one second select gate electrode located above the plurality of memory cells, a semiconductor channel having a portion that extends vertically along a direction perpendicular to the major surface, a first charge storage element located on a first side of the semiconductor channel; and a second charge storage element located on a second side of the semiconductor channel and located at a same level as the first charge storage element. The second charge storage element is electrically isolated from the first charge storage element, and located at a same level as the first charge storage element.

According to another aspect of the present disclosure a memory device includes an alternating stack of insulating layers and patterned electrically conductive layers located over a substrate a first pair of memory stack structures and a second pair of memory stack structures. Each memory stack structure comprises a plurality of memory cells arranged in a string extending in a first direction substantially perpendicular to the major surface of the substrate in a plurality of device levels, each of the plurality of memory cells is positioned in a respective one of the plurality of device levels above the substrate, and a semiconductor channel extends through all levels within the plurality of device levels in each memory stack structure. The device also includes a first separator insulator structure vertically extending through the stack and contacting the first pair of memory stack structures, and a second separator insulator structure vertically extending through the stack and contacting the second pair of memory stack structures. First control gate electrodes within the patterned electrically conductive layers contact the first and the second separator insulator structures, a first side of each memory stack structure within the first pair of memory stack structures, and a first side of each memory stack structure within the second pair of memory stack structures.

According to another aspect of the present disclosure, a method of making a memory device includes forming an alternating stack of insulating layers and material layers having a different composition from the insulating layers over a substrate, forming a separator trench through the alternating stack, wherein the alternating stack is divided into multiple laterally disjoined portions by the separator trench, forming a separator structure in the separator trench, and dividing the separator structure into the plurality of laterally spaced separator structures by forming memory openings therethrough. The method also includes selectively etching portions of the material layers with respect to the insulating layers from inside the memory opening, wherein a recess is formed at each level of the material layers, forming a pair of electrically isolated charge storage regions in each respective recess, forming a tunnel dielectric over the pairs of charge storage regions in the memory opening, and forming a semiconductor channel over the tunnel dielectric in the memory opening.

According to an aspect of the present disclosure, a memory device is provided, which includes a stack of alternating layers comprising insulating layers and control gate electrodes located over a substrate, a memory stack structure located within a memory opening extending through the stack and containing a semiconductor channel having a vertical portion that extends along a direction perpendicular to a top surface of the substrate, a dielectric separator structure which is located between and electrically isolates first control gate electrodes from second control gate electrodes in each device level, and at least one cell level isolation feature which electrically isolates lateral portions of the memory cell in each device level. The memory stack structure comprises at least two electrically isolated charge storage elements of the memory cell located around the semiconductor channel in each device level.

According to another aspect of the present disclosure a method of making a memory device comprises forming an alternating stack of insulating layers and material layers having a different composition from the insulating layers over a substrate, forming a separator trench that extends through the stack of alternating layers, wherein remaining portions of the stack of alternating layers are laterally spaced from each other by the separator trench, forming a dielectric spacer comprising a first dielectric material within the separator trench, filling a remaining portion of the separator trench with a second dielectric material to form a dielectric fill material portion, dividing a combination of the dielectric spacer and the dielectric fill material portion into multiple disjoined structures by forming at least one memory opening therethrough, and forming a memory stack structure within each of the at least one memory opening. Each remaining portion of the combination comprises a separator structure and patterned electrically conductive layers are provided at each level of the material layers by forming the material layers as layers of a conductive material or by replacement of the material layers with at least one conductive material.

According to even another aspect of the present disclosure a method of operating a monolithic three dimensional NAND memory device, comprises injecting electrons into the separator structure during an erase operation of the device. The device comprises a stack of alternating layers comprising insulating layers and control gate electrodes located over a substrate, a memory stack structure located within a memory opening extending through the stack and containing a semiconductor channel having a vertical portion that extends along a direction perpendicular to a top surface of the substrate, and a separator structure which is located between and electrically isolates first control gate electrodes from second control gate electrodes in each device level.

According to yet another aspect of the present disclosure, a method of making a memory device comprises forming an alternating stack of insulating layers and material layers having a different composition from the insulating layers over a substrate, forming a plurality of separator structures laterally spaced by memory openings, each of the plurality of separator structures and memory openings extending through the alternating stack, forming a memory stack structure within each of the memory openings, each memory stack structure comprising a semiconductor channel having a vertical portion that extends along a direction perpendicular to a top surface of the substrate, and selectively doping the semiconductor channel to form a plurality of alternating base doping semiconductor channel portions and enhanced doping semiconductor channel portions located in the same device level. The plurality of enhanced doping semiconductor channel portions has a higher dopant concentration than the base doping semiconductor channel portions.

BRIEF DESCRIPTION OF THE DRAWINGS

FIG. 2A is a top-down view of a first exemplary device structure after formation of laterally-extending trenches according to a first embodiment of the present disclosure.

FIG. 2B is a vertical cross-sectional view of the first exemplary device structure of FIG. 2A.

FIG. 3A is a top-down view of the first exemplary device structure after formation of separator insulator structures according to the first embodiment of the present disclosure.

FIG. 3B is a vertical cross-sectional view of the first exemplary device structure of FIG. 3A.

FIG. 4A is a top-down view of the first exemplary device structure after formation of memory openings according to the first embodiment of the present disclosure.

FIG. 4B is a vertical cross-sectional view of the first exemplary device structure of FIG. 4A.

FIG. 5A is a top-down view of the first exemplary device structure after selective lateral expansion of the memory openings according to the first embodiment of the present disclosure.

FIG. 5B is a vertical cross-sectional view along the vertical plane B-B' of the first exemplary device structure of FIG. 5A.

FIG. 5C is a horizontal cross-sectional view of the first exemplary device structure along the horizontal plane C-C' of FIG. 5B.

FIG. 6A is a horizontal cross-sectional view of the first exemplary device structure after formation of a blocking dielectric layer and a charge storage material layer along the horizontal plane A-A' of FIG. 6B according to the first embodiment of the present disclosure.

FIG. 6B is a vertical cross-sectional view along the vertical plane B-B' of the first exemplary device structure of FIG. 6A.

FIG. 6C is a horizontal cross-sectional view of the first exemplary device structure along the horizontal plane C-C' of FIG. 6B.

FIG. 7A is a top-down view of the first exemplary device structure after formation of blocking dielectrics and charge storage material portions along the horizontal plane A-A' of FIG. 7B according to the first embodiment of the present disclosure.

FIG. 7B is a vertical cross-sectional view along the vertical plane B-B' of the first exemplary device structure of FIG. 7A.

FIG. 7C is a horizontal cross-sectional view of the first exemplary device structure along the horizontal plane C-C' of FIG. 7B.

FIG. 8A is a top-down view of the array region of the first exemplary device structure after formation of tunnel dielectrics and first semiconductor channels along the horizontal plane A-A' of FIG. 8B according to the first embodiment of the present disclosure.

FIG. 8B is a vertical cross-sectional view along the vertical plane B-B' of the first exemplary device structure of FIG. 8A.

FIG. 8C is a horizontal cross-sectional view of the first exemplary device structure along the horizontal plane C-C' of FIG. 8B.

FIG. 9A is a top-down view of the array region of the first exemplary device structure after formation of a second semiconductor channel and a dielectric core along the horizontal plane A-A' of FIG. 9B according to the first embodiment of the present disclosure.

FIG. 9B is a vertical cross-sectional view along the vertical plane B-B' of the first exemplary device structure of FIG. 9A.

FIG. 9C is a horizontal cross-sectional view of the first exemplary device structure along the horizontal plane C-C' of FIG. 9B.

FIG. 14A is a top-down view of the array region of the second exemplary device structure after formation of memory openings according to the second embodiment of the present disclosure.

FIG. 14B is a vertical cross-sectional view of the second exemplary device structure along the vertical plane B-B' of FIG. 14A.

FIG. 15A is a top-down view of the array region of the second exemplary device structure after formation of control gate electrodes and source-side select gate electrodes according to the second embodiment of the present disclosure.

FIG. 15B is a vertical cross-sectional view of the second exemplary device structure along the vertical plane B-B' of FIG. 15A.

FIG. 21A is a top-down view of a third exemplary device structure after formation of an alternating stack of insulating layers and semiconductor layers and subsequent formation of laterally-extending trenches according to a third embodiment of the present disclosure.

FIG. 21B is a vertical cross-sectional view of the third exemplary device structure of FIG. 21A.

FIG. 22A is a top-down view of the third exemplary device structure after formation of separator structures according to the third embodiment of the present disclosure.

FIG. 22B is a vertical cross-sectional view of the third exemplary device structure of FIG. 22A.

FIG. 23A is a top-down view of the third exemplary device structure after formation of memory openings according to the third embodiment of the present disclosure.

FIG. 23B is a vertical cross-sectional view of the third exemplary device structure of FIG. 23A.

FIG. 24A is a top-down view of the third exemplary device structure after selective lateral expansion of the memory openings according to the third embodiment of the present disclosure.

FIG. 24B is a vertical cross-sectional view along the vertical plane B-B' of the third exemplary device structure of FIG. 24A.

FIG. 24C is a horizontal cross-sectional view of the third exemplary device structure along the horizontal plane C-C' of FIG. 24B.

FIG. 25A is a top-down view of the third exemplary device structure after formation of blocking dielectrics according to the third embodiment of the present disclosure.

FIG. 25B is a vertical cross-sectional view along the vertical plane B-B' of the third exemplary device structure of FIG. 25A.

FIG. 25C is a horizontal cross-sectional view of the third exemplary device structure along the horizontal plane C-C' of FIG. 25B.

FIG. 26A is a vertical cross-sectional view of the third exemplary device structure after formation of a floating gate material layer according to the third embodiment of the present disclosure along the horizontal plane A-A' of FIG. 26B.

FIG. 26B is a vertical cross-sectional view along the vertical plane B-B' of the third exemplary device structure of FIG. 26A.

FIG. 26C is a horizontal cross-sectional view of the third exemplary device structure along the horizontal plane C-C' of FIG. 26B.

FIG. 27A is a vertical cross-sectional view of the third exemplary device structure after formation of floating gates according to the third embodiment of the present disclosure along the horizontal plane A-A' of FIG. 27B.

FIG. 27B is a vertical cross-sectional view along the vertical plane B-B' of the third exemplary device structure of FIG. 27A.

FIG. 27C is a horizontal cross-sectional view of the third exemplary device structure along the horizontal plane C-C' of FIG. 27B.

FIG. 28A is a vertical cross-sectional view of the third exemplary device structure after formation of tunneling dielectrics according to the third embodiment of the present disclosure along the horizontal plane A-A' of FIG. 28B.

FIG. 28B is a vertical cross-sectional view along the vertical plane B-B' of the third exemplary device structure of FIG. 28A.

FIG. 28C is a horizontal cross-sectional view of the third exemplary device structure along the horizontal plane C-C' of FIG. 28B.

FIG. 29A is a vertical cross-sectional view of the third exemplary device structure after formation of a semiconductor channel and a dielectric core in each memory opening according to the third embodiment of the present disclosure along the horizontal plane A-A' of FIG. 29B.

FIG. 29B is a vertical cross-sectional view along the vertical plane B-B' of the third exemplary device structure of FIG. 29A.

FIG. 29C is a horizontal cross-sectional view of the third exemplary device structure along the horizontal plane C-C' of FIG. 29B.

FIG. 30A is a vertical cross-sectional view of the third exemplary device structure after formation of enhanced doping regions according to the third embodiment of the present disclosure along the horizontal plane A-A' of FIG. 30B.

FIG. 30B is a vertical cross-sectional view along the vertical plane B-B' of the third exemplary device structure of FIG. 30A.

FIG. 30C is a horizontal cross-sectional view of the third exemplary device structure along the horizontal plane C-C' of FIG. 30B.

FIG. 31A is a vertical cross-sectional view of the third exemplary device structure after formation of drain regions according to the third embodiment of the present disclosure along the horizontal plane A-A' of FIG. 31B.

FIG. 31B is a vertical cross-sectional view along the vertical plane B-B' of the third exemplary device structure of FIG. 31A.

FIG. 31C is a horizontal cross-sectional view of the third exemplary device structure along the horizontal plane C-C' of FIG. 31B.

FIG. 32A is a vertical cross-sectional view of a fourth exemplary device structure after removal of separator insulator structures according to the fourth embodiment of the present disclosure along the horizontal plane A-A' of FIG. 32B.

FIG. 32B is a vertical cross-sectional view along the vertical plane B-B' of the fourth exemplary device structure of FIG. 32A.

FIG. 32C is a horizontal cross-sectional view of the fourth exemplary device structure along the horizontal plane C-C' of FIG. 32B.

FIG. 33A is a vertical cross-sectional view of the fourth exemplary device structure after formation of enhanced doping regions according to the fourth embodiment of the present disclosure along the horizontal plane A-A' of FIG. 33B.

FIG. 33B is a vertical cross-sectional view along the vertical plane B-B' of the fourth exemplary device structure of FIG. 33A.

FIG. 33C is a horizontal cross-sectional view of the fourth exemplary device structure along the horizontal plane C-C' of FIG. 33B.

FIG. 34A is a vertical cross-sectional view of the fourth exemplary device structure after formation of drain regions according to the fourth embodiment of the present disclosure along the horizontal plane A-A' of FIG. 34B.

FIG. 34B is a vertical cross-sectional view along the vertical plane B-B' of the fourth exemplary device structure of FIG. 34A.

FIG. 34C is a horizontal cross-sectional view of the fourth exemplary device structure along the horizontal plane C-C' of FIG. 34B.

FIG. 35A is a top-down view of a fifth exemplary device structure after formation of an alternating stack of insulating layers and semiconductor layers and subsequent formation of laterally-extending trenches according to a fifth embodiment of the present disclosure.

FIG. 35B is a vertical cross-sectional view of the third exemplary device structure of FIG. 35A.

FIG. 36A is a top-down view of the fifth exemplary device structure after formation of dielectric liners according to the fifth embodiment of the present disclosure.

FIG. 36B is a vertical cross-sectional view of the fifth exemplary device structure of FIG. 36A.

FIG. 37A is a top-down view of the fifth exemplary device structure after formation of dielectric fill material portions according to the fifth embodiment of the present disclosure.

FIG. 37B is a vertical cross-sectional view of the fifth exemplary device structure of FIG. 37A.

FIG. 38A is a top-down view of the fifth exemplary device structure after formation of memory openings according to the fifth embodiment of the present disclosure.

FIG. 38B is a vertical cross-sectional view of the fifth exemplary device structure of FIG. 38A.

FIG. 39A is a top-down view of the fifth exemplary device structure after selective lateral expansion of the memory openings according to the fifth embodiment of the present disclosure.

FIG. 39B is a vertical cross-sectional view along the vertical plane B-B' of the fifth exemplary device structure of FIG. 39A.

FIG. 39C is a horizontal cross-sectional view of the fifth exemplary device structure along the horizontal plane C-C' of FIG. 39B.

FIG. 40A is a vertical cross-sectional view of the fifth exemplary device structure after formation of blocking dielectrics according to the fifth embodiment of the present disclosure along the horizontal plane A-A' of FIG. 40B.

FIG. 40B is a vertical cross-sectional view along the vertical plane B-B' of the fifth exemplary device structure of FIG. 40A.

FIG. 40C is a horizontal cross-sectional view of the fifth exemplary device structure along the horizontal plane C-C' of FIG. 40B.

FIG. 41A is a vertical cross-sectional view of the fifth exemplary device structure after formation of a floating gate material layer according to the fifth embodiment of the present disclosure along the horizontal plane A-A' of FIG. 41B.

FIG. 41B is a vertical cross-sectional view along the vertical plane B-B' of the fifth exemplary device structure of FIG. 41A.

FIG. 41C is a horizontal cross-sectional view of the fifth exemplary device structure along the horizontal plane C-C' of FIG. 41B.

FIG. 42A is a vertical cross-sectional view of the fifth exemplary device structure after formation of floating gates according to the fifth embodiment of the present disclosure along the horizontal plane A-A' of FIG. 42B.

FIG. 42B is a vertical cross-sectional view along the vertical plane B-B' of the fifth exemplary device structure of FIG. 42A.

FIG. 42C is a horizontal cross-sectional view of the fifth exemplary device structure along the horizontal plane C-C' of FIG. 42B.

FIG. 43A is a vertical cross-sectional view of the fifth exemplary device structure after formation of tunneling dielectrics according to the fifth embodiment of the present disclosure along the horizontal plane A-A' of FIG. 43B.

FIG. 43B is a vertical cross-sectional view along the vertical plane B-B' of the fifth exemplary device structure of FIG. 43A.

FIG. 43C is a horizontal cross-sectional view of the fifth exemplary device structure along the horizontal plane C-C' of FIG. 43B.

FIG. 44A is a vertical cross-sectional view of the fifth exemplary device structure after formation of a semiconductor channel and a dielectric core in each memory opening according to the fifth embodiment of the present disclosure along the horizontal plane A-A' of FIG. 44B.

FIG. 44B is a vertical cross-sectional view along the vertical plane B-B' of the fifth exemplary device structure of FIG. 45A.

FIG. 44C is a horizontal cross-sectional view of the fifth exemplary device structure along the horizontal plane C-C' of FIG. 44B.

FIG. 45A is a vertical cross-sectional view of the fifth exemplary device structure after optional replacement of semiconductor layers with metallic layers according to the fifth embodiment of the present disclosure along the horizontal plane A-A' of FIG. 45B.

FIG. 45B is a vertical cross-sectional view along the vertical plane B-B' of the fifth exemplary device structure of FIG. 45A.

FIG. 45C is a horizontal cross-sectional view of the fifth exemplary device structure along the horizontal plane C-C' of FIG. 45B.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
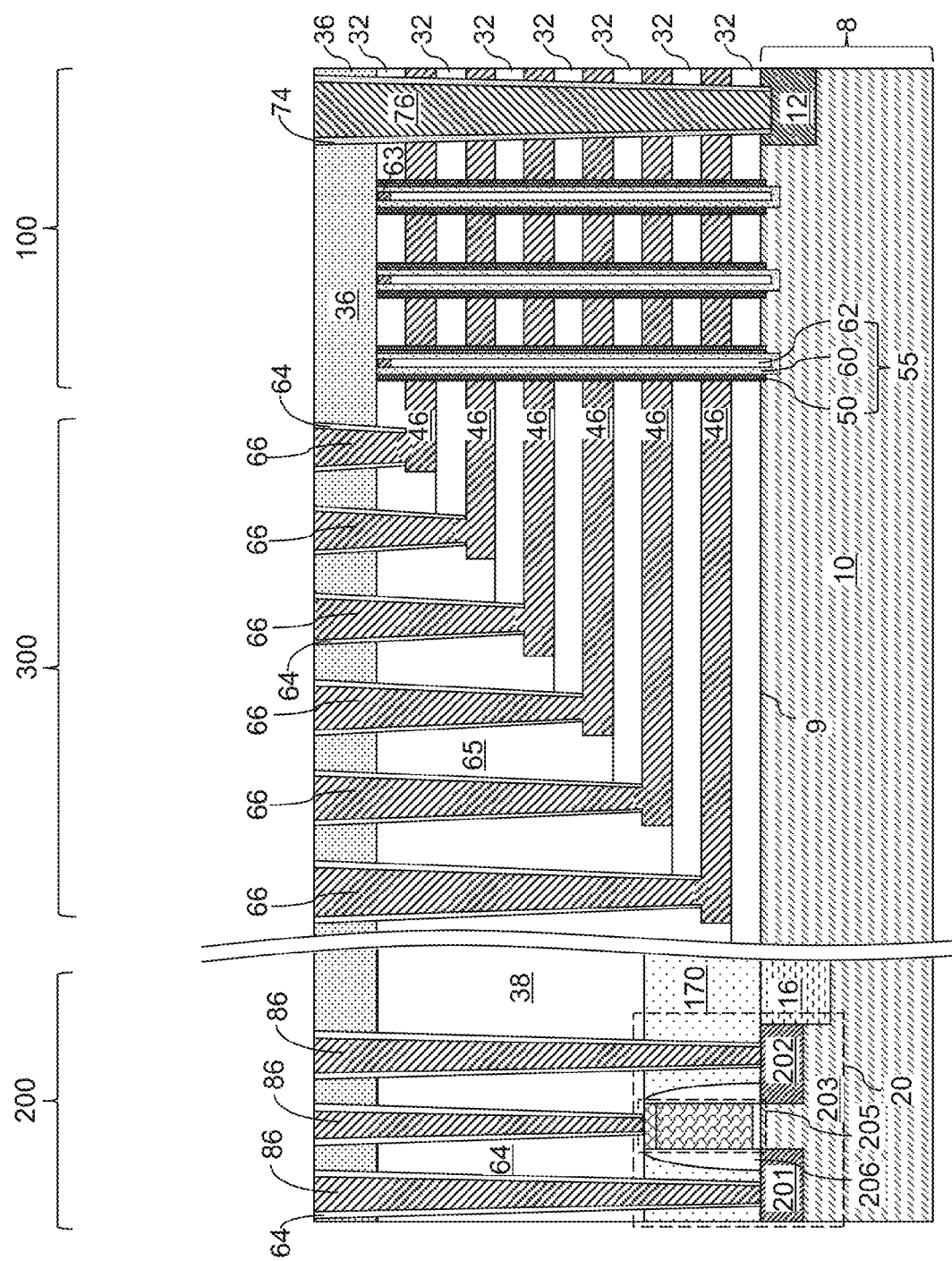
FIG. 1 is a vertical cross-section of an exemplary device structure containing a 3D NAND stacked memory device according to embodiments of the present disclosure.

Referring to FIG. 1, an exemplary device structure according to embodiments of the present disclosure is shown, which includes a 3D NAND stacked memory device. The exemplary device structure can be employed to incorporate any of the various embodiments for forming memory stack structures 55 according to the present disclosure. Each memory stack structure 55 can include at least a memory film 50, a semiconductor channel 60, and optionally a dielectric core 62 in case the semiconductor channel 60 does not fill the entire volume within the memory film 50.

The exemplary device structure includes a substrate 8, which can be a semiconductor substrate. Various semiconductor devices can be formed on, or over, the substrate 8 employing methods known in the art. For example, an array of memory devices can be formed in a device region 100, and at least one peripheral device 20 can be formed in a peripheral device region 200. Electrically conductive via contacts to the electrically conductive electrodes of the devices in the device region 100 can be formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. A source region 12 can be formed in a region of the substrate semiconductor layer 10 that is laterally offset from the memory stack structures 55. Alternatively, a source region can be formed directly underneath memory stack structures 55 of memory cells, as described in U.S. patent application Ser. No. 14/317,274, filed on Jun. 27, 2014, which is incorporated herein by reference. A select transistor can be formed between the top of the substrate semiconductor layer 10 and the bottommost control gate of the memory devices.

At least one optional shallow trench isolation structure 16 and/or at least one deep trench isolation structure (not shown) may be employed to provide electrical isolation among various semiconductor devices on the substrate 8. The at least one peripheral device 20 formed in the peripheral device region 200 can include any device known in the art and needed to support the operation of the semiconductor devices in the device region 100. The at least one peripheral device 20 can include a driver circuit associated with the array of the memory devices in the device region 100. The at least one peripheral device can comprise transistor devices in the driver circuit. In one embodiment, the at least one peripheral device can include one or more field effect transistors, each of which can include a source region 201, a drain region 202, a body region 203 (e.g., a channel region), a gate stack 205, and a gate spacer 206. The gate stack 205 can include any type of gate stack known in the art. For example, each gate stack 205 can include, from one side to another, a gate dielectric, a gate electrode, and an optional gate cap dielectric. Optionally, a planarization dielectric layer 170 including a dielectric material may be employed in the peripheral device region 200 to facilitate planarization of the portion of material stacks to be subsequently formed on the substrate 8.

A stack of alternating layers of a first material and a second material different from the first material is formed over a top surface of the substrate 8. In one embodiment, the first material can be an insulator material that forms insulating layers 32, and the second material can be a conductive material that forms conductive line structures that can include electrically conductive layers 46, source-side select gate electrodes (not separately shown), and drain-side select gate electrodes (not separately shown). Alternatively, the first material can be an insulator material that forms insulating layers 32, and the second material can be a sacrificial material that is deposited as sacrificial layers, and is at least partly replaced with a conductive material to form various conductive line structures after formation of memory stack structures 55. In one embodiment, the alternating stack can include insulating layers 32 and material layers, which may comprise a sacrificial material that is subsequently replaced with a conductive material that forms control gate electrodes, or may comprise a conductive material that is patterned into control gate electrodes of a memory device.

The memory stack structures 55 can be formed through the alternating stack (32, 46) of the insulating layers 32 and the electrically conductive layers 46 employing the various methods of the present disclosure to be described below. A drain region 63 can be formed on top of each semiconductor channel 60. A peripheral region dielectric layer 64 can be formed by removing a peripheral portion of the alternating stack of insulating layers 32 and sacrificial material layers 42 from a peripheral device region 200 including the peripheral devices (such as driver circuits) and depositing a dielectric material over the planarization dielectric layer 170. Another portion of the alternating stack (32, 42) in a contact region 300 can be removed to form stepped surfaces in which the lateral extent of the material layers (such as sacrificial material layers 42) decreases with the vertical distance from the substrate 8. A retro-stepped dielectric fill portion 65 may be optionally employed over the stepped surfaces. As used herein, a retro-stepped structure refers to a structure in which the horizontal vertical cross-sectional area changes stepwise with a vertical distance from a top surface of a substrate such that a vertical cross-sectional area of the structure at a lower horizontal plane is included in vertical cross-sectional areas of the structure at an overlying horizontal plane.

A contact via trench is formed through the alternating stack (32, 42) at locations of a backside contact via structure 76 to be subsequently formed. If the material layers between vertically neighboring pairs of insulating layers 32 are sacrificial material layers 42, the sacrificial material layers 42 can be removed by introducing an etchant through the contact via trench. The etchant removes the material of the sacrificial material layers 42 selective to the material of the insulating layers 32 to form backside recesses. Electrically conductive layers 46 can be formed by depositing at least one conducive material in the backside recesses. The electrically conductive layers 46 include control gate electrodes for the memory stack structures 55. The electrically conductive layers 46 can form terraced (stepped) structures within the contact region 300 in order to facilitate formation of contact via structures 66.

The contact via structures 66 can be formed by forming via cavities that extend to the stepped surfaces of the electrically conductive layers 46, and by filling each via cavity with an optional dielectric liner 64 and a contact via structure 66. The dielectric liner 64, if present, may enhance electrical isolation of the contact via structures 66. A hard mask layer 36 may be optionally employed to facilitate formation of the contact via structures 66. Peripheral contact via structures 86 can be formed in the peripheral device region 200. A backside contact via structure 76 can be formed through the alternating stack (32, 46) to provide electrical contact to the source region 12. A dielectric spacer 74 can be employed to provide electrical isolation for the backside contact via structure 76. Subsequently, contacts (not shown) to the drain regions 63 can be formed, and bit lines (not shown) that overlie, and electrically shorted to, the drain regions 63 can be formed.

Referring to FIGS. 2A and 2B, a cut-out portion of a first exemplary device structure according to a first embodiment of the present disclosure is illustrated at a processing step after formation of an alternating stack (32, 42). The alternating stack (32, 42) includes alternating layers of a first material and a second material different from the first material. In one embodiment, the alternating stack (32, 42) can include insulating layers 32 composed of the first material, and sacrificial material layers 42 composed of a second material different from that of insulating layers 32. The sacrificial material layers may comprise electrically conductive material which forms the control gate electrodes of the NAND string. Alternatively, the sacrificial material layers 42 may comprise electrically insulating or conductive sacrificial layers which are removed through the back side openings and replaced with metal control gate electrodes. The insulating layers 32 can comprise insulator layers that provide the functionality of electrical insulation, and the sacrificial material layers 42 can comprise sacrificial layers that are subsequently removed.

The first material can be at least one electrically insulating material. As such, each insulating layer 32 can be an insulating material layer. Electrically insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The sacrificial material layers 42 can function as control gate electrodes made of at least one conductive material. In this case, each sacrificial material layer 42 can be a conductive material layer. Conductive materials that can be employed for the sacrificial material layers 42 that constitute the control gate electrodes include, but are not limited to, a doped semiconductor material, elemental metals, intermetallic alloys, conductive nitrides of at least one elemental metal, a silicate of at least one metal, conductive carbon allotropes, organic conductive materials, and combinations thereof. For example, the second material can be doped polysilicon, tungsten, tungsten nitride, tantalum, tantalum nitride, titanium, titanium nitride, cobalt, copper, aluminum, an alloy thereof, or a combination thereof. Alternatively, the sacrificial material layers 42 may comprise sacrificial layers, such as silicon nitride or polysilicon sacrificial layers. In this case, at least one, and/or each, of the sacrificial material layers 42 can be a sacrificial material layer. In an illustrative example, the sacrificial material layers 42 can be silicon nitride layers that can be subsequently removed, for example, by a wet etch employing phosphoric acid.

In one embodiment, the insulating layers 32 can include silicon oxide, and sacrificial material layers 42 can include silicon nitride sacrificial layers or doped polysilicon or doped amorphous silicon layers that can be subsequently converted into doped polysilicon through a thermal anneal at an elevated temperature. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by physical vapor deposition (PVD; sputtering), chemical vapor deposition, electroplating, electroless plating, or combinations thereof.

The sacrificial material layers 42 can be suitably patterned to function as the control gate electrodes of the monolithic three-dimensional NAND string memory devices to be subsequently formed. Each sacrificial material layer 42 may comprise a portion having a strip shape extending substantially parallel to the major surface 9 of the substrate 8.

The thicknesses of the insulating layers 32 and the sacrificial material layers 42 can be in a range from 8 nm to 128 nm, although lesser and greater thicknesses can be employed for each insulating layer 32 and for each control gate electrode 42. In one embodiment, the thicknesses of the insulating layers 32 and the sacrificial material layers 42 can be in a range from 20 nm to 50 nm. The number of repetitions of the pairs of an insulating layer 32 and a sacrificial material layer (e.g., control gate electrode or sacrificial material) 42 can be in a range from 2 to 1,024, and typically from 8 to 256, although a greater number of repetitions can also be employed. The top and bottom gate electrodes in the stack may function as the select gate electrodes.

An upper select gate electrode layer and another insulating layer 32 can be sequentially formed. The upper select gate electrode layer can be another sacrificial material layer 42, or can be a conductive material layer including a conductive material such as doped polysilicon. Separator trenches 47 can be formed through the topmost insulating layer 32, the upper select gate electrode layer, and the alternating stack (32, 42) of insulating layers 32 and sacrificial material layers 42. The separator trenches 47 can be formed, for example, by application and patterning of a photoresist layer over the topmost insulating layer 32, and transfer of the pattern in the patterned photoresist layer through the topmost insulating layer 32, the upper select gate electrode layer, and the alternating stack (32, 42) to the top surface of the substrate 8 that is located at the bottom of the alternating stack (32, 42). The separator trenches 47 laterally extend along a horizontal direction. In one embodiment, the separator trenches 47 can have a substantially uniform width, and can be parallel among one another. The separator trenches 47 can laterally divide the alternating stack (32, 42) into a plurality of portions. If the select gate electrode layer includes a conductive material, the remaining portions of the select gate electrode layer can constitute an upper select gate electrode 48.

Referring to FIGS. 3A and 3B, each separator trench 47 can be filled with a dielectric material that is different from the second material. The dielectric material that fills the separator trenches 47 is herein referred to as a separator insulating material. For example, the separator insulating material can be undoped silicate glass or doped silicate glass. Excess portions of the separator insulating material can be removed from above the top surface of the alternating stack, for example, by chemical mechanical planarization (CMP), a recess etch, or a combination thereof. Remaining portions of the deposited separator insulating material constitutes separator insulator structures 43, which are separator structures including an insulating material. As used herein, a separator structure refers to a structure that physically separates at least two portions of a material layer. In one embodiment, the separator insulator structures 43 can laterally separate various portions of the alternating stack (32, 42). In one embodiment, the separator insulator structures 43 can laterally separate various portions of the alternating stack (32, 42), the upper select gate electrodes 48, and the topmost insulating layer 32.

Referring to FIGS. 4A and 4B, memory openings 49 can be formed through the topmost insulating layer 32, the upper select gate electrodes 48, and the alternating stack (32, 42) by application of a photoresist layer over the topmost insulating layer 32, lithographic patterning of the photoresist layer, and transfer of the pattern in the photoresist layer through the topmost insulating layer 32, the upper select gate electrodes 48, and the alternating stack (32, 42) by an anisotropic etch such as a reactive ion etch. The photoresist layer can be subsequently removed, for example, by ashing. Each memory opening 49 extends through the insulating cover layer, i.e., the topmost insulating layer 32, and through the upper select gate electrodes 48, and the underlying alternating stack (32, 42) of insulating layers 32 and sacrificial material layers 42. Each memory opening 49 can vertically extend from the top surface of the alternating stack (32, 42) to the top surface of the substrate that is located at the bottom of the alternating stack (32, 42). Each memory opening 49 can be formed through a portion of a separator insulator structure 43. In other words, a memory opening 49 can divide a separator insulator structure 43 into two physically disjoined portions. Each memory opening 49 in the alternating stack (32, 42) can extend through the separator insulating material located in the separator insulator structures 43, and divides a separator insulator structure 43 into two laterally disjoined portions.

Referring to FIGS. 5A-5C, the material layers between each vertically neighboring pairs of insulating layers 32 can be sacrificial material layers 42, and the sacrificial material layers 42 can be selectively etched with respect to the insulating layers 32 from inside each memory opening 49. A lateral recess region 49A is formed at each level of the sacrificial material layers 42 within each memory opening 49. Each lateral recess region 49A is formed at the level of a respective sacrificial material layer 42 through a memory opening 49. Specifically, the lateral recess regions 49A can be formed, for example, by a selective etch process in which the sacrificial material of the sacrificial material layers 42 is etched selective to the insulator material of the insulating layers 32. As used herein, an etch process that etches a first material is "selective" to a second material if the etch rate for the first material is at least twice the etch rate for the second material. The ratio of the etch rate for the first material to the etch rate for the second material is herein referred to as a "selectivity" of the etch process. In one embodiment, the selectivity of the etch process that etches the sacrificial material layers 42 can be greater than 10 with respect to the dielectric materials of the separator insulator structures 43 and the insulating layers 32. Optionally, the selective etch process can be selective to the conductive material of the upper select gate electrodes 48. The selective etch process laterally recesses the sidewalls of the sacrificial material layers 42 farther away from each memory opening 49 than sidewalls of adjoining insulating layers 32. The distance of the lateral recess for the lateral recess regions 49A can be selected such that the lateral recess regions 49A from neighboring memory openings 49 do not merge after termination of the selective etch process. In one embodiment, each lateral recess region 49A can have an annular shape.

Referring to FIGS. 6A-6C, a blocking dielectric layer 52L can be formed in the memory opening 49 by a conformal deposition method such as chemical vapor deposition or atomic layer deposition. The blocking dielectric layer 52L can be a contiguous blocking dielectric layer that covers the hard mask layer 36 and extends into a plurality of memory openings 49 without any hole therein. The blocking dielectric layer 52L can contact the sidewalls of the memory openings 49. Specifically, the blocking dielectric layer 52L can contact the recessed sidewalls of the sacrificial layers 42. The blocking dielectric layer 52L may include one or more dielectric material layers that can function as the dielectric material(s) of a control gate dielectric between the sacrificial layers 42 and a floating gate region to be subsequently formed. The blocking dielectric layer 52L can include silicon oxide, a dielectric metal oxide, a dielectric metal oxynitride, or a combination thereof. In one embodiment, the blocking dielectric layer 52L can include a stack of at least one silicon oxide layer and at least one dielectric metal oxide layer. The blocking dielectric layer 52L can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer 52L can be selected such that the lateral recess regions 49A are not filled by the blocking dielectric layer 52L. The thickness of the blocking dielectric layer 52L can be in a range from 6 nm to 24 nm, although lesser and greater thicknesses can also be employed.

Subsequently, a memory material layer 54L, which can be a charge storage layer, can be deposited on the surfaces of the blocking dielectric layer 52L. The memory material layer 54L can be deposited by a conformal deposition method such as chemical vapor deposition or atomic layer deposition. The memory material layer 54L can be a contiguous memory material layer that overlies a horizontal portion of the blocking dielectric layer 52L and extends into a plurality of memory openings 49 without any hole therein. The memory material layer 54L can include a conductive material or a dielectric material. In one embodiment, the memory material layer 54L can include a floating gate material, which can be a conductive material. In another embodiment, the memory material layer 54L can be a charge trapping dielectric layer such as a silicon nitride layer. The thickness of the memory material layer 54L can be selected such that the lateral recess regions 49A are filled by the memory material layer 52L without completely filling a center portion of each memory opening 49. The thickness of the memory material layer 54L, as measured on vertical surfaces of the blocking dielectric layer 52L outside of the lateral recess regions 49A, can be in a range from 3 nm to 60 nm, although lesser and greater thicknesses can also be employed. Thus, a cavity 49' is present at a center portion of each memory opening 49 after the memory material layer 54L fills the lateral recess regions 49A of the memory opening 49.

In case the memory material layer 54L includes a dielectric charge trapping material, the dielectric charge trapping material can be, for example, silicon nitride. If the memory material layer 54L includes a conductive material, the conductive material can be, for example, doped polysilicon or a metallic material. The memory material layer 54L can be formed as a single floating gate region of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54L may comprise an insulating charge trapping material, such as one or more silicon nitride segments. Alternatively, the memory material layer 54L may comprise conductive nanoparticles such as metal nanoparticles, which can be, for example, ruthenium nanoparticles. The memory material layer 54L can be formed, for example, by chemical vapor deposition (CVD), atomic layer deposition (ALD), physical vapor deposition (PVD), or any suitable deposition technique for the selected material(s) for the floating gate region. The thickness of the memory material layer 54L can be in a range from 2 nm to 20 nm, although lesser and greater thicknesses can also be employed.

Referring to FIGS. 7A-7C, portions of the blocking dielectric layer 52L and the memory material layer 54L that are located outside of the lateral recess regions are removed from within each memory opening 49. Remaining portions of the contiguous blocking dielectric layer 52L constitute blocking dielectrics 52. Remaining portions of the memory material layer 54L constitute sets of pairs of floating gate regions 54, which are multiple sets of at least two charge storage elements. As used herein, a "charge storage element" refers to a physical structure configured to store information of a binary bit or a multinary bit (such as a ternary bit, a quaternary bit, etc.). The physical structure configured to store information may be a portion of a memory material layer or a floating gate structure. In one embodiment, each portion of the memory material layer 54L configured to store one binary bit of information can be a charge storage element. Specifically, the portions of the blocking dielectric layer 52L and the memory material layer 54L that do not underlie the topmost insulating layer 32 can be removed by an etch process, which can be an anisotropic etch, an isotropic etch, or a combination of an anisotropic etch and an isotropic etch. The cavity 49' within each memory opening expands by the volume of the removed portions of the blocking dielectric layer 52L and the memory material layer 54L so that the volume of the cavity 49' is equal to, or greater than, the original volume of the memory opening 49 as formed at the processing steps of FIGS. 4A and 4B. The sidewall surfaces of the insulating layers 32 and the upper select gate electrodes 48 can be physically exposed after the etch process.

Each remaining portion of the blocking dielectric layer 52L constitutes a blocking dielectric 52. Each remaining portion of the memory material layer 54L constitutes a floating gate region 54. A pair of mutually disjoined blocking dielectrics 52 is present at each level of a memory opening. A pair of mutually disjoined floating gate regions 54 is present at each level of the memory opening. Each blocking dielectric 52 contacts sidewall surfaces of two separator insulator structures 43. Each floating gate region 54 is spaced from the separator insulator structures 43 by a blocking dielectric 52. Each blocking dielectric 52 can have a convex outer surface and a concave inner surface. Surfaces of each blocking dielectric 52 are physically exposed to a cavity 49'. The blocking dielectrics 52 are formed in the lateral recess regions 49A of through the memory opening. In one embodiment, the floating gate regions 54 can be a plurality of floating gates. Each pair of floating gate regions 54 at a level within a memory opening constitutes a set of at least two charge storage elements that are present within each lateral recess region 49A.

Referring to FIGS. 8A-8C, a tunnel dielectric 56 and a first semiconductor channel portion 601 can be formed within each cavity 49'. The first semiconductor channel portions 601 can include a doped semiconductor material or an undoped semiconductor material. For example, each first semiconductor channel portions 601 can be a doped polysilicon portion or an undoped polysilicon portion. An anisotropic etch can be performed. A top surface of the substrate semiconductor layer 10 can be physically exposed at the bottom of each memory opening 49 after the anisotropic etch. In one embodiment, the floating gate regions 54 can be a plurality of floating gates. In this case, the tunnel dielectric 56 can be formed in the memory opening over the plurality of floating gates.

Each tunnel dielectric 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunnel dielectric 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunnel dielectric 56 can include a stack of a first silicon oxide layer, a silicon oxynitride layer, and a second silicon oxide layer, which is commonly known as an ONO stack. In one embodiment, the tunnel dielectric 56 can include a silicon oxide layer that is substantially free of carbon or a silicon oxynitride layer that is substantially free of carbon. The thickness of the tunnel dielectric 56 can be in a range from 2 nm to 20 nm, although lesser and greater thicknesses can also be employed.

A first semiconductor channel portion 601 can be formed within each memory hole. Each first semiconductor channel portion 601 can be formed on inner sidewalls of each memory film 50 by deposition of a semiconductor material layer and a subsequent anisotropic etch of the semiconductor material layer. The first semiconductor channel portions 601 can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature. A top surface of the substrate semiconductor layer 10 can be physically exposed at the bottom of each memory opening.

Referring to FIGS. 9A-9C, a second semiconductor channel layer and an optional dielectric material layer can be sequentially deposited in the memory openings 49 and over the topmost insulating layer 32. The second semiconductor channel layer can be a doped semiconductor material layer or an undoped semiconductor material layer. For example, the second semiconductor channel layer can be a doped polysilicon layer or an undoped polysilicon layer. In one embodiment, the second semiconductor channel layer does not completely fill the cavity in each memory opening 49. In another embodiment, the second semiconductor channel layer completely fills the cavities in the memory openings 49.

If the memory openings 49 are not completely filled, the dielectric material layer can be deposited to fill the memory openings 49. The portions of the second semiconductor channel layer and the optional dielectric material layer located above the top surface of the topmost insulating layer 32 can be removed, for example, by chemical mechanical planarization, a recess etch, or a combination thereof. Each remaining portion of the second semiconductor channel layer constitutes a second semiconductor channel portion 602. Each adjoining pair of a first semiconductor channel portion 601 and a second semiconductor channel portion 602 collectively constitutes a semiconductor channel 60, which may optionally further include a horizontal top portion of the substrate semiconductor layer 10. Each remaining portion of the dielectric material layer, if employed, constitutes a dielectric core 62.

Subsequently, the second material of the sacrificial material layers 42 can be removed selective to the first material of the insulating layers 32 to form conductive electrodes 46, and optionally lower select gate electrodes (not shown). For example, back side trenches can be formed through the topmost insulating layer 32, the upper select gate electrodes 48, and the alternating stack (32, 42) to the top surface of the substrate semiconductor layer 10. In one embodiment, each back side trench can be formed in a same configuration as the back side trench of FIG. 1 within which a combination of a backside contact via structure 76 and a dielectric spacer 74 is formed.

Figure 10:
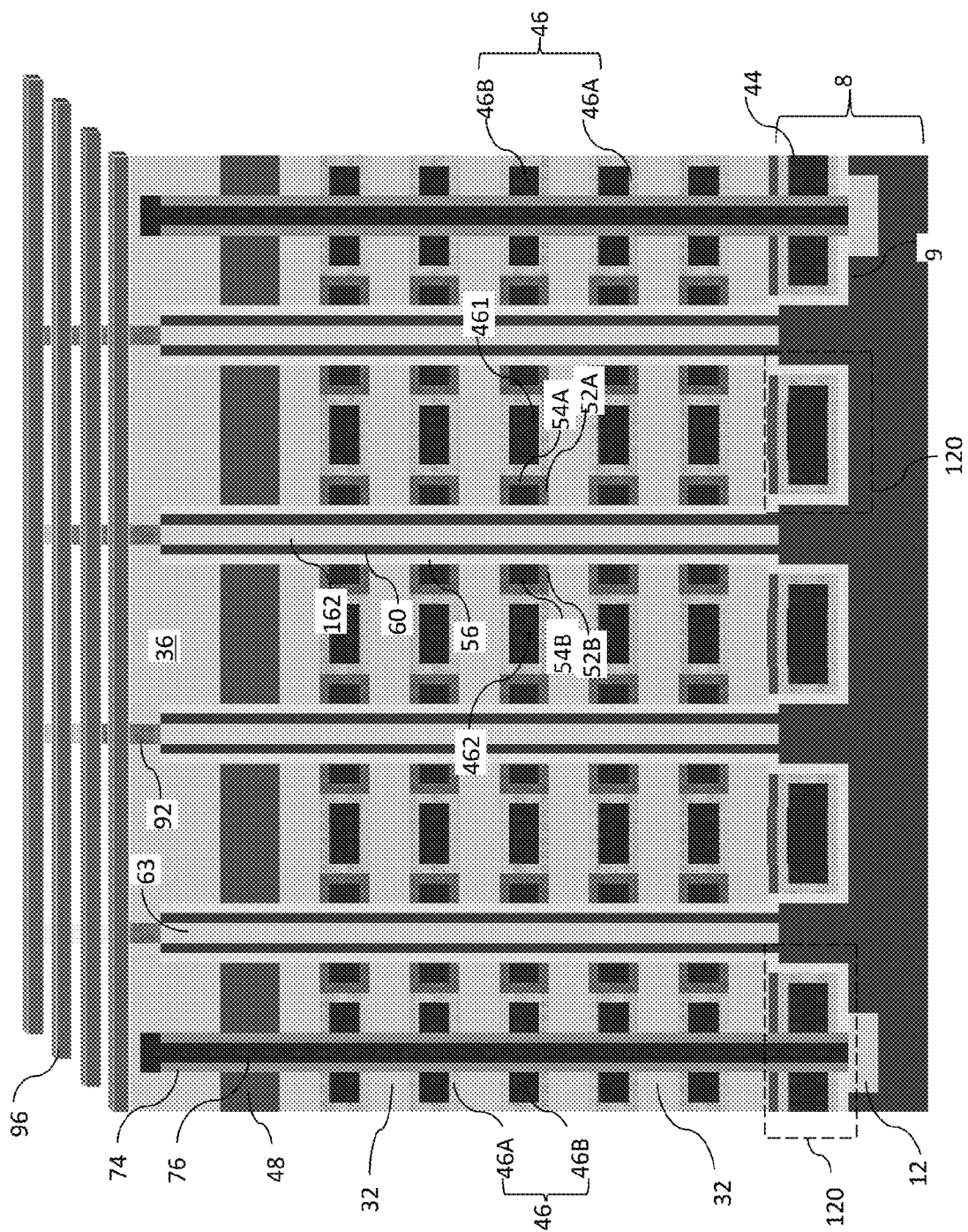
FIG. 10 is a vertical cross-sectional view of the first exemplary device structure after formation of bit lines according to the first embodiment of the present disclosure.

Referring to FIG. 10, the second material of the sacrificial material layers 42 can be removed selective to the first material of the insulating layers 32 to form conductive electrodes 46. Back side trenches can be employed to introduce the etchants to the various levels in which the sacrificial material layers 42 are present. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. An etchant that removes the second material of the sacrificial material layers 42 selective to the first material of the insulating layers 32 can be introduced through the back side trenches to laterally etch the second material of the sacrificial material layers 42 and to form back side recesses. For example, the sacrificial material layers 42 can be removed through the back side trenches to form respective back side recesses. Lower select gate back side recesses can be formed in volumes from which the bottommost sacrificial material layer 42 is removed. Subsequently, the back side recesses can be filled with a conductive material, for example, by chemical vapor deposition to form the conductive electrodes 46, drain-side select gate electrodes 48, and source-side select gate electrodes 44. Each portion of the sacrificial material layers 42 can be replaced with a conductive electrode 46, which can include, for example, an optional conductive liner 46A (including, for example, titanium nitride) and a conductive fill material portion 46B (including, for example, tungsten).

A drain region 63 can be formed at a top end of each combination of a memory film 50 and a semiconductor channel 60. Contact via structures 92 can be formed on each drain region 63, and bit lines 96 can be formed directly on the contact via structures 92 to access the drain regions 63. A pair of semiconductor channels 60 can be formed in each memory opening over at least a portion of the pair of memory films 50. Source-side select transistors 120 may be provided in the first exemplary device structure.

A pair of laterally separated stacks (52, 54) is formed. Each laterally separated stack includes a blocking dielectric 52 and a floating gate region 54. A tunneling dielectric 56 contacts a pair of laterally separated stacks (52, 54), and laterally surround a common semiconductor channel 60.

In one embodiment, a first portion of the memory film 50 can comprises a first blocking dielectric 52A and a first floating gate region 54A which are located in a recess in the first portion of the stack. The first portion of the memory film 50 can further comprise a first portion of a tunnel dielectric 56. The second portion of the memory film 50 can comprise a second blocking dielectric 52B and a second floating gate region 54B which are located in a recess in the second portion of the stack. The second portion of the memory film 50 further comprises a second portion of the tunnel dielectric 56. The first portion of the tunnel dielectric 56 and the second portion of the tunnel dielectric 56 are located within the same tunnel dielectric 56, which is a contiguous structure that is topologically homeomorphic to a torus. As used herein, an element is homeomorphic to a torus if the element can be continuously stretched or contracted to the torus without creating a new hole or destroying an existing hole. The tunnel dielectric 56 laterally surrounds at least a portion of a semiconductor channel 60. If a dielectric core 62 is present, the semiconductor channel 60 laterally surrounds the dielectric core 62.

In one embodiment, each of the first floating gate region 54A and the second floating gate region 54B can be a floating gate dielectric. In another embodiment, each of the first floating gate region 54A and the second floating gate region 54B can be a charge trapping dielectric.

Referring to FIGS. 9A-9C and 10, the first exemplary structure can comprise a device structure, which comprises a stack of alternating layers comprising insulating layers 32 and electrically conductive layers 46 and located over a substrate 8, a memory stack structure 55 located within a memory opening extending through the stack, and a semiconductor channel 60 having a vertical portion that extends along a direction perpendicular to a top surface of the substrate 8. The memory stack structure 55 comprises multiple sets of at least two charge storage elements (54A, 54B) located around the semiconductor channel 60 at each level of the electrically conductive layers 46. Each set of at least two charge storage elements (54A, 54B) comprises charge storage elements (54A, 54B) that are located at a same level as a respective electrically conductive layer 46, and are electrically isolated from one another, electrically isolated from the semiconductor channel 60 by at least one respective tunneling dielectric 56, and electrically isolated from respective control gate electrodes (as embodied by the respective electrically conductive layer 46 located at the same level) thereof by at least one respective blocking dielectric (52A, 52B). In one embodiment, the device structure comprises separator insulator structures 43 extending through the stack, contacting portions of an outer sidewall of the memory stack structure 55, and laterally separating the control gate electrodes 46 of the plurality of charge storage elements (54A, 54B).

Each memory stack structure 55 can be located in a memory opening 49 that includes a lateral recess region 49A at each level of the electrically conductive layers 46. Each set of at least two charge storage elements 54 can be located within a respective lateral recess region 49A. In one embodiment, each set of at least two charge storage elements 54 comprises at least two floating gate regions 54 that are physically disjoined from one another. In one embodiment, the separator insulator structures 43 extend through the stack and laterally separate control gate electrodes (embodied as physically disjoined portions of the electrically conductive layers 46) of the plurality of charge storage elements 54. The semiconductor channel 60 can be laterally spaced from the separator insulator structures 43 by a tunneling dielectric 56 at each level of the electrically conductive layer 46 and the insulating layers 32. In one embodiment, a sidewall of each separator structure (i.e., each separator insulator structure 43) is more proximal to the semiconductor channel 60 than outer sidewalls of the at least one blocking dielectric 52 within the same memory opening is to the semiconductor channel 60.

In one embodiment, the at least one respective tunneling dielectric 56 can be a single contiguous tunneling dielectric that laterally surrounds the semiconductor channel 60 and is located at the level of the respective electrically conductive layer 46. In one embodiment, the at least one respective blocking dielectric 52 can be a single contiguous blocking dielectric that contacts outer sidewalls of the respective single contiguous tunneling dielectric 56.

The first exemplary structure can comprise a device structure, which comprises an alternating stack of insulating layers 32 and patterned electrically conductive layers 46 located over a substrate 8, and a first pair (e.g., the left side pair in FIG. 9C) of memory stack structures 55A and a second pair (e.g., the right side pair in FIG. 9C) of memory stack structures 55B. Each memory stack structure 55 comprises a plurality of memory cells 54 arranged in a string extending in a first direction substantially perpendicular to the major surface 9 of the substrate 8 in a plurality of device levels. Each of the plurality of memory cells 54 is positioned in a respective one of the plurality of device levels above the substrate 8. A semiconductor channel 60 extends through all levels within the plurality of device levels in each memory stack structure 55. The memory device further comprises a first separator insulator structure 43A vertically extending through the stack and contacting the first pair of memory stack structures 55A, and a second separator insulator structure 43B vertically extending through the stack and contacting the second pair of memory stack structures 55B. First control gate electrodes 461 (embodied as portions of each electrically conductive layer 46 located between the first and second separator insulator structures 43) within the patterned electrically conductive layers 46 contact the first and the second separator insulator structures 43, a first side of each memory stack structure within the first pair of memory stack structures 55A, and a first side of each memory stack structure within the second pair of memory stack structures 55B.

In one embodiment, each set of at least two charge storage elements 54 can comprise charge storage elements that are located at the same level as a respective electrically conductive layer 46, and are electrically isolated from one another, from the semiconductor channel 60 by at least one respective tunneling dielectric 60, and from respective control gate electrodes thereof by at least one respective blocking dielectric 52.

Figure 11:
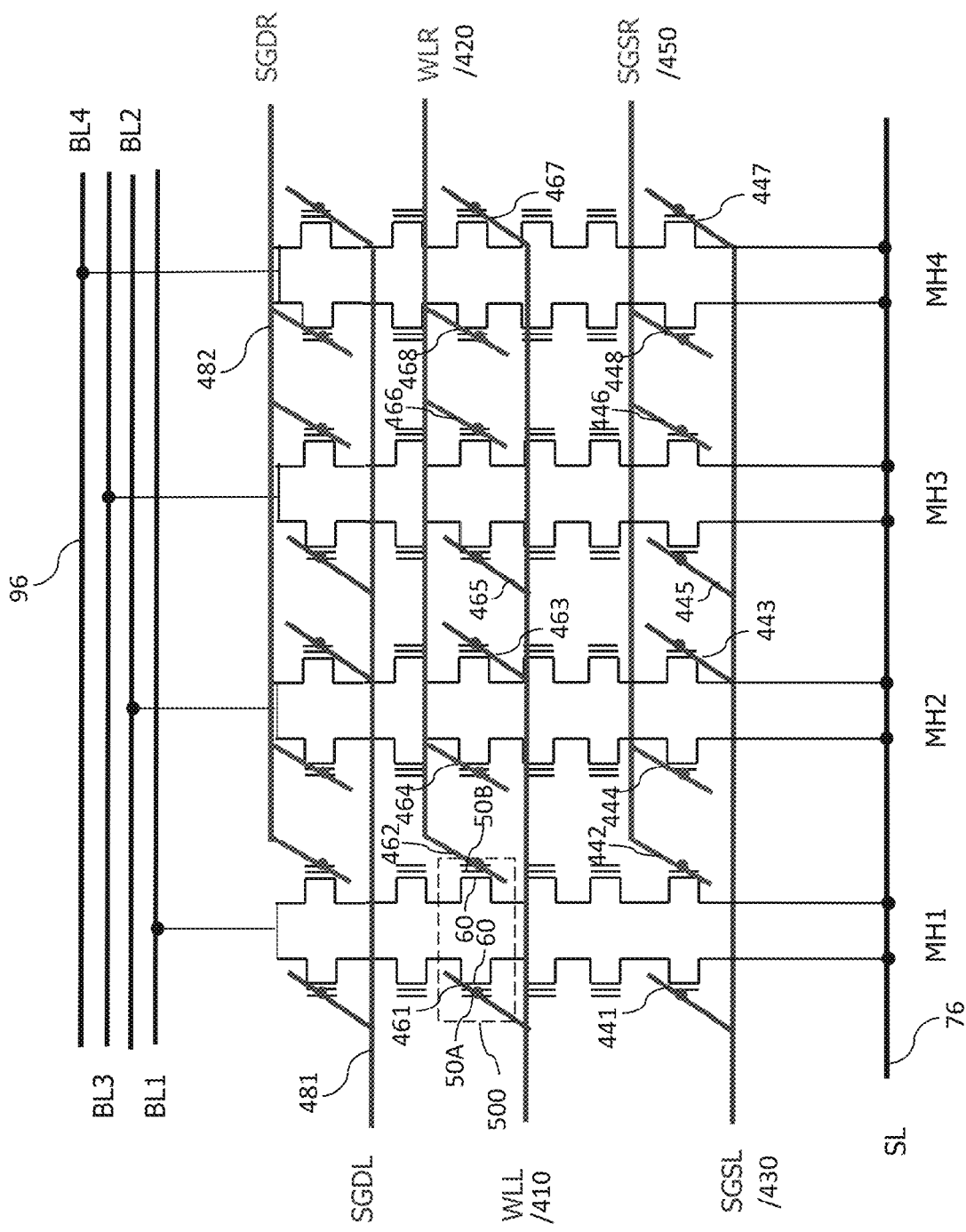
FIG. 11 is a circuit schematic for the array region of the first exemplary device structure.

Referring to FIG. 11, a circuit schematic is shown, which can be a circuit schematic of the array region of any of the exemplary device structure of the present disclosure. The circuit schematic represents a plurality of NAND strings. Each NAND string comprises a plurality of memory cells. Each memory cell in the NAND string comprises a portion of a first control gate electrode 461 (See FIG. 10) located adjacent to a first portion 50A of a memory film 50 and a portion of a second control gate electrode 462 which is located adjacent to a second portion 50B of the memory film 50. The second control gate electrode 462 is electrically insulated from the first control gate electrode 461.

Referring to FIGS. 10 and 11 collectively, the NAND memory device can comprise a substrate 8 having a major surface 9. The first plurality of memory cells are arranged in the first NAND string extending in a first direction substantially perpendicular to the major surface 9 of the substrate 8 in a plurality of device levels. Each of the first plurality of memory cells is positioned in a respective one of the plurality of device levels above the substrate 8. At least one first select gate electrode, e.g., a lower select gate electrode, can be located between the major surface 9 of the substrate 8 and the first plurality of memory cells, and at least one second select gate electrode, e.g., an upper select gate electrode 48, is located above the first plurality of memory cells. The first control gate electrode 461 extends in a second direction substantially parallel to the major surface 9, and the first control gate electrode 462 extends in the second direction and spaced apart from the respective first control gate electrode 461 in a third direction substantially parallel to the major surface 9 and transverse to the second direction. Each memory cell can comprise a first portion 50A of a memory film 50 which is located between the first control gate electrode 461 and a first portion of a semiconductor channel 60, and a second portion 50B of the memory film 50 which is located between the first control gate electrode 462 and a second portion of the semiconductor channel 60.

Thus, each memory cell of this embodiment includes a unitary portion (i.e., electrically continuous, single portion) of the semiconductor channel 60; the first memory film portion 50A, the second memory film portion 50B, at least a portion of a first control gate electrode 461 located adjacent to the first memory film portion 50A, and at least a portion of a first control gate electrode 462 located adjacent to the second memory film portion 50B. The first control gate electrode 462 is electrically isolated from the first control gate electrode 461 and the first memory film. In other words, the memory cell of this embodiment includes a common channel and separate floating gate regions and control gate electrodes in the same horizontal device level.

A first word line can comprise a comb shaped word line WLL/410 having a terrace contact portion (not shown) located in the first stepped contact region (not shown) and a plurality of prongs (461, 463, 465, 467) extending from a terrace contact portion into the device region. The second word line can comprise a comb shaped word line WLR/420 having a terrace contact portion (not shown) located in the second stepped contact region (not shown) and a plurality of prongs (462, 464, 466, 468) extending from the terrace contact portion into the device region.

In a non-limiting illustrative example, a read operation of on a memory cell in a memory opening (e.g., MH1, MH2, MH3, MH4) can be performed by applying a voltage of about 5-7 V to a selected upper select gate electrode (e.g., SGDL/481), a voltage of about 0 V to an unselected upper select gate electrode (e.g., SGDR/482), a selected-line read voltage of about 3-5 V to a selected word line (e.g., WLL/410) connected to the selected control gate electrode (e.g., a first control gate electrode 461), and an unselected-line read voltage of about 7-8 V to unselected word lines (e.g., WLR/420) connected to unselected control gate electrodes, negative 3-5V to second control gate electrode 462 in same level/cell as selected control gate electrode. A voltage of about 5-7 V can be applied to the selected lower select gate electrode (e.g., SGSL/430), and a voltage of about 0 V can be applied to the unselected lower select gate electrode (e.g., SGSR/450) connected to the same memory stack structure 55 (See FIG. 1). A voltage of about 1-2 V can be applied to the selected bit line (e.g., BL1), and a voltage of about 0 V can be applied to the unselected bit lines (e.g., BL2, BL3, BL4). The source line SL/76, which can be embodied as a backside contact via structure 76, can be biased at about 0-1 V. The various voltages can be scaled and/or adjusted as needed.

In a non-limiting illustrative example, a programming operation of on a memory cell can be performed by applying a voltage of about 2-3 V to a selected upper select gate electrode (e.g., SGDL/481), a voltage of about 0 V to an selected upper select gate electrode (e.g., SGDR/482), a selected-line programming voltage of about 18-20 V to a selected word line (e.g., WLL/410) connected to the selected control gate electrode (e.g., a first control gate electrode 461), and an unselected programming voltage of about 7-9 V to unselected word lines (e.g., WLR/420) connected to unselected control gate electrodes. A voltage of about 0 V can be applied to the selected lower select gate electrode (e.g., SGSL/430), and a voltage of about 0 V can be applied to unselected lower select gate electrodes SGSR/450. A voltage of about 0 V can be applied to the selected bit line (e.g., BL1), and a voltage of about 2-3 V can be applied to the unselected bit lines (e.g., BL2, BL3, BL4). The source line SL can be biased at about 1-3 V. During the erase operation, the selected upper and lower select gate electrodes may be biased to 10-12 V, the selected bit line and source line may be biased to 18-20V and the rest of the lines and electrodes are unbiased (e.g., about 0V).

Figure 12A:
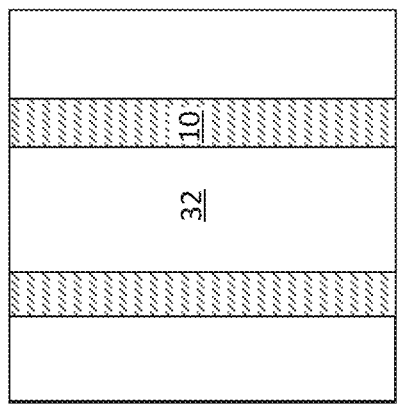
FIG. 12A is a top-down view of an array region of a second exemplary device structure after formation of laterally-extending trenches according to the second embodiment of the present disclosure.
Figure 12B:
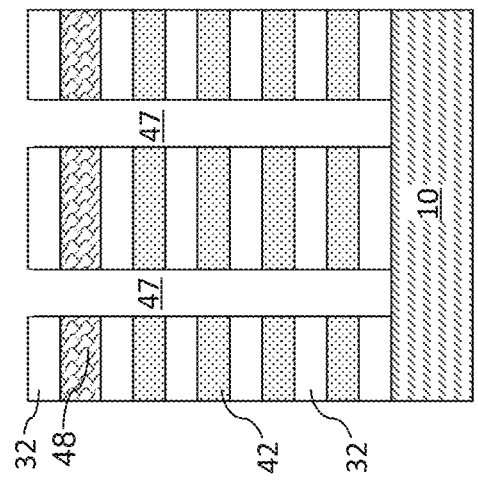
FIG. 12B is a vertical cross-sectional view of the second exemplary device structure of FIG. 12A.

Referring to FIGS. 12A and 12B, a cut-out portion of an array region of a second exemplary device structure is illustrated according to a second embodiment of the present disclosure is illustrated. The cut-out portion can be embedded within the exemplary device structure of FIG. 1. An alternating stack (32, 42) of insulating layers 32 and sacrificial material layers 42 is formed over a substrate 8. The alternating stack (32, 42) can be the same as in the first embodiment.

An upper select gate electrode layer and another insulating layer 32 can be sequentially formed. The upper select gate electrode layer can be another sacrificial material layer 42, or can be a conductive material layer including a conductive material such as doped polysilicon. Separator trenches 47 can be formed through the topmost insulating layer 32, the upper select gate electrode layer, and the alternating stack (32, 42) of insulating layers 32 and sacrificial material layers 42. The separator trenches 47 can be formed, for example, by application and patterning of a photoresist layer over the topmost insulating layer 32, and transfer of the pattern in the patterned photoresist layer through the topmost insulating layer 32, the upper select gate electrode layer, and the alternating stack (32, 42) to the top surface of the substrate 8 that is located at the bottom of the alternating stack (32, 42). The separator trenches 47 laterally extend along a horizontal direction. In one embodiment, the separator trenches 47 can have a substantially uniform width, and can be parallel among one another. The separator trenches 47 can laterally divide the alternating stack (32, 42) into a plurality of portions. If the select gate electrode layer includes a conductive material, the remaining portions of the select gate electrode layer can constitute an upper select gate electrode 48. The pattern of the separator trenches 47 can be the same as the pattern of the separator insulator structures 43 illustrated in FIG. 19, which is a horizontal cross-sectional view of the second exemplary device structure.

Figure 13A:
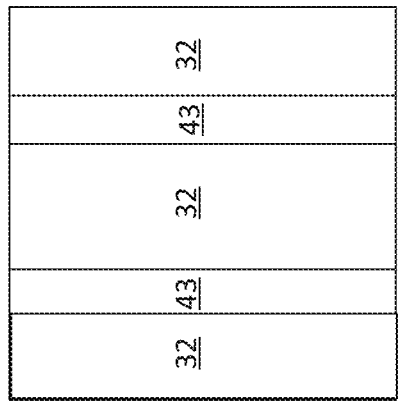
FIG. 13A is a top-down view of the array region of the second exemplary device structure after formation of separator insulator structures according to a second embodiment of the present disclosure.
Figure 13B:
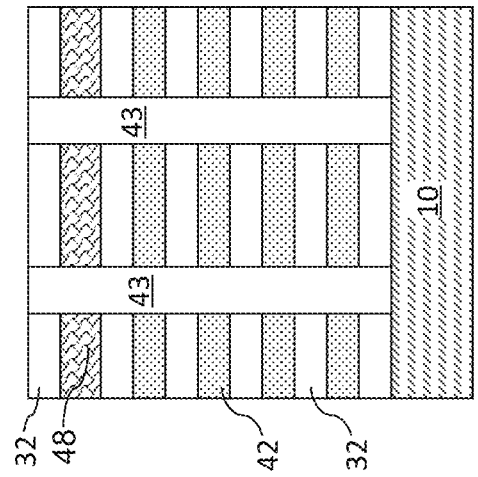
FIG. 13B is a vertical cross-sectional view of the second exemplary device structure of FIG. 13A.

Referring to FIGS. 13A and 13B, each separator trench 47 can be filled with a dielectric material that is different from the second material. The dielectric material that fills the separator trenches 47 is herein referred to as a separator insulating material. For example, the separator insulating material can be undoped silicate glass or doped silicate glass. Excess portions of the separator insulating material can be removed from above the top surface of the alternating stack, for example, by chemical mechanical planarization (CMP), a recess etch, or a combination thereof. Remaining portions of the deposited separator insulating material constitutes separator insulator structures 43. In one embodiment, the separator insulator structures 43 can laterally separate various portions of the alternating stack (32, 42).

Referring to FIGS. 14A and 14B, memory openings 49 can be formed through the topmost insulating layer 32, the upper select gate electrodes 48, and the alternating stack (32, 42) by application of a photoresist layer over the topmost insulating layer 32, lithographic patterning of the photoresist layer, and transfer of the pattern in the photoresist layer through the topmost insulating layer 32, the upper select gate electrodes 48, and the alternating stack (32, 42) by an anisotropic etch such as a reactive ion etch. The photoresist layer can be subsequently removed, for example, by ashing. Each memory opening 49 extends through the insulating cover layer, i.e., the topmost insulating layer 32, and through the upper select gate electrodes 48, and the underlying alternating stack (32, 42) of insulating layers 32 and sacrificial material layers 42. Each memory opening 49 can vertically extend from the top surface of the alternating stack (32, 42) to the top surface of the substrate that is located at the bottom of the alternating stack (32, 42). Each memory opening 49 can be located between a pair of inter-electrode insulator structures 31 and through a portion of a separator insulator structure 43. In other words, a memory opening 49 can divide a separator insulator structure 43 into two physically disjoined portions. Each memory opening 49 in the alternating stack (32, 42) can extend through the separator insulating material located in the separator insulator structures 43, and divides a separator insulator structure 43 into two laterally disjoined portions.

Referring to FIGS. 15A and 15B, a memory film 50 is formed in each memory opening 49. Each memory film 50 can include a blocking dielectric layer 52L, a memory material layer 54L, and a tunneling dielectric 56. Each memory film 50 can be formed as a contiguous memory film on a substantially vertical sidewall of a memory opening 49. A blocking dielectric 52, a memory material layer 54L, a tunnel dielectric 56, and a first semiconductor channel portion 601 can be sequentially formed. Each of the blocking dielectric 52, the memory material layer 54L, and the tunnel dielectric 56 can be the same as in the first embodiment. In one embodiment, the memory material layer 54L can comprises a charge trapping dielectric layer. The first semiconductor channel portion 601 can be a first material portion employed to form a semiconductor channel 60 (See FIG. 1).

Each stack of a blocking dielectric layer 52L, a memory material layer 54L, a tunnel dielectric 56, and a first semiconductor channel layer 601 can be formed, for example, by depositing, and subsequently anisotropically etching, a stack including a blocking dielectric layer, a charge storage material layer, a tunnel dielectric layer, and a first semiconductor channel layer. The first semiconductor channel layer can be a doped semiconductor material layer or an undoped semiconductor material layer. For example, the first semiconductor channel layer can be a doped polysilicon layer or an undoped polysilicon layer. A top surface of the substrate semiconductor layer 10 can be physically exposed at the bottom of each memory opening 49 after the anisotropic etch. A cavity 49', which is herein referred to as a memory cavity, is formed within the unfilled volume of each memory opening 49.

Figure 16A:
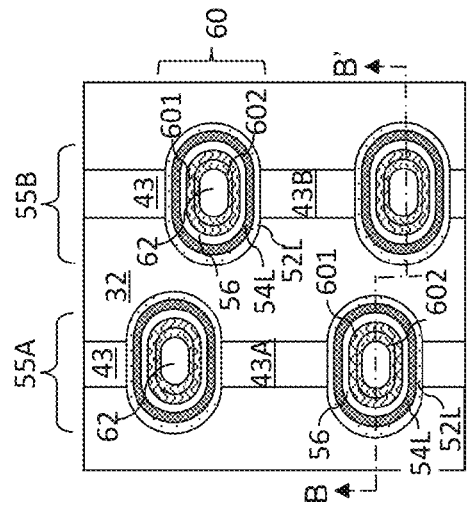
FIG. 16A is a top-down view of the array region of the second exemplary device structure after formation of blocking dielectrics, charge storage material layers, tunnel dielectrics, and first semiconductor channels according to the second embodiment of the present disclosure.
Figure 16B:
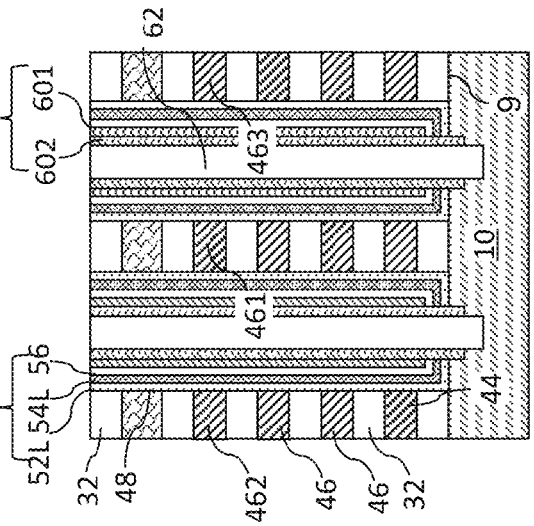
FIG. 16B is a vertical cross-sectional view of the second exemplary device structure along the vertical plane B-B' of FIG. 16A.

Referring to FIGS. 16A and 16B, a second semiconductor channel layer can be deposited on the physically exposed top surfaces of the substrate semiconductor layer 10 and sidewalls of the first semiconductor channel portions 601 and over the topmost insulating layer 32. The second semiconductor channel layer can be a doped semiconductor material layer or an undoped semiconductor material layer. For example, the second semiconductor channel layer can be a doped polysilicon layer or an undoped polysilicon layer. In one embodiment, the second semiconductor channel layer does not completely fill the cavity in each memory opening. The remaining cavity in each memory hole is herein referred to as a core cavity. In another embodiment, the second semiconductor channel layer completely fills the cavities 49' in the memory openings 49.

A dielectric core 62 can be formed within each core cavity, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack (32, 42). The planarization of the dielectric material can be performed, for example, by chemical mechanical planarization. The top portion of the second semiconductor channel layer can be removed during the planarization process. Each remaining portion of the second semiconductor channel layer constitutes a second semiconductor channel portion 602. Each adjoining pair of a first semiconductor channel portion 601 and a second semiconductor channel portion 602 can be a portion of a semiconductor channel, which may optionally further include a horizontal top portion of the substrate semiconductor layer 10. Each remaining portion of the dielectric material inside a memory opening constitutes a dielectric core 62. A combination of a dielectric core 62, a semiconductor channel 60, and a memory film 50 may completely fill the volume of a memory opening as formed at the processing step of FIGS. 14A and 14B.

Figure 17A:
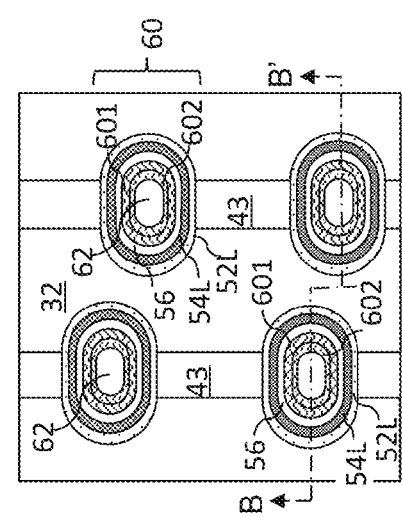
FIG. 17A is a top-down view of the array region of the second exemplary device structure after formation of second semiconductor channels and dielectric cores according to the second embodiment of the present disclosure.
Figure 17B:
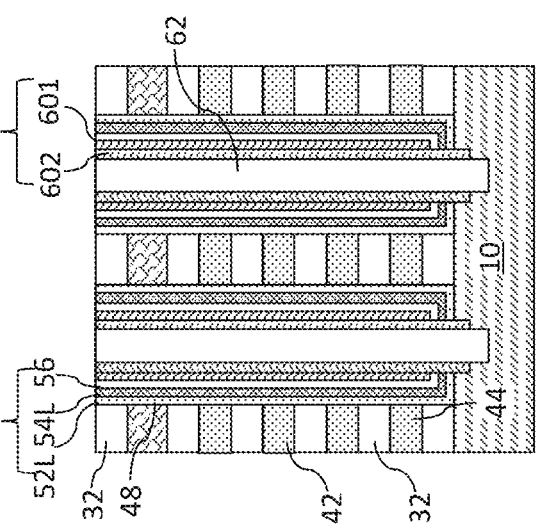
FIG. 17B is a vertical cross-sectional view of the second exemplary device structure along the vertical plane B-B' of FIG. 17A.

Referring to FIGS. 17A and 17B, the sacrificial material layers 42 are etched selective to the dielectric materials of the insulating layers 32 and the separator insulator structures 43 employing the same methods as in the first embodiment. In one embodiment, the selectivity of the etch process with respect to the dielectric materials of the insulating layers 32 and the separator insulator structures 43 can be greater than 10. In one embodiment, the sacrificial material layers 42 can include silicon nitride, and the insulating layers 32 and the separator insulator structures 43 can include silicon oxide. Lateral recesses, which are referred to as backside recesses, are formed in volumes from which the material of the sacrificial material layers 42 is removed. The backside recesses adjoin the backside contact trenches. A conductive material is deposited in the backside recesses by a conformal deposition method such as chemical vapor deposition. Portions of the conductive material that are deposited in the memory holes 49 and over the topmost insulating layer 32 are removed, for example, by an etch back process, which can include an isotropic etch or an anisotropic etch. Remaining portions of the deposited conductive material within the volumes of the sacrificial material layers 42 constitute conductive structures, which can include electrically conductive layers 46 and lower-level select gate electrodes 44. The lower-gate select gate electrodes 44 can be formed at the level of one or more bottom sacrificial material layers 42, and the electrically conductive layers 46 can be formed in the levels of sacrificial material layers 42 other than the one or more bottom sacrificial material layers 42.

The separator insulating material of the separator insulator structures 43 electrically insulates each first electrically conductive control gate layer from a respective second electrically conductive control gate layer located in a same device level. A backside contact via structure 76 (See FIG. 1) can be formed through the alternating stack (32, 46). At each level of the electrically conductive layers 46, a first charge storage element and a second charge storage element that is electrically isolated from the first charge storage element is provided. Each pair of a first and second charge storage elements located at the same level can be two spatially spaced-apart portions within a same memory material layer 54L.

Figure 18:
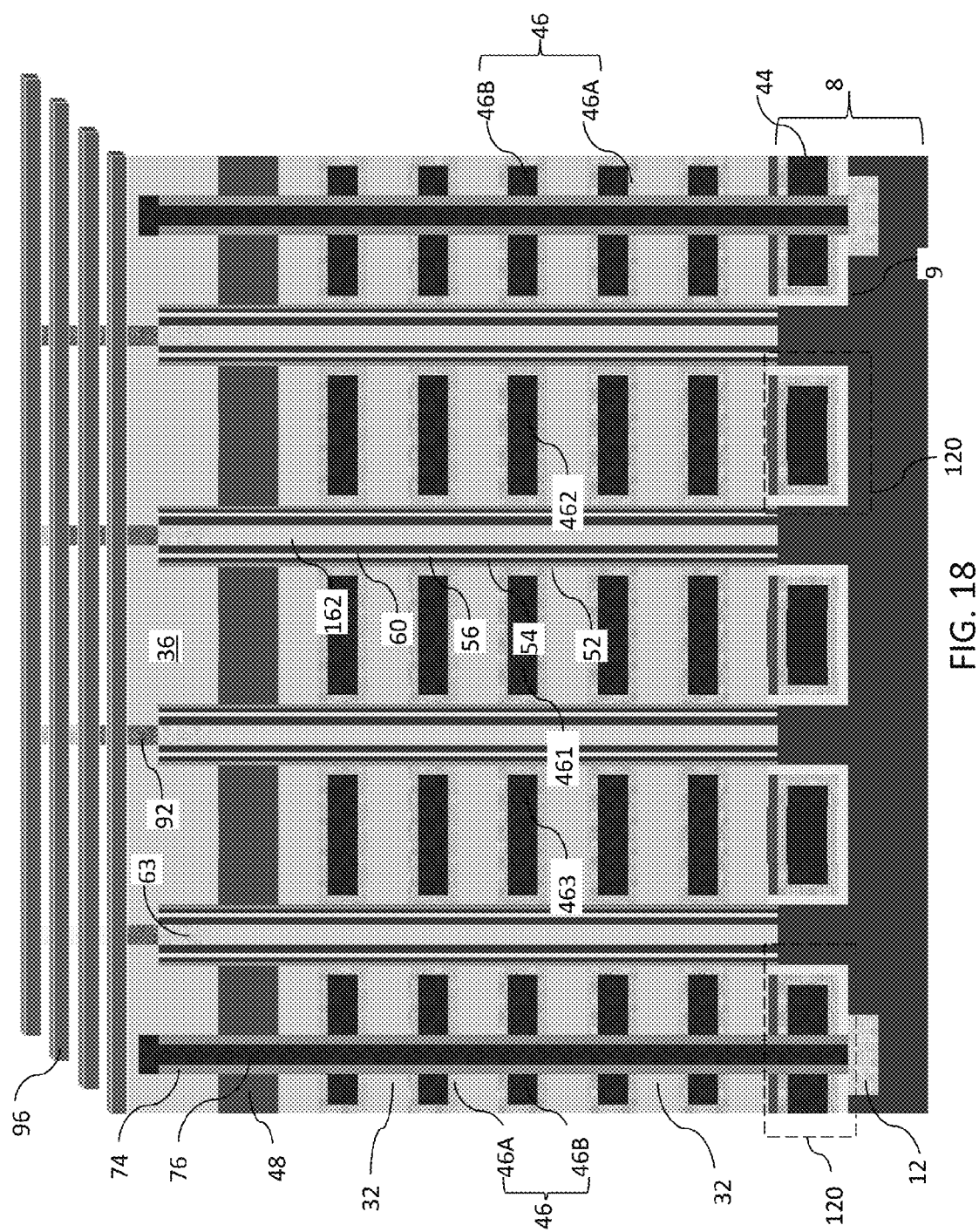
FIG. 18 is a vertical cross-sectional view of the second exemplary device structure after formation of bit lines according to the second embodiment of the present disclosure.

The second exemplary device structure of FIGS. 17A and 17B can be incorporated into the exemplary device structure of FIG. 1 or derivatives therefrom. FIG. 18 illustrates the second exemplary device structure upon such incorporation. Each portion of the sacrificial material layers 42 can be replaced with a conductive electrode 46, which can include, for example, an optional conductive liner 46A (including, for example, titanium nitride) and a conductive fill material portion 46B (including, for example, tungsten). A drain region 63 can be formed at a top end of each combination of a memory film 50 and a semiconductor channel 60. Contact via structures 92 can be formed on each drain region 63, and bit lines 96 can be formed directly on the contact via structures 92 to access the drain regions 63. A pair of semiconductor channels 60 can be formed in each memory opening over at least a portion of the pair of memory films 50.

Figure 19:
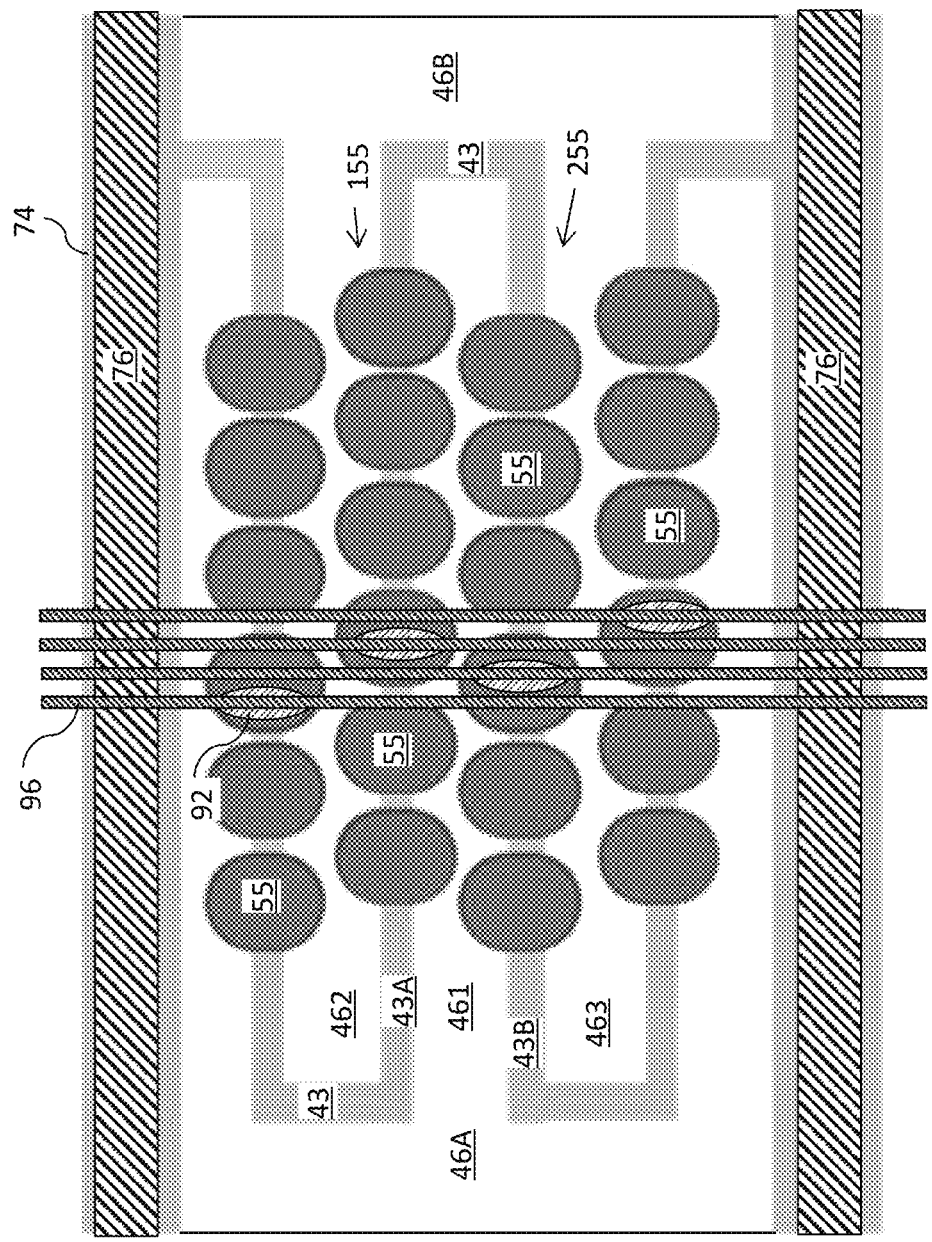
FIG. 19 is a see-through top-down view of the second exemplary device structure that illustrates global shapes of various components of the second exemplary device structure according to the second embodiment of the present disclosure.
Figure 20:
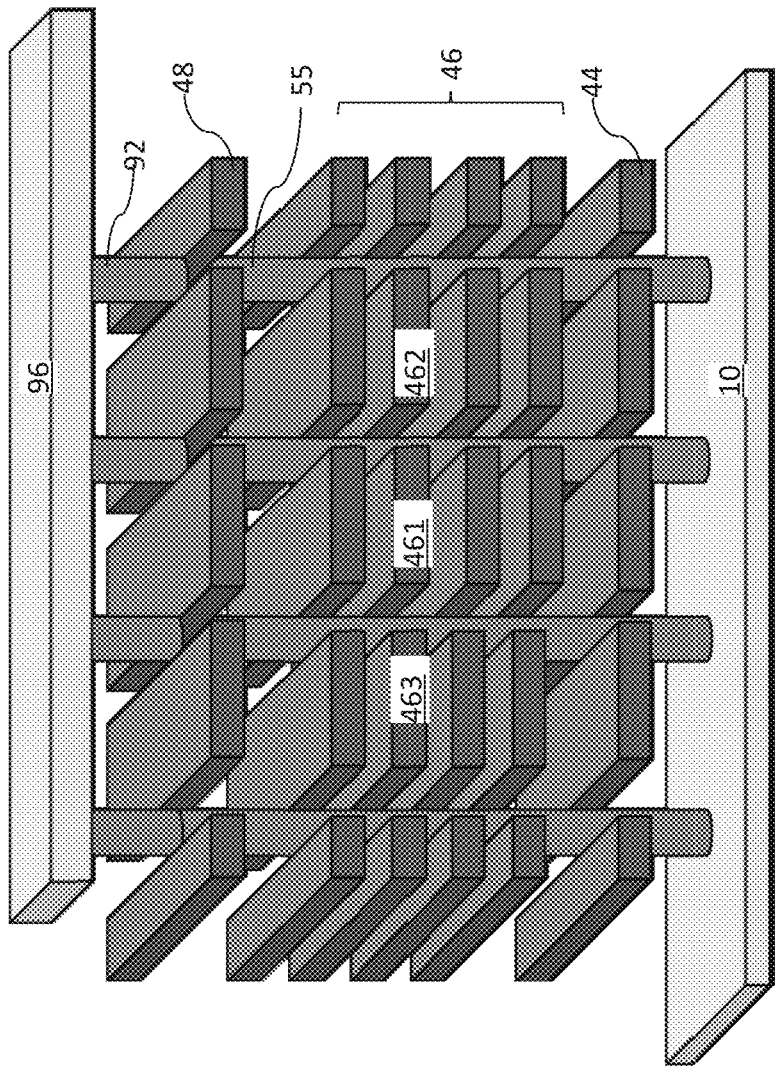
FIG. 20 is a perspective view of an array region of the second exemplary device structure according to the second embodiment of the present disclosure.

An exemplary layout of the various elements is illustrated in FIGS. 19 and 20. FIG. 19 is a see-through top-down view in which dielectric material layers overlying the topmost surface of the memory stack structures 55 have been omitted for clarity. FIG. 20 is a bird's eye view of a cut-out portion of a NAND memory structure in which dielectric material layers are not shown for clarity.

A first row 155 and second row 255 of memory stack structures 55 extend through the respective first and second separator insulator structures (43A, 43B). A continuous first control gate electrode 461 extends between the first 43A and the second 43B separator structures. Control gate electrode 461 is located adjacent to a first (right) side of the first separator structure 43A, adjacent to a first (right) side of the first row 155 of the memory stack structures, adjacent to a first (left) side of the second separator structure 43B, and adjacent to a first (left) side of the second row 255 of the memory stack structures.

A second control gate electrode 462 is located adjacent to a second (left) side of the first separator structure 43A, and adjacent to the second (left) side of the first row 155 of the memory stack structures. A third control gate electrode 463 is located adjacent to a second (right) side of the second row 255 of the memory stack structures, and adjacent to a second (right) side of the second separator structure 43B. Electrodes 462 and 463 may comprise finger portions of the same comb shaped word line 46B, while electrode 461 may comprise a finger portion of a different comb shaped word line 46A.

Source-side select transistors 120 may be provided in the exemplary device structure. Within each memory opening, a first portion of a memory film 50 located on the first side of the dielectric core 162 is electrically insulated from a second portion of the memory film 50 located on the second side of the dielectric core 162. Within each memory opening, the dielectric core 162 electrically insulates a first portion of the semiconductor channel 60 located on the first side of the dielectric core 162 from a second portion of the semiconductor channel 60 located on the second side of the dielectric core 162.

Referring to FIGS. 17A, 17B, and 18-20, the second exemplary structure can include a memory device, which comprises a stack of alternating layers comprising insulating layers 32 and electrically conductive layers 46 located over a substrate 8, a memory stack structure 55 located within a memory opening extending through the stack, and including semiconductor channel 60 having a vertical portion that extends along a direction perpendicular to a top surface of the substrate 8. The memory stack structure 55 comprises multiple sets of at least two charge storage elements located around the semiconductor channel 60 at each level of the electrically conductive layers 46. Each set of at least two charge storage elements comprises charge storage elements that are located at the same level as a respective electrically conductive layer 46, and are electrically isolated from one another, from the semiconductor channel 60 by at least one respective tunneling dielectric 56, and from respective control gate electrodes (which are adjacent portions of the electrically conductive layers 46) thereof by at least one respective blocking dielectric 52.

The separator insulator structures 43 extend through the stack, contact portions of outer sidewalls of the memory stack structures 55, and laterally separate the control gate electrodes 46 of the plurality of charge storage elements (which are portions of the memory material layer 54L). The patterned electrically conductive layers 46 comprise control gate electrodes of the multiple sets of at least two charge storage elements 54. Each set of at least two charge storage elements comprises two regions within a respective contiguous memory material layer 54L that are adjacent to respective control gate electrodes and located at the same level.

Separator insulator structures 43 can extend through the stack, contact sidewalls of the memory stack structure 55, and laterally separate the control gate electrodes of the plurality of charge storage elements. In one embodiment, the at least one blocking dielectric can be a single contiguous blocking dielectric layer 52L contacting each of the electrically conductive layers 46 and each set of at least two charge storage elements. The at least one respective tunneling dielectric is a single contiguous tunneling dielectric 56 that vertically extends through the stack and laterally surrounds the semiconductor channel 60.

The second exemplary structure can include a memory device, which comprises an alternating stack of insulating layers 32 and patterned electrically conductive layers 46 located over a substrate 8, a first pair (e.g., the left side pair 55A in FIG. 17A) of memory stack structures 55 and a second pair (e.g., the right side pair 55B in FIG. 17A) of memory stack structures 55. Each memory stack structure 55 comprises a plurality of memory cells arranged in a string extending in a first direction substantially perpendicular to the major surface 9 of the substrate 8 in a plurality of device levels. Each of the plurality of memory cells is positioned in a respective one of the plurality of device levels above the substrate 8. A semiconductor channel 60 extends through all levels within the plurality of device levels in each memory stack structure 55. The memory device further comprises a first separator insulator structure 43A vertically extending through the stack and contacting the first pair of memory stack structures 55A, and a second separator insulator structure 43B vertically extending through the stack and contacting the second pair of memory stack structures 55B. First control gate electrodes 461 within the patterned electrically conductive layers 46 contact the first and the second separator insulator structures (43A, 43B), a first side of each memory stack structure within the first pair of memory stack structures 55A, and a first side of each memory stack structure within the second pair of memory stack structures 55B.

Second control gate electrodes 462 within the patterned electrically conductive layers contact a second side of the first separator insulator structure 43A and a second side of the first pair 55A of the memory stack structures, and third control gate electrodes 463 within the patterned electrically conductive layers 46 contact a second side of the second separator insulator structure 43B and a second side of the second pair 55B of the memory stack structures. Each set of at least two charge storage elements comprises two regions within a contiguous memory material layer 54L that are adjacent to the respective control gate electrodes 46 and located at the same level.

The third, fourth and fifth embodiments of the present disclosure provide devices and methods for electrically isolating different lateral parts of a memory cell in one device level. In these embodiments, a three dimensional NAND device includes a common vertical channel and electrically isolated control gate electrodes on different lateral sides of the channel in each device level to form different lateral portions of a memory cell in each device level. Dielectric separator structures are located between and electrically isolate the control gate electrodes. The lateral (e.g., left and right) portions of the memory cell in each device level may be electrically isolated by at least one cell level isolation feature, such as boron doping ungated portions of the channel adjacent to the separator structures according to the third and fourth embodiments, and/or storing electrons in the separator structure according to the fifth embodiment.

Referring to FIGS. 21A and 21B, a third exemplary device structure according to a third embodiment of the present disclosure can be derived from the first exemplary structure of FIGS. 2A and 2B or from the second exemplary structure of FIGS. 12A and 12B by employing semiconductor layers 146 instead of sacrificial material layers 42 and optional upper select gate electrodes 48. Thus, the material layers between each vertically neighboring pair of insulator layers 32 can be semiconductor layers 146. The semiconductor layers 146 can be sufficiently doped with electrical dopants to render the semiconductor layers 146 conductive. In other words, the semiconductor layers 146 can include a doped (e.g., heavily or degenerately doped) semiconductor material having electrical conductivity greater than $1.0 \times 10^5$ S/cm. In one embodiment, the semiconductor layers 146 can comprise doped polysilicon, doped amorphous silicon, a doped silicon-containing alloy such as doped silicon-germanium alloy, or combinations thereof. Separator trenches 47 can be formed through the alternating stack (32, 146) by applying and patterning a photoresist layer over the alternating stack (32, 146), and anisotropically etching portions of the alternating stack (32, 146) that are not masked by the patterned photoresist layer. The etch chemistry employed to etch the separator trenches 47 can be selected to alternately etch the insulator layers 32 and the semiconductor layers 146. The photoresist layer can be subsequently removed, for example, by ashing. The alternating stack (32, 146) can be divided into multiple laterally disjoined portions by the separator trenches 47. In an alternative embodiment, the stack contains sacrificial layers 42 instead of the semiconductor layers 146 and the sacrificial layers 42 are subsequently replaced with metallic (e.g., tungsten, TiN, WN, etc.) electrically conductive layers 46, as described above.

Referring to FIGS. 22A and 22B, each separator trench 47 can be filled with a doped dielectric material, which is a dielectric material that includes electrical dopant atoms. The electrical dopant atoms can be p-type dopant atoms such as boron, or can be n-type dopant atoms such as phosphorus or arsenic. In one embodiment, the dielectric material can be doped silicate glass including the electrical dopant atoms as dopants. For example, the dielectric material can be borosilicate glass (BSG), phosphosilicate glass (PSG), or arsenosilicate glass (ASG). The conductivity type of the dopant atoms incorporated into the doped silicate glass can be the same as the conductivity type of semiconductor channels to be subsequently formed as a component of each memory stack structure. The doped dielectric material can be deposited into the separator trenches 47 employing a conformal deposition method such as low pressure chemical vapor deposition ((LPCVD). Excess portions of the doped dielectric material can be removed from above the top surface of the alternating stack, for example, by chemical mechanical planarization (CMP), a recess etch, or a combination thereof. Remaining portions of the deposited doped dielectric material constitutes separator structures 45 including a doped silicate glass (which is a dielectric material). In one embodiment, the separator structures 45 are doped silicate glass separator structures such as borosilicate glass separator structures.

Referring to FIGS. 23A and 23B, the processing steps of FIGS. 4A and 4B can be employed to form memory openings 49 that divide the separator structures 45 into multiple disjoined separator structure 45. A photoresist layer can be applied and lithographically patterned over the alternating stack (32, 146) to form an array of openings that overlie portions of the separator structures 45. Portions of the alternating stack (32, 146) and the separator structures 45 that are not masked by the patterned photoresist layer can be etched to form the memory openings 49. In one embodiment, the etch chemistry employed to etch the memory openings 49 can be selected to indiscriminately etch the insulator layers 32, the semiconductor layers 146, and the separator structures 45. Alternatively, combinations of various etch chemistries can be employed to alternately etch the insulator layers 32, the semiconductor layers 146, and the separator structures 45 in any sequence. Each separator structure 45 can be divided into a plurality of laterally spaced separator structures 45 by the memory openings 49. A plurality of separator structures 45 laterally spaced by the memory openings 49 is provided. Each of the plurality of separator structures 45 and memory openings 49 extend through the alternating stack (32, 146). Each of the memory openings 49 and the separator structures 45 can extend to the top surface of the substrate semiconductor layer 10.

Referring to FIGS. 24A-24C, portions of the semiconductor layers 146 are etched selectively with respect to the insulating layers 32 from inside each memory opening 49. Thus, the memory openings 49 are selectively laterally expanded at each level of the semiconductor layers 146. A lateral recess region 49A is formed at each level of the semiconductor layers 146 within each memory opening 49.

Each lateral recess region 49A is formed at the level of a respective doped semiconductor layer 146 through a memory opening 49. Specifically, the lateral recess regions 49A can be formed, for example, by a selective etch process in which the semiconductor material of the semiconductor layers 146 is etched selective to the insulator material of the insulating layers 32. In one embodiment, the selectivity of the etch process that etches the semiconductor layers 146 can be greater than 10 with respect to the dielectric materials of the separator structures 45 and the insulating layers 32. The selective etch process laterally recesses the sidewalls of the semiconductor layers 146 farther away from each memory opening 49 than sidewalls of adjoining insulating layers 32. The distance of the lateral recess for the lateral recess regions 49A can be selected such that the lateral recess regions 49A from neighboring memory openings 49 do not merge after termination of the selective etch process. In one embodiment, each lateral recess region 49A can have an annular shape.

Referring to FIGS. 25A-25C, a blocking dielectric 152 is formed within each lateral recess region 49A by conversion of surface portions of the semiconductor layers 146 at each lateral recess region 49A of the memory openings 49. In this case, the blocking dielectrics 152 comprise a dielectric material derived from the semiconductor material of the semiconductor layers 146. In one embodiment, the blocking dielectrics 152 comprise a dielectric oxide, a dielectric oxynitride, and/or a dielectric nitride of the semiconductor material of the semiconductor layers 146. The conversion of the surface portions of the semiconductor material of the semiconductor layers 146 into the blocking dielectrics 152 can be performed by thermal oxidation, plasma oxidation, thermal nitridation, and/or plasma nitridation. The thickness of each blocking dielectric 152 can be in a range from 6 nm to 24 nm, although lesser and greater thicknesses can also be employed. A horizontal dielectric material portion 252 including an oxide, an oxynitride, and/or a nitride of the semiconductor material of the substrate semiconductor layer 10 can be formed by conversion of physically exposed surface portions of the substrate semiconductor layer 10 into a dielectric material. In an alternative embodiment, the blocking dielectric may be formed by depositing one or more blocking dielectric layers and removing the portion of the blocking dielectric layer(s) from above the stack.

Referring to FIGS. 26A-26C, a memory material layer 154L can be deposited over the alternating stack and in the memory openings 49 by a conformal deposition method. In one embodiment, the memory material layer 154L includes a semiconductor material, which can be a doped semiconductor material or an intrinsic semiconductor material. The memory material layer 154L can include polysilicon, amorphous silicon, a silicon-germanium alloy, or a stack thereof. The memory material layer 154L can completely fill each lateral recess region 49A.

Referring to FIGS. 27A-27C, portions of the memory material layer 154L can be isotropically and/or anisotropically etched from outside of the lateral recess regions 49A within each memory opening 49. Remaining portions of the deposited semiconductor material of the memory material layer 154L constitute floating gate regions 54, which are charge storage elements. Multiple sets at least two charge storage elements are formed within each memory opening 49 such that each set of at least two charge storage elements (i.e., the floating gate regions 54) is formed within the same memory opening 49 and at the same level, which is a level of the semiconductor layers 146. Each set of at least two charge storage elements 54 is formed within each lateral recess region 49A on a respective blocking dielectric 152. In one embodiment, inner surfaces (surfaces proximal to the geometrical center axis of each memory opening 49) of the floating gate electrodes 54 can be coplanar with sidewalls of the insulator layers 32 in each memory opening 49, or can be farther away from the center axis of the respective memory opening 49 than the sidewall of the insulator layers 32 in each memory opening 49.

Referring to FIGS. 28A-28C, tunneling dielectrics 156 can be formed by conversion of the surface portions of the floating gate regions 54, which are the multiple sets at least two charge storage elements. The tunneling dielectrics 156 can comprise an oxide, an oxynitride, and/or a nitride of the semiconductor material of the floating gate electrodes 54. The conversion of the surface portions of the floating gate regions 54 into the tunneling dielectrics 156 can be performed by thermal oxidation, plasma oxidation, thermal nitridation, and/or plasma nitridation. The thickness of each tunneling dielectric 156 can be in a range from 1.5 nm to 10 nm, although lesser and greater thicknesses can also be employed. In an alternative embodiment, the tunneling dielectric may be formed by depositing one or more tunneling dielectric layers and removing the portion of the tunneling dielectric layer(s) from above the stack.

Referring to FIGS. 29A-29C, the processing steps of FIGS. 8A-8C and 9A-9C can be performed to form a semiconductor channel 60 and a dielectric core 62 in each memory opening 49. In one embodiment, the plurality of separator structures 45 can comprise a doped silicate glass including dopant atoms, and each semiconductor channel 60 can be formed directly on the plurality of separator structures 45.

Referring to FIGS. 30A-30C, an anneal process can be performed at an elevated temperature to non-uniformly dope each semiconductor channel 60. The elevated temperature of the anneal process can be in a range from 600° C. to 1,000° C., although lesser and greater temperatures can also be employed. The dopant atoms diffuse from the plurality of separator structures 45 into proximal portions of the semiconductor channels 60, i.e., portions of the semiconductor channels 60 that are physically proximal to the interface between the semiconductor channel 60 and the separator structures 45 that are in physical contact with the semiconductor channel 60.

The temperature and duration of the anneal process can be selected such that the predominant portion of the dopant atoms diffusing out from the separator structures 45 are located near the interfaces between the semiconductor channel 60 and the separator structures 45, and the composition of the portions of the semiconductor channel 60 that are farther away from the interfaces between the semiconductor channel 60 and the separator structures 45 remain substantially unchanged. For example, the semiconductor channel 60 after the anneal process can have a plurality of alternating base doping semiconductor channel portions 6A having the same dopant concentration as the semiconductor channel 60 prior to the anneal process, and enhanced doping semiconductor channel portions 6B having a higher dopant concentration than the base doping semiconductor channel portions. The base doping semiconductor channel portions 6A face the respective separator structures 45 while the enhanced doping semiconductor channel portions 6B face the respective control gate electrodes 146. In this case, each semiconductor channel 60 can have an azimuthally modulated dopant profile in which a dopant concentration changes as a function of an azimuthal angle around a geometrical center of the vertical portion of the semiconductor channel 60. In other words, the base doping semiconductor channel portions 6A and the enhanced doping semiconductor channel portions 6B alternate around the geometrical center (e.g., around a vertical axis).

In one embodiment, the doped silicate glass of the separator structures 45 can be a borosilicate glass. The atomic concentration of the boron atoms in the borosilicate glass can be in a range from 1% to 20%, although lesser and greater atomic concentrations can also be employed.

Referring to FIGS. 31A-31C, the processing steps of FIG. 10 can be performed to form a drain region 63 in an upper portion of each memory opening 49. Subsequent processing steps can be performed as in the first embodiment to form metal interconnect structures.

The third exemplary structure can comprise a memory device that includes a stack of alternating layers comprising insulating layers 32 and electrically conductive layers 146 (e.g., the doped semiconductor material layers or metallic layers) and located over a substrate 8, a memory stack structure 55 located within a memory opening extending through the stack, and having a semiconductor channel 60 having a vertical portion that extends along a direction perpendicular to a top surface of the substrate 8. The memory stack structure 55 comprises multiple sets of at least two charge storage elements (embodied as multiple sets of floating gate regions 54 located at the same level) located around the semiconductor channel 60 at each level of the electrically conductive layers 146. Each set of at least two charge storage elements 54 comprises charge storage elements that are located at the same level as a respective electrically conductive layer 146, and are electrically isolated from one another, from the semiconductor channel 60 by at least one respective tunneling dielectric 156, and from respective control gate electrodes (which are portions of the electrically conductive layers 146) thereof by at least one respective blocking dielectric 152. Separator insulator structures 45 can extend through the stack, can contact portions of an outer sidewall of the memory stack structure 55, and can laterally separate the control gate electrodes of the plurality of charge storage elements 54.

The semiconductor channel 60 has a vertical portion that extends along a direction perpendicular to a top surface of the substrate 8. The semiconductor channel 60 has an azimuthally modulated dopant profile in which a dopant concentration changes as a function of an azimuthal angle around a geometrical center of the vertical portion of the semiconductor channel 60.

The patterned electrically conductive layers 146 are provided at each level of the material layers by forming the material layers as doped semiconductor layers, which are conductive layers. Each memory stack structure 55 comprises multiple sets of at least two floating gate regions 54 located at a same level, which are at least two charge storage elements located around the semiconductor channel 60 at each level of the electrically conductive layers 146.

Each memory stack structure 55 can be located in a memory opening 49 that includes a lateral recess region 49A at each level of the electrically conductive layers 146. Each set of at least two charge storage elements 54 is located within a respective lateral recess region 49A. Each set of at least two charge storage elements comprises at least two floating gate regions 54 that are physically disjoined from one another.

Each semiconductor channel 60 comprises a plurality of base doping semiconductor channel portions 6A and a plurality of enhanced doping semiconductor channel portion 6B located at each level of the electrically conductive layers 146. The enhanced doping semiconductor channel portions 6B have a greater dopant concentration than the base doping semiconductor channel portions 6A. In one embodiment, the base doping semiconductor channel portions 6A can have a dopant concentration in a range from $1.0 \times 10^{14}/cm^3$ to $1.0 \times 10^{18}/cm^3$, and the enhanced doping semiconductor channel portions 6B can have a dopant concentration in a range from $1.0 \times 10^{17}/cm^3$ to $1.0 \times 10^{19}/cm^3$, although lesser and greater dopant concentrations can also be employed for each of the base doping semiconductor channel portions 6A and the enhanced doping semiconductor channel portions 6B. In one embodiment, each of the base doping semiconductor channel portions 6A contact the blocking dielectric and each of the enhanced doping semiconductor channel portions 6B can contact the separator insulator structures 45.

In one embodiment, the separator insulator structures 45 comprise a doped silicate glass including the same dopant atoms as the dopant atoms of the enhanced semiconductor channel portions 6B. For example, the separator insulator structures 45 comprise borosilicate glass (BSG) and the enhanced semiconductor channel portions 6B can comprise boron atoms as the electrical dopants.

In one embodiment, each set of the at least two charge storage elements (embodied as a set of floating gate regions 54 located at the same level in a memory opening 49) comprises a semiconductor material, and each set of at least two tunneling dielectrics 156 (contacting the floating gate regions 54 located at the same level of the memory opening 49) comprises a dielectric oxide of the semiconductor material of the set of the at least two charge storage elements. In one embodiment, the at least one respective blocking dielectric 156 in contact with a set of at least two charge storage element at a level in a memory opening 49 can be a set of at least two blocking dielectrics 156 that are physically disjoined from one another and located at the level of the respective electrically conductive layer 146. In one embodiment, the electrically conductive layers 146 comprise a doped semiconductor material, and each set of at least two tunneling dielectrics 156 comprises a dielectric oxide of the doped semiconductor material of the electrically conductive layers 146.

The patterned electrically conductive layers 146 are provided at each level of the material layers by forming the material layers as doped semiconductor layers, which are conductive layers. Each memory stack structure 55 comprises multiple sets of at least two floating gate regions 54 located at a same level, which are at least two charge storage elements located around the semiconductor channel 60 at each level of the electrically conductive layers 146.

The third exemplary structure can comprise a memory device that includes an alternating stack of insulating layers 32 and patterned electrically conductive layers 146 located over a substrate 8, a first pair of memory stack structures 55A, and a second pair of memory stack structures 55B. Each memory stack structure 55 comprises a plurality of memory cells arranged in a string extending in a first direction substantially perpendicular to the major surface 9 of the substrate 8 in a plurality of device levels.

Each of the plurality of memory cells is positioned in a respective one of the plurality of device levels above the substrate. A semiconductor channel 60 extends through all levels within the plurality of device levels in each memory stack structure 55. A first separator insulator structure 45A vertically extends through the stack and contacts the first pair of memory stack structures 55A. A second separator insulator structure 45B vertically extends through the stack and contacting the second pair of memory stack structures 55B. First control gate electrodes 461 within the patterned electrically conductive layers 146 contact the first and the second separator insulator structures (45A, 45B), a first side of each memory stack structure within the first pair of memory stack structures 55A, and a first side of each memory stack structure within the second pair of memory stack structures 55B.

Referring to FIGS. 32A-32C, a fourth exemplary device structure according to the fourth embodiment of the present disclosure can be derived from the third exemplary structure of FIGS. 29A-29C by employing a sacrificial material for the separator structures 45, and by forming separator cavities 7 by removing the separator structures 45 selective to the memory stack structures 55, the alternating stack (32, 146), and the substrate semiconductor layer 10. In this case, the separator structures 45 are formed as sacrificial separator structures. For example, the separator structures 45 can comprise a polymer material, such as a silicon and nitrogen containing polymer material, porous or non-porous organosilicate glass, borophosphosilicate glass (BPSG), and/or silicon nitride. For example, the separator structures 45 may comprise polysilazane. The removal of the separator structures 45 can be performed by an isotropic etch process or an anisotropic etch process that is selective to the materials of the memory stack structures 55 and the alternating stack (32, 146). The separator cavities 7 are cavities that laterally separate physically disjoined portions of the alternating stack (32, 146). A portion of an outer sidewall of a semiconductor channel 60 is physically exposed to each separator cavity 7.

Referring to FIGS. 33A-33C, enhanced doping semiconductor channel portions 6B can be formed by introducing electrical dopants through the separator cavities 7 into portions of the semiconductor channels 60 that are proximal to the separator cavities 7. Each semiconductor channel 60 can be non-uniformly doped by introduction of the electrical dopants only into portions that are proximal to the separator trenches 7. In one embodiment, the electrical dopants can be introduced into the proximal portions of the semiconductor channels 60 by gas phase doping at elevated temperature and/or plasma doping.

The process parameters of the gas phase doping process and/or the plasma doping process can be selected such that the predominant portion of the dopant atoms incorporated into the semiconductor channels 60 are located near the interfaces between the semiconductor channel 60 and the separator cavities 7, and the composition of the portions of the semiconductor channel 60 that are farther away from the interfaces between the semiconductor channel 60 and the separator trenches 7 remain substantially unchanged. For example, the semiconductor channel 60 after the doping process can have a plurality of base doping semiconductor channel portions 6A having the same dopant concentration as the semiconductor channel 60 prior to the doping process, and a plurality of enhanced doping semiconductor channel portions 6B having a higher dopant concentration than the semiconductor channel 60 prior to the doping process. In this case, each semiconductor channel 60 can have an azimuthally modulated dopant profile in which a dopant concentration changes as a function of an azimuthal angle around a geometrical center of the vertical portion of the semiconductor channel 60.

Referring to FIGS. 34A-34C, a dielectric material is deposited into the separator trenches 7 to form separator insulator structures (75, 7A, 7B). The separator insulator structures (75, 7A, 7B) include a dielectric material such as silicon oxide (including undoped silicate glass and doped silicate glass such as borosilicate glass), silicon nitride, silicon oxynitride, organosilicate glass, or a combination thereof. The dielectric material of the separator insulator structures (75, 7A, 7B) can be deposited by a conformal deposition method (such as low pressure chemical vapor deposition) or a self-planarizing deposition process (such as spin coating). Excess portions of the deposited dielectric material can be removed, for example, by chemical mechanical planarization (CMP) and/or a recess etch. Remaining portions of the deposited dielectric material in the separator trenches 7 constitute the separator insulator structures (75, 7A, 7B).

The fourth exemplary structure can have the same features as the third exemplary structure except for the replacement of the separator insulator structures 45 of the third embodiment with the separator insulator structures (75, 7A, 7B) of the fourth embodiment, which can differ from the composition of the separator insulator structures 45 of the third embodiment. In one embodiment, the separator insulator structures (75, 7A, 7B) of the fourth embodiment can comprises a material selected from undoped dielectric material, such as silicon nitride, undoped silicate glass, and organosilicate glass.

A first separator insulator structure 7A vertically extends through the stack and contacts the first pair of memory stack structures 55A. A second separator insulator structure 7B vertically extends through the stack and contacting the second pair of memory stack structures 55B. First control gate electrodes 461 within the patterned electrically conductive layers 146 contact the first and the second separator insulator structures (7A, 7B), a first side of each memory stack structure within the first pair of memory stack structures 55A, and a first side of each memory stack structure within the second pair of memory stack structures 55B.

Referring to FIGS. 35A and 35B, a fifth exemplary device structure according to a fifth embodiment of the present disclosure can be the same as the third exemplary device structure of FIGS. 22A and 22B. Thus, the stack of alternating layers (32, 146) can comprise an alternating stack of insulator layers 32 and semiconductor layers 146. The semiconductor layers 146 can be sufficiently doped with electrical dopants to render the semiconductor layers 146 conductive. In other words, the semiconductor layers 146 can include a doped semiconductor material having electrical conductivity greater than $1.0 \times 10^5$ S/cm. In one embodiment, the semiconductor layers 146 can comprise doped polysilicon, doped amorphous silicon, a doped silicon-containing alloy such as doped silicon-germanium alloy, or combinations thereof.

The laterally-extending cavities can be separator trenches 47, which are formed through the alternating stack (32, 146) by applying and patterning a photoresist layer over the alternating stack (32, 146), and anisotropically etching portions of the alternating stack (32, 146) that are not masked by the patterned photoresist layer. The etch chemistry employed to etch the separator trenches 47 can be selected to alternately etch the insulator layers 32 and the semiconductor layers 146. The photoresist layer can be subsequently removed, for example, by ashing. The alternating stack (32, 146) can be divided into multiple laterally disjoined portions by the separator trenches 47. Each separator trench 47 extends through the stack of alternating layers (32, 146). The remaining portions of the stack of alternating layers (32, 146) are laterally spaced from each other by the separator trenches 47.

Referring to FIGS. 36A and 36B, a dielectric liner 141 can be formed on the sidewalls of each separator trench 47. The dielectric liners 141 can be formed, for example, by formation of a dielectric material layer including a first dielectric material, and by a subsequent anisotropic etch (such as a reactive ion etch) that removes horizontal portions of the dielectric material layer to form dielectric spacers 141. The dielectric material can include silicon nitride, silicon oxynitride or silicon oxide.

In one embodiment, the first dielectric material of the dielectric material layer (and the dielectric spacers 141) can comprise a dielectric material that can trap electrical charges. In one embodiment, the first dielectric material can comprise silicon nitride or silicon oxynitride. As used herein, a silicon oxynitride refers to a dielectric compound having a chemical formula $Si_{3+\delta}N_{4-x}O_{1.5x}$, in which x is in a range from 0.1 to 3.9, and $\delta$ is in a range from −0.2 to 0.2. In one embodiment, the silicon oxynitride of the present disclosure can be nitrogen-rich, i.e., can have a value of x that is in a range from 0.1 to 2.0. In one embodiment, the silicon oxynitride of the present disclosure can have a value of x in a range from 0.1 to 1.0. In one embodiment, the silicon oxynitride of the dielectric material layer can be formed by deposition of a silicon oxide layer, followed by a nitridation process. The silicon oxide layer can be conformally deposited, for example, by low pressure chemical vapor deposition (LPCVD) or atomic layer deposition (ALD). The thickness of the silicon oxide layer can be in a range from 1 nm to 30 nm (such as from 3 nm to 10 nm), although lesser and greater thicknesses can also be employed. Subsequently, the silicon oxide layer can be converted into a silicon oxynitride layer by a nitridation process, which can be a thermal nitridation process or a plasma nitridation process. The temperature and the duration of the thermal nitridation process, or the plasma intensity and the duration of the plasma nitridation process can be selected to provide the target material composition for the silicon oxynitride layer.

Alternatively, the silicon oxynitride of the dielectric material layer can be formed by deposition of a silicon nitride layer, followed by an oxidation process. The silicon nitride layer can be conformally deposited, for example, by low pressure chemical vapor deposition (LPCVD) or atomic layer deposition (ALD). The thickness of the silicon nitride layer can be in a range from 1 nm to 30 nm (such as from 3 nm to 10 nm), although lesser and greater thicknesses can also be employed. Subsequently, the silicon nitride layer can optionally be converted into a silicon oxynitride layer by an oxidation process, which can be a thermal oxidation process or a plasma oxidation process. The temperature and the duration of the thermal oxidation process, or the plasma intensity and the duration of the plasma oxidation process can be selected to provide the target material composition for the silicon oxynitride layer. Otherwise, the silicon nitride layer may remain without being converted to silicon oxynitride.

In another embodiment, the first dielectric material of the dielectric material layer (and the dielectric spacers 141) can comprise a material that does not trap electrical charges. In one embodiment, the first dielectric material can comprise silicon oxide, i.e., $SiO_2$. In this case, a silicon oxide layer can be formed by conformal deposition of silicon oxide, for example, by low pressure chemical vapor deposition (LPCVD) or atomic layer deposition (ALD). The thickness of the silicon oxide layer can be in a range from 1 nm to 30 nm (such as from 3 nm to 10 nm), although lesser and greater thicknesses can also be employed.

The anisotropic etch can be a reactive ion etch that etches the horizontal portions of the dielectric material layer. Optionally, the anisotropic etch can be selective to the materials of the underlying layers such as the substrate semiconductor layer 10 and/or the alternating stack (32, 146). Each remaining vertical portion of the dielectric material layer constitutes a dielectric spacer 141. The thickness of each dielectric spacer 141 can be in a range from 1 nm to 30 nm (such as from 3 nm to 10 nm), although lesser and greater thicknesses can also be employed.

Referring to FIGS. 37A and 37B, the unfilled volume of each separation trench 47 can be filled with a second dielectric material, which is different from the first dielectric material. If the first dielectric material comprises a dielectric material that traps electrical charges, the second dielectric material can comprise a material that does not trap electrical charges. For example, if the first dielectric material of the dielectric spacer 141 comprises silicon nitride or silicon oxynitride, then the second dielectric material can comprise silicon oxide. The silicon oxide can be undoped silicon oxide or doped silicon oxide. If the first dielectric material of the dielectric spacer 141 comprises a dielectric material that does not trap electrical charges, the second dielectric material can comprise a material that traps electrical charges. For example, if the first dielectric material of the dielectric spacer 141 comprises silicon oxide, the second dielectric material can comprise silicon nitride or silicon oxynitride.

The second dielectric material can be deposited by a conformal deposition, a self-planarizing deposition process, and an optional planarization process. For example, if the second dielectric material comprises silicon oxide, the silicon oxide material can be deposited by low pressure chemical vapor deposition (LPCVD), atomic layer deposition (ALD), and/or spin coating. Excess portions of the silicon oxide material can be removed, for example, by a planarization process, which can employ chemical mechanical planarization (CMP) and/or a recess etch. If the second dielectric material comprises silicon nitride, the silicon nitride material can be deposited by low pressure chemical vapor deposition (LPCVD) and/or atomic layer deposition (ALD), and can be subsequently planarized by chemical mechanical planarization (CMP) and/or a recess etch. The topmost surface of the alternating stack (32, 146) can be employed as a stopping layer during the planarization process. Each remaining portion of the deposited second dielectric material constitutes a dielectric fill material portion 142, which is laterally surrounded by a dielectric spacer 141. Each adjoining pair of a dielectric spacer 141 and a dielectric fill material portion 142 embedded therein constitutes a separator structure 45, which laterally separates a pair of physically disjoined portions of the alternating stack (32, 146).

Referring to FIGS. 38A and 38B, the processing steps of FIGS. 4A and 4B can be employed to form memory openings 49 that divide each of the separator structures 45 into multiple disjoined separator structure 45. A photoresist layer can be applied and lithographically patterned over the alternating stack (32, 146) to form an array of openings that overlie portions of the separator structures 45. Portions of the alternating stack (32, 146) and the separator structures 45 that are not masked by the patterned photoresist layer can be etched to form the memory openings 49. In one embodiment, the etch chemistry employed to etch the memory openings 49 can be selected to indiscriminately etch the insulator layers 32, the semiconductor layers 146, and the separator structures 45. Alternatively, combinations of various etch chemistries can be employed to alternately etch the insulator layers 32, the semiconductor layers 146, and the separator structures 45 in any sequence. Each separator structure 45 can be divided into a plurality of laterally spaced separator structures 45 by the memory openings 49.

Each combination of a dielectric spacer 141 and a dielectric fill material portion 142 is divided into multiple disjoined structures by forming the memory openings 49 therethrough. Each remaining portion of the combination comprises a separator structure 45. A plurality of separator structures 45 laterally spaced by the memory openings 49 is provided. Each of the plurality of separator structures 45 and memory openings 49 extend through the alternating stack (32, 146). Each of the memory openings 49 and the separator structures 45 can extend to the top surface of the substrate semiconductor layer 10. Each separator structure 45 includes a lateral stack, from one side to another, a first dielectric liner 14A comprising the first dielectric material, a dielectric fill material portion 142 comprising the second dielectric material that is different from the first dielectric material, and a second dielectric liner 14B comprising the first dielectric material.

Referring to FIGS. 39A-39C, portions of the semiconductor layers 146 are etched selectively with respect to the insulating layers 32 from inside each memory opening 49. Thus, the memory openings 49 are selectively laterally expanded at each level of the semiconductor layers 146. A lateral recess region 49A is formed at each level of the semiconductor layers 146 within each memory opening 49.

Each lateral recess region 49A is formed at the level of a respective doped semiconductor layer 146 through a memory opening 49. Specifically, the lateral recess regions 49A can be formed, for example, by a selective etch process in which the semiconductor material of the semiconductor layers 146 is etched selective to the insulator material of the insulating layers 32. In one embodiment, the selectivity of the etch process that etches the semiconductor layers 146 can be greater than 10 with respect to the dielectric materials of the separator structures 45 and the insulating layers 32. The selective etch process laterally recesses the sidewalls of the semiconductor layers 146 farther away from each memory opening 49 than sidewalls of adjoining insulating layers 32. The distance of the lateral recess for the lateral recess regions 49A can be selected such that the lateral recess regions 49A from neighboring memory openings 49 do not merge after termination of the selective etch process. In one embodiment, each lateral recess region 49A can have an annular shape.

Referring to FIGS. 40A-40C, a blocking dielectric 152 is formed within each lateral recess region 49A by conversion of surface portions of the semiconductor layers 146 at each lateral recess region 49A of the memory openings 49. In this case, the blocking dielectrics 152 comprise a dielectric material derived from the semiconductor material of the semiconductor layers 146. In one embodiment, the blocking dielectrics 152 comprise a dielectric oxide, a dielectric oxynitride, and/or a dielectric nitride of the semiconductor material of the semiconductor layers 146. The conversion of the surface portions of the semiconductor material of the semiconductor layers 146 into the blocking dielectrics 152 can be performed by thermal oxidation, plasma oxidation, thermal nitridation, and/or plasma nitridation. The thickness of each blocking dielectric 152 can be in a range from 6 nm to 24 nm, although lesser and greater thicknesses can also be employed. A horizontal dielectric material portion 252 including an oxide, an oxynitride, and/or a nitride of the semiconductor material of the substrate semiconductor layer 10 can be formed by conversion of physically exposed surface portions of the substrate semiconductor layer 10 into a dielectric material.

Referring to FIGS. 41A-41C, a memory material layer 154L can be deposited over the alternating stack and in the memory openings 49 by a conformal deposition method. In one embodiment, the memory material layer 154L includes a semiconductor material, which can be a doped semiconductor material or an intrinsic semiconductor material. The memory material layer 154L can include polysilicon, amorphous silicon, a silicon-germanium alloy, or a stack thereof. The memory material layer 154L can completely fill each lateral recess region 49A.

Referring to FIGS. 42A-42C, portions of the memory material layer 154L can be isotropically and/or anisotropically etched from outside of the lateral recess regions 49A within each memory opening 49. Remaining portions of the deposited semiconductor material of the memory material layer 154L constitute floating gate regions 54, which are charge storage elements. Multiple sets at least two charge storage elements are formed within each memory opening 49 such that each set of at least two charge storage elements (i.e., the floating gate regions 54) is formed within the same memory opening 49 and at the same level, which is a level of the semiconductor layers 146. Each set of at least two charge storage elements 54 is formed within each lateral recess region 49A on a respective blocking dielectric 152. In one embodiment, inner surfaces (surfaces proximal to the geometrical center axis of each memory opening 49) of the floating gate electrodes 54 can be coplanar with sidewalls of the insulator layers 32 in each memory opening 49, or can be farther away from the center axis of the respective memory opening 49 than the sidewall of the insulator layers 32 in each memory opening 49.

Referring to FIGS. 43A-43C, tunneling dielectrics 156 can be formed by conversion of the surface portions of the floating gate regions 54, which are the multiple sets at least two charge storage elements. The tunneling dielectrics 156 can comprise an oxide, an oxynitride, and/or a nitride of the semiconductor material of the floating gate electrodes 54. The conversion of the surface portions of the floating gate regions 54 into the tunneling dielectrics 156 can be performed by thermal oxidation, plasma oxidation, thermal nitridation, and/or plasma nitridation. The thickness of each tunneling dielectric 156 can be in a range from 1.5 nm to 10 nm, although lesser and greater thicknesses can also be employed.

A memory stack structure (152, 54, 156) is formed within each of the memory openings 49. The memory stack structure (152, 54, 156) can comprise a pair of charge storage elements 54 located around the semiconductor channel 60 at each level of the electrically conductive layers (146 or 461, 462, 463).

Referring to FIGS. 44A-44C, the processing steps of FIGS. 8A-8C and 9A-9C can be performed to form a semiconductor channel 60 and a dielectric core 62 in each memory opening 49. In one embodiment, the plurality of separator structures 45 can comprise a doped silicate glass including dopant atoms, and each semiconductor channel 60 can be formed directly on the plurality of separator structures 45. If desired the base and enhanced doping semiconductor channel portions 6A and 6B may optionally be formed in this embodiment using the methods described in the prior embodiments. Alternatively, the portions 6A and 6B are omitted in this embodiment.

Referring to FIGS. 45A-45C, a backside trench can be formed through the alternating stack (32, 146), and the semiconductor layers 146 can be removed selective to insulator layers 32 by a selective etch. In one embodiment, the anisotropic etch that formed the backside trench can stop at the level of the bottommost insulator layer 32 prior to physically exposing a top surface of the semiconductor substrate layer 10 to facilitate removal of the semiconductor layers 146 selective to the insulator layers 32. Optionally, backside recesses that are formed in the spaces from which the semiconductor layers 146 are removed can be subsequently filled with metallic material layers (e.g., W, Cu, TiN, WN, etc.) to provide electrically conductive layers (461, 462, 463), which can include a plurality of prongs (461, 462, 463). A dielectric spacer 74 and a backside contact structure 76 can be formed as illustrated in FIG. 1 within the backside contact trench.

The fifth exemplary structure can include a memory device, which comprises a stack of alternating layers comprising insulating layers 32 and electrically conductive layers (146 or 461, 462, 463) and located over a substrate 10, a memory stack structure (152, 54, 156) located within a memory opening extending through the stack, and a semiconductor channel 60 having a vertical portion that extends along a direction perpendicular to a top surface of the substrate 10. Each pair of charge storage elements 54 comprises charge storage elements 54 that are located at a same level as a respective electrically conductive layer (146 or 461, 462, 463), and are electrically isolated from one another by the separator structures 45.

Each dielectric fill material portion 142 can be in contact with the vertical portion of a respective semiconductor channel 60. The first dielectric liner 14A and the second dielectric liner 14B can be in contact with the vertical portion of the semiconductor channel 60. The first dielectric liner 14A and the second dielectric liner 14B can have the same thickness. The dielectric fill material portion 142 can have a uniform thickness.

In one embodiment, one of the first dielectric material and the second dielectric material comprises silicon oxide. In one embodiment, one of the first dielectric material and the second dielectric material comprises a dielectric compound including silicon atoms and nitrogen atoms (such as silicon nitride or silicon oxynitride). In one embodiment, the first material comprises silicon nitride or silicon oxynitride, and the second material comprises silicon oxide. In one embodiment, the first material comprises silicon oxide, and the second material comprises silicon nitride or silicon oxynitride. In an alternative embodiment, the dielectric spacers 141/liners (14A, 14B), such as silicon nitride or silicon oxynitride dielectric spacers or liners may be omitted from the device. In this case, charge is stored in the fill material portion 142 which constitutes the entire separator structure 45, as will be described below.

In one embodiment, the memory stack structure (152, 54, 156) comprises vertical stacks of pairs of physically disjoined portions (152, 54, 156) that are separated by a portion of the separator structure that protrudes inward from an outermost sidewall of the memory opening. In one embodiment, the separator structure 45 extends through the stack of alternating layers (32, 146), contacts sidewalls of the memory stack structure (152, 54, 156), and laterally separates the control gate electrodes 146 of each pair of charge storage elements 54 located at the same level and within the same memory opening. In one embodiment, vertical portion of the semiconductor channel 60 can have a dopant concentration that is independent of (i.e., does not change as a function of) an azimuthal angle within the vertical portion of the semiconductor channel 60 as measured around a vertical axis passing through a geometrical center GC of the vertical portion of the semiconductor channel. In other words, base and enhanced doped portions 6A and 6B described above may be omitted in this embodiment if desired.

Patterned electrically conductive layers (146 or 461, 462, 463) are provided at each level of the material layers by forming the material layers as layers of a conductive material (such as the semiconductor layers 146 that are doped to provide electrically conductive layers) or by replacement of the material layers with at least one conductive material (which can be a metallic material) to form the electrically conductive layers. For example, the metallic layers may be used with a charge trapping dielectric (e.g., silicon nitride charge storage layer) type device while doped semiconductor layers may be used with a floating gate type device.

The fifth exemplary structure of the present disclosure as illustrated in FIGS. 44A-44C or in FIGS. 45A-45C can comprise a memory device that is a monolithic three-dimensional NAND memory device. In one embodiment, the substrate 8 comprises a silicon substrate, the monolithic three-dimensional NAND memory device comprises an array of monolithic three-dimensional NAND strings over the silicon substrate, and at least one memory cell in the first device level of the three-dimensional array of NAND strings is located over another memory cell in the second device level of the three-dimensional array of NAND strings. The silicon substrate can contain an integrated circuit comprising a driver circuit for the memory device located thereon. Each NAND string comprises a semiconductor channel 60. An end portion of the semiconductor channel 60 extends substantially perpendicular to a top surface of the silicon substrate. Each NAND string further comprises a plurality of charge storage elements 54. Each charge storage element 54 is located adjacent to a respective semiconductor channel 60. Each NAND string comprises a plurality of control gate electrodes (146 or 461, 462, 463) having a strip shape extending substantially parallel to the top surface of the substrate 8. The plurality of control gate electrodes (146 or 461, 462, 463) comprises at least a first control gate electrode located in the first device level and a first control gate electrode located in the second device level. At each level of the control gate electrodes (146 or 461, 462, 463), a first charge storage element and a second charge storage element are provided within each memory opening. The first charge storage element can be a portion of a first memory material layer (one instance of 54), and the second charge storage element can be a portion of a second memory material layer (another instance of 54) that is not in physical contact with the first memory material layer.

The memory device of the fifth exemplary structure can be operated such that the charge trapping material within the separator structures 45 provides electrical isolation between the lateral portions (e.g., left and right portions) of the memory cell in each device level and/or between charge storage elements 54 located at the same level and within a same memory opening 49. Specifically, charge carriers, such as electrons, are injected into the separator structures 45 during operation of the device, such as during the erase operation of the device. The charge carriers remain in the separator structures 45 during subsequent operation of the device (e.g., during subsequent program, read and erase operations) and provide electrical isolation between the lateral portions (e.g., left and right portions) of the memory cell in each device level and/or between the adjacent charge storage elements 54. Specifically, the charge carriers in the separator structures 45 can effectively shut off the body (e.g., the ungated portion of the channel) of the device adjacent to the separator structure 45 and thus effectively isolate the left and right sides of the shared channel body (i.e., the left and right sides of the cell adjacent to the left and right side control gate electrodes described above).

The charge carriers, such as electrons, may be injected into the separator structures 45 from the corners and/or edges of the control gate electrodes (46, 146) during the erase operation. Specifically, the device of the fifth embodiment may be programmed by Fowler-Nordheim tunneling by applying a positive bias to the selected control gate electrode (46, 146) relative to the source or drain of the device to cause electrons to flow from the channel through the tunneling dielectric into the charge storage elements 54 (e.g., floating gates or charge trapping dielectric). The device may be erased using a gate induced drain leakage (GIDL) process. During the GIDL process, a positive voltage is applied to the selected control gate electrode to generate holes in the channel adjacent to the selected cell portion. A negative voltage is then applied to the selected control gate electrode to attract the holes from the channel into the charge storage element 54 of the selected lateral cell portion located adjacent to the selected control gate electrode. The holes recombine with the electrons in the memory structure 54 to erase the selected cell portion. Preferably, an excess amount of holes remains in the charge storage element 54 after the erase operation.

During the application of the negative voltage to the selected control gate electrode during the GIDL erase operation, the electric field is higher at the corners of the control gate electrodes located adjacent to the separator structures 45 than in the bulk of the control gate electrodes. The high electric field erase saturation condition under negative bias causes the electrons to be emitted from the corners of the control gate electrodes into the adjacent separator structures 45 during the GIDL erase step at the same time as the holes are drawn into the charge storage element 54 from the channel.

The charge carriers, such as electrons, may be permanently stored in any portion of the separator structures 45. For example, for separator structures 45 containing only a silicon oxide fill, the electrons may be stored in the silicon oxide fill. For separator structures that contain a charge trapping dielectric, such as silicon nitride or oxynitride liners 14A, 14B or core 142, the charge may be stored in these charge trapping dielectric liners or core. In one embodiment, the first dielectric liners 14A and the second dielectric liners 14B can include a charge trapping material (such as silicon nitride or silicon oxynitride), and the electrons can be trapped within the first dielectric liners 14A and the second dielectric liners 14B. In another embodiment, the dielectric fill material portions 142 can include a charge trapping material (such as silicon nitride or oxynitride), and the electrons can be trapped within the dielectric fill material portions 142.

The negative voltage applied to the selected control gate electrodes (e.g., selected electrically conductive layers (146 or 461, 462, 463)) can be in a range from negative 2 V to negative 20 V, such as negative 3V to negative 7V, although lesser and greater magnitudes can also be employed. If desired, the negative voltage may be pulsed during the erase operation. For example, the negative voltage may be pulsed with a step wise increase (i.e., each subsequent pulse or set of pulses may be more negative than the prior pulse or set of pulses). During the erase operation, the unselected control gates and/or other nodes of the device may be grounded.

Optionally, the set of the semiconductor layers 146 of the third, fourth and fifth embodiments may be replaced with a different set of electrically conductive layers having a higher conductivity (such as electrically conductive layers including metallic materials such as TiN, TaN, WN, W, Cu, Al, Co, Ru, or combinations thereof). In this case, a backside contact trench can be employed to remove the doped or undoped semiconductor material of the semiconductor layers 146 selective to the insulator layers 32 and to form backside recesses. The backside recesses can be filled with at least one metallic material to form electrically conductive layers having a greater conductivity than the semiconductor layers 146 of the third or fourth embodiment. In case metallic materials 46 are used, then the blocking dielectric is formed by dielectric layer deposition rather than by oxidation of semiconductor layers 146. Furthermore, rather than using discreet floating gates as the charge storage regions/memory structures, a continuous charge trapping dielectric layer (e.g., silicon nitride layer) may be used as the charge storage regions/memory structures in each device level, as described with respect to the second embodiment above. In this case, the tunneling dielectric may be formed by deposition of a tunneling dielectric layer(s) rather than oxidation of silicon floating gates. Furthermore, the recesses 49A may be omitted in this case.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
  a substrate having a major surface;
  a stack of alternating layers comprising insulating layers and control gate electrodes located over the substrate;
  memory openings continuously extending from a topmost layer of the stack of alternating layers down to the major surface of the substrate, wherein each of the memory openings includes a respective memory stack structure extending through the stack of alternating layers, wherein sidewalls of the stack of alternating layers that physically contact the memory stack structures consist of concave sidewalls, wherein each of the memory stack structures comprises a plurality of memory cells arranged in a string extending in a first direction substantially perpendicular to the major surface of the substrate in a plurality of device levels, wherein each of the plurality of memory cells is positioned in a respective one of the plurality of device levels above the substrate;
  at least one first select gate electrode located between the major surface of the substrate and the plurality of memory cells;
  at least one second select gate electrode located above the plurality of memory cells;
  a semiconductor channel having a portion that extends vertically along a direction perpendicular to the major surface;
  a first charge storage element located on a first side of the semiconductor channel; and
  a second charge storage element located on a second side of the semiconductor channel and located at a same level as the first charge storage element, wherein the second charge storage element is electrically isolated from the first charge storage element, and located at a same level as the first charge storage element.

2. The memory device of claim 1, wherein each memory cell of the plurality of memory cells comprises:
a unitary portion of the semiconductor channel;
the first charge storage element;
the second charge storage element;
at least a portion of a first control gate electrode located adjacent to the first charge storage element; and
at least a portion of a second control gate electrode located adjacent to the second charge storage element and electrically isolated from the first control gate electrode and the first charge storage element.

3. The memory device of claim 2, wherein each memory cell of the plurality of memory cells further comprise:
a blocking dielectric contacting outer sidewalls of the first and second charge storage elements; and
a tunneling dielectric contacting inner sidewalls of the first and second charge storage elements and an outer sidewall of the semiconductor channel, such that the tunneling dielectric is located between the semiconductor channel and the first and second charge storage elements.

4. The memory device of claim 1, wherein:
multiple sets of at least two charge storage elements located are around the semiconductor channel at each level of a respective control gate electrodes; and
the memory device further comprises separator insulator structures extending through the stack, contacting portions of an outer sidewall of the memory stack structure, and laterally separating the control gate electrodes of the plurality of charge storage elements, wherein the memory stack structure is located in a memory opening that includes a lateral recess region at each level of the control gate electrodes, wherein each set of at least two charge storage elements is located within a respective lateral recess region.

5. The memory device of claim 4, wherein each set of at least two charge storage elements comprises at least two floating gates that are physically disjoined from one another.

6. The memory device of claim 4, further comprising:
a single contiguous tunneling dielectric that laterally surrounds the semiconductor channel; and
a single contiguous blocking dielectric that contacts outer sidewalls of the respective single contiguous tunneling dielectric.

7. The memory device of claim 4, wherein:
the memory device is a monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
each NAND string comprises:
the semiconductor channel in a respective memory stack structure, wherein at least one end portion of the semiconductor channel extends substantially perpendicular to a top surface of the silicon substrate;
a plurality of charge storage elements, each charge storage element located adjacent to a respective semiconductor channel; and
the control gate electrodes having a strip shape extending substantially parallel to the top surface of the substrate, the control gate electrodes comprise at least a first control gate electrode located in the first device level and a second control gate electrode located in the second device level.

8. The memory device of claim 4, wherein:
the separator insulator structures comprise a subset of separator insulator structures that include sidewalls located entirely within a parallel pair of vertical surfaces extending along a first horizontal direction and spaced apart by a uniform distance along a second horizontal direction that is perpendicular to the first horizontal direction; and
each separator insulator structure within the subset of separator insulator structures is laterally spaced by a subset of the memory stack structures arranged along the first horizontal direction.

9. The memory device of claim 8, wherein the separator insulator structures comprise a subset of separator insulator structures that include sidewalls located entirely within a parallel pair of vertical surfaces extending along a first horizontal direction and spaced apart by a uniform distance along a second horizontal direction that is perpendicular to the first horizontal direction.

10. The memory device of claim 8, wherein each separator insulator structure within the subset of separator insulator structures is laterally spaced by a subset of the memory stack structures arranged along the first horizontal direction.

11. The memory device of claim 1, wherein the first charge storage element and the second charge storage element are two spatially spaced-apart portions within a same memory material layer.

12. The memory device of claim 1, wherein the first charge storage element is a portion of a first memory material layer, and the second charge storage element is a portion of a second memory material layer that is not in physical contact with the first memory material layer.

13. The memory device of claim 1, wherein the major surface of the substrate is a topmost horizontal surface of a substrate semiconductor layer including a semiconductor material.

14. The memory device of claim 1, wherein the portion of the semiconductor channel that extends vertically has an azimuthally modulated dopant profile in which a dopant concentration changes as a function of an azimuthal angle around a geometrical center of the portion of the semiconductor channel that extends vertically.

15. The memory device of claim 14, further comprising:
separator insulator structures extending through the stack, contacting portions of an outer sidewall of the memory stack structure, and laterally separating the control gate electrodes of the plurality of charge storage elements;
base doping semiconductor channel portions which face the respective separator insulator structures; and
enhanced doping semiconductor channel portions which have a greater dopant concentration than the base doping semiconductor channel portions, and which face the respective control gate electrodes.

16. The memory device of claim 1, further comprising separator insulator structures extending through the stack, contacting portions of an outer sidewall of the memory stack structure, and laterally separating the control gate electrodes of the plurality of charge storage elements, wherein:
the memory stack structure comprises vertical stacks of pairs of physically disjoined portions that are separated by a portion of the separator insulator structure that protrudes inward from an outermost sidewall of the memory opening; and the portion of the semiconductor channel that extends vertically in the memory opening is continuous in an azimuthal direction around a geometrical center of the portion of the semiconductor channel that extends vertically.

17. A memory device, comprising:

an alternating stack of insulating layers and patterned electrically conductive layers located over a major surface of a substrate, the major surface being a topmost horizontal surface of a substrate semiconductor layer including a semiconductor material;

memory openings continuously extending from a topmost layer of the stack of alternating layers down to the major surface of the substrate;

a first pair of memory stack structures and a second pair of memory stack structures that are located in the memory openings, wherein each memory stack structure comprises a plurality of memory cells arranged in a string extending in a first direction substantially perpendicular to the major surface of the substrate in a plurality of device levels, each of the plurality of memory cells is positioned in a respective one of the plurality of device levels above the substrate, and wherein a semiconductor channel extends through all levels within the plurality of device levels in each memory stack structure;

a first separator insulator structure vertically extending through the stack and contacting the first pair of memory stack structures; and a second separator insulator structure vertically extending through the stack and contacting the second pair of memory stack structures, wherein first control gate electrodes within the patterned electrically conductive layers contact the first and the second separator insulator structures, a first side of each memory stack structure within the first pair of memory stack structures, and a first side of each memory stack structure within the second pair of memory stack structures.

18. The memory device of claim 17, further comprising:

second control gate electrodes within the patterned electrically conductive layers contact a second side of the first separator insulator structure and a second side of each of the first pair of memory stack structures; and third control gate electrodes within the patterned electrically conductive layers contact a second side of the second separator insulator structure and a second side of each of the second pair of memory stack structures.

19. The memory device of claim 18, wherein:

each memory stack structure comprises multiple sets of at least two charge storage elements located around the semiconductor channel at each level of the electrically conductive layers; and each set of at least two charge storage elements comprises charge storage elements that are located at a same level as a respective patterned electrically conductive layer, and are electrically isolated from one another, from the semiconductor channel by at least one respective tunneling dielectric, and from respective control gate electrodes thereof by at least one respective blocking dielectric.

20. The memory device of claim 19, wherein:

each memory stack structure is located in the memory opening that includes a lateral recess region at each level of the patterned electrically conductive layers, wherein each set of at least two charge storage elements is located within a respective lateral recess region; and each set of at least two charge storage elements comprises at least two floating gates that are physically disjoined from one another.

21. The memory device of claim 19, wherein each set of at least two charge storage elements comprises two regions within a contiguous memory material layer that are adjacent to the respective control gate electrodes and located at a same level.

22. The memory device of claim 17, wherein:

the memory device is a monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the three-dimensional array of NAND strings is located over another memory cell in a second device level of the three-dimensional array of NAND strings;

the silicon substrate contains an integrated circuit comprising a driver circuit for the memory device located thereon; and each NAND string comprises:

a semiconductor channel in a respective memory stack structure, wherein at least one end portion of the semiconductor channel extends substantially perpendicular to a top surface of the silicon substrate;

a plurality of charge storage elements, each charge storage element located adjacent to a respective semiconductor channel; and a plurality of control gate electrodes having a strip shape extending substantially parallel to the top surface of the substrate.

23. The memory device of claim 17, wherein a portion of the semiconductor channel that extends vertically has an azimuthally modulated dopant profile in which a dopant concentration changes as a function of an azimuthal angle around a geometrical center of the portion of the semiconductor channel that extends vertically.

24. The memory device of claim 23, further comprising:

base doping semiconductor channel portions which face the first and the second separator insulator structures; and enhanced doping semiconductor channel portions which have a greater dopant concentration than the base doping semiconductor channel portions, and which face the respective first control gate electrodes.

25. The memory device of claim 17, wherein:

the memory stack structure comprises vertical stacks of pairs of physically disjoined portions that are separated by portions of the first and the second separator insulator structures that protrude inward from an outermost sidewall of the memory opening; and a portion of the semiconductor channel that extends vertically in the memory opening is continuous in an azimuthal direction around a geometrical center of the portion of the semiconductor channel that extends vertically.

26. A memory device, comprising:

a substrate having a major surface that is a topmost horizontal surface of a substrate semiconductor layer including a semiconductor material;

a stack of alternating layers comprising insulating layers and control gate electrodes located over the substrate;

memory openings continuously extending from a topmost layer of the stack of alternating layers down to the major surface of the substrate, wherein each of the memory openings includes a respective memory stack structure extending through the stack, wherein each of the memory stack structures comprises a dielectric core, a semiconductor channel that vertically extends through the stack of alternating layers and laterally surrounding the dielectric core and laterally spaces the dielectric core from each sidewall of the memory opening, and multiple sets of at least two charge storage elements located around the semiconductor channel at each level of the electrically conductive layers, and each set of at least two charge storage elements is located at a level of a respective control gate electrode, and are electrically isolated from one another, and wherein the dielectric core is entirely within, and laterally offset inward from, an entirety of sidewalls of the memory opening;

at least one first select gate electrode located between the major surface of the substrate and the plurality of memory cells;

at least one second select gate electrode located above the plurality of memory cells;

a semiconductor channel having a portion that extends vertically along a direction perpendicular to the major surface;

a first charge storage element located on a first side of the semiconductor channel; and a second charge storage element located on a second side of the semiconductor channel and located at a same level as the first charge storage element, wherein the second charge storage element is electrically isolated from the first charge storage element, and located at a same level as the first charge storage element.

27. The memory device of claim 26, wherein the portion of the semiconductor channel that extends vertically has an azimuthally modulated dopant profile in which a dopant concentration changes as a function of an azimuthal angle around a geometrical center of the portion of the semiconductor channel that extends vertically.

28. The memory device of claim 27, further comprising:
separator insulator structures extending through the stack, contacting portions of an outer sidewall of the memory stack structure, and laterally separating the control gate electrodes of the plurality of charge storage elements;
base doping semiconductor channel portions which face the respective separator insulator structures; and
enhanced doping semiconductor channel portions which have a greater dopant concentration than the base doping semiconductor channel portions, and which face the respective control gate electrodes.

29. The memory device of claim 26, further comprising separator insulator structures extending through the stack, contacting portions of an outer sidewall of the memory stack structure, and laterally separating the control gate electrodes of the plurality of charge storage elements, wherein:
the memory stack structure comprises vertical stacks of pairs of physically disjoined portions that are separated by a portion of the separator insulator structure that protrudes inward from an outermost sidewall of the memory opening; and
the portion of the semiconductor channel that extends vertically in the memory opening is continuous in an azimuthal direction around a geometrical center of the portion of the semiconductor channel that extends vertically.

* * * * *